(12) United States Patent
Choi et al.

(10) Patent No.: US 10,416,707 B2
(45) Date of Patent: *Sep. 17, 2019

(54) DISPLAY APPARATUS

(71) Applicant: LG Display Co., Ltd., Seoul (KR)

(72) Inventors: YeongRak Choi, Paju-si (KR); Hogeol Lim, Incheon (KR); Daeho Kim, Busan (KR); Sungsu Ham, Yangsan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/043,581

(22) Filed: Jul. 24, 2018

(65) Prior Publication Data

US 2019/0079556 A1     Mar. 14, 2019

(30) Foreign Application Priority Data

Sep. 14, 2017   (KR) ........................ 10-2017-0117994

(51) Int. Cl.
     *G06F 1/16*        (2006.01)
     *H04M 1/03*      (2006.01)
     *H01L 27/32*     (2006.01)
     *G02F 1/1333*    (2006.01)
     (Continued)

(52) U.S. Cl.
CPC .......... *G06F 1/1605* (2013.01); *G02F 1/1333* (2013.01); *G02F 1/133308* (2013.01); *G06F 1/1658* (2013.01); *G06F 1/1688* (2013.01); *H01L 27/3276* (2013.01); *H04M 1/035* (2013.01); *H04R 1/26* (2013.01); *H04R 7/045* (2013.01); *G02F 2001/133317* (2013.01)

(58) Field of Classification Search
CPC .... H04M 1/03; H04M 2250/22; H04M 1/035; H04R 1/025; H04R 2499/15; G02F 2001/133314; G06F 1/1688
See application file for complete search history.

(56) References Cited

U.S. PATENT DOCUMENTS 5,416,463 A *   5/1995   Higgins, Jr. ........... G10K 11/08
                                                                    235/462.45
5,953,414 A *   9/1999   Abraham ................ H04M 1/03
                                                                    379/433.02

(Continued)

FOREIGN PATENT DOCUMENTS

EP        3 331 251 A1     6/2018
EP        3 396 972 A1    10/2018
(Continued)

*Primary Examiner* — Adrian S Wilson
(74) *Attorney, Agent, or Firm* — Morgan, Lewis & Bockius LLP

(57) ABSTRACT

A display apparatus includes: a display panel configured to display an image, the display panel including first, second, and third areas, a sound-generating device in at least one among the first, second, and third areas on a rear surface of the display panel, and at least one partition for dividing the first, second, and third areas from each other, the at least one partition including a first side and a second side at an angle to the first side, the second side including at least one member perpendicular to the second side, wherein: the first area is a left area of the display panel, the second area is a right area of the display panel, the third area is a central area of the display panel, and the member is in the third area.

27 Claims, 31 Drawing Sheets

(51) Int. Cl.
*H04R 1/26* (2006.01)
*H04R 7/04* (2006.01)

(56) References Cited

U.S. PATENT DOCUMENTS

| | | | | |
|---|---|---|---|---|
| 6,597,794 | B2* | 7/2003 | Cole | G06F 1/1616 381/306 |
| 8,363,863 | B2* | 1/2013 | Andoh | H04R 17/005 381/152 |
| 8,627,919 | B2* | 1/2014 | Hiwatashi | H04R 1/06 181/148 |
| 10,129,646 | B2* | 11/2018 | Choi | H04R 9/066 |
| 10,142,739 | B2* | 11/2018 | Choi | H04R 9/066 |
| 2002/0018574 | A1* | 2/2002 | Okuno | H04R 11/02 381/333 |
| 2003/0003879 | A1* | 1/2003 | Saiki | H04M 1/03 455/575.1 |
| 2003/0068987 | A1* | 4/2003 | Dufosse | H01Q 1/243 455/90.1 |
| 2004/0252857 | A1* | 12/2004 | Lewis | H04M 1/03 381/355 |
| 2006/0039575 | A1* | 2/2006 | Wada | H04R 1/025 381/152 |
| 2006/0051075 | A1* | 3/2006 | Wada | H04M 1/03 386/358 |
| 2007/0223744 | A1* | 9/2007 | Wada | H04R 23/008 381/152 |
| 2009/0288911 | A1* | 11/2009 | Chen | H04M 1/035 181/199 |
| 2012/0057730 | A1* | 3/2012 | Fujise | H04R 17/00 381/190 |
| 2012/0243719 | A1* | 9/2012 | Franklin | G06F 1/1652 381/333 |
| 2013/0045782 | A1* | 2/2013 | Simmer | H04M 1/035 455/575.8 |
| 2014/0160040 | A1* | 6/2014 | Kang | H04R 17/005 345/173 |
| 2014/0334078 | A1* | 11/2014 | Lee | H04M 1/03 361/679.01 |
| 2015/0078604 | A1* | 3/2015 | Seo | H04R 1/028 381/333 |
| 2015/0185963 | A1* | 7/2015 | Lee | G06F 3/0433 345/177 |
| 2016/0050472 | A1* | 2/2016 | Lee | H04R 1/028 381/333 |
| 2017/0280216 | A1* | 9/2017 | Lee | H04N 5/642 |
| 2017/0280243 | A1* | 9/2017 | Choi | H04N 5/642 |
| 2018/0317011 | A1 | 11/2018 | Choi et al. | |
| 2018/0332376 | A1 | 11/2018 | Lee | |
| 2018/0343522 | A1* | 11/2018 | Choi | H04N 5/642 |
| 2018/0352314 | A1* | 12/2018 | Lee | H04R 1/288 |

FOREIGN PATENT DOCUMENTS

| | | |
|---|---|---|
| EP | 3 402 216 A1 | 11/2018 |
| JP | 2012-198407 A | 10/2012 |
| KR | 10-2011-0048742 A | 5/2011 |

* cited by examiner

DISPLAY APPARATUS

CROSS-REFERENCE TO RELATED APPLICATION(S)

This application claims the benefit of and priority to Korean Patent Application No. 10-2017-0117994, filed on Sep. 14, 2017, the entirety of which is hereby incorporated by reference.

BACKGROUND

1. Technical Field

The present disclosure relates to a display apparatus, and in particular, to a display apparatus for generating sound by vibrating a display panel.

2. Discussion of the Related Art

With the advancement of an information-oriented society, various desires for the display field of expressing information in accordance with an electric information signal are increasing. Thus, research is being conducted on various display apparatuses that are thin, light, and have low power consumption. For example, the display apparatuses may be categorized into a liquid crystal display (LCD) apparatus, a field emission display (FED) apparatus, an organic light-emitting display (OLED) apparatus, etc.

Among the above display apparatuses, the LCD apparatus may include an array substrate including a thin film transistor, an upper substrate including a color filter and/or black matrix, and a liquid crystal layer interposed between the array substrate and the upper substrate. An alignment state of the liquid crystal layer is controlled based on an electric field applied to two electrodes of a pixel region, whereby light transmittance is adjusted based on the alignment state of the liquid crystal layer, to thereby display an image. The OLED apparatus, which is a self-light-emitting display device, has advantages of low power consumption, fast response speed, high light-emitting efficiency, high luminance, and wide viewing angle.

A display apparatus displays an image on a display panel, and an additional speaker for supplying sound generally has to be provided. If the speaker is provided in the display apparatus, the sound generated in the speaker advances toward a lower or rear portion of the display panel instead of a front portion of the display panel. Thus, the sound does not advance toward the front portion of the display panel, i.e., toward a user who watches the image displayed on the display panel, so that it disrupts a user's immersion experience. In addition, as the sound generated in the speaker advances toward the lower or rear portion of the display panel, sound quality is deteriorated due to an interference with sound reflected on the wall or floor. Furthermore, if the speaker is included in a set apparatus, such as television, laptop computer, or computer monitor, the speaker occupies a space that may impose a restriction on design and a spatial disposition of the set apparatus.

SUMMARY

Accordingly, the present disclosure is directed to a display apparatus that substantially obviates one or more of the issues due to limitations and disadvantages of the related art.

Therefore, the inventors have recognized the above-described problems and have conducted various experiments so that, when watching an image in front of a display panel, a traveling direction of a sound becomes a direction toward a front surface of the display panel. Thus, sound quality is enhanced. Through the various experiments, the inventors have invented a display apparatus having a new structure, which facilitates to output sound so that a traveling direction of a sound becomes a direction toward a front direction of a display panel, thereby enhancing sound quality.

An aspect of the present disclosure is to provide a display apparatus including a sound-generating device capable of outputting sound to a front direction of a display panel.

Another aspect of the present disclosure is to provide a sound-generating device with a new structure capable of improving sound quality.

Another aspect of the present disclosure is to provide a display apparatus and a computing apparatus including the same, which output a high-quality sound.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display apparatus, including: a display panel configured to display an image, the display panel including first, second, and third areas, a sound-generating device in at least one among the first, second, and third areas on a rear surface of the display panel, and at least one partition for dividing the first, second, and third areas from each other, the at least one partition including a first side and a second side at an angle to the first side, the second side including at least one member perpendicular to the second side, wherein: the first area is a left area of the display panel, the second area is a right area of the display panel, the third area is a central area of the display panel, and the member is in the third area.

In another aspect, there is provided a display apparatus, including: a display panel configured to emit light, the display panel including left, right, and central areas, a first sound-generating device in at least one of the left, right, and central areas on a rear surface of the display panel, a first partition between the left area and the central area, and a second partition between the right area and the central area, wherein at least one side of each of the first partition and the second partition includes a respective first member in the central area.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1A:
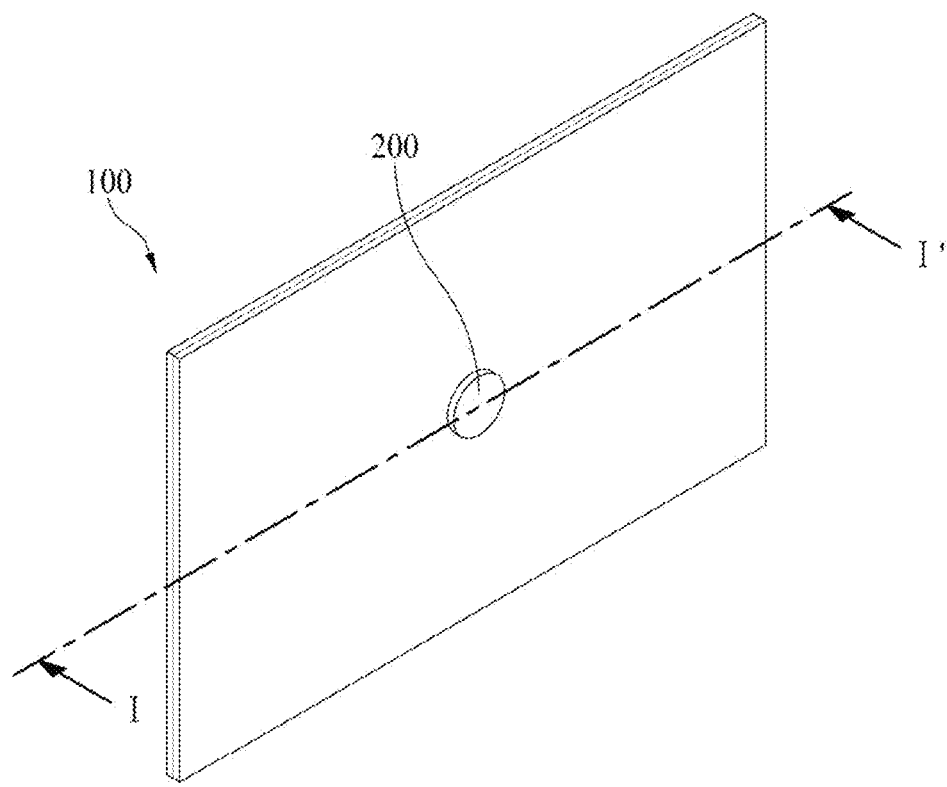
FIG. 1A illustrates a display apparatus including a sound-generating device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

In the present disclosure, the term "display apparatus" is used to encompass a display apparatus, such as a liquid crystal display module (LCM) or an organic light-emitting display module (OLED module), that includes a display panel and a driving unit for driving the display panel. Further, the term "display apparatus" according to an embodiment of the present disclosure is used to further encompass a set device (or a set apparatus) or a set electronic apparatus, as a finished product, such as a notebook computer or a laptop computer, a television set, a computer monitor, an equipment apparatus (e.g., display equipment in an automotive apparatus or another type of vehicle apparatus) or a mobile electronic apparatus that is a complete product or a final product (for example a smart phone or electronic pad. etc.) that includes the LCM, the OLED module, or the like. Accordingly, in the present disclosure, the term "display apparatus" is used both as a display apparatus itself, such as the LCM and the OLED modules, and also as a set apparatus that is a final consumer apparatus or an application product including the LCM or the OLED module.

In addition, in some examples, the LCM and the OLED module, including a display panel and a driving unit thereof, may be referred to as a "display apparatus" in a particular sense, and the electronic apparatus as the final product including the LCM and OLED module may be alternatively referred to as a "set apparatus" or a "set device." For example, the display apparatus in a particular sense may include a display panel, such as a liquid crystal display (LCD) panel or an organic light-emitting display (OLED) panel, and a source printed circuit board (PCB) as a controller for driving the same. The set apparatus may further include a set PCB that is a controller set to be electrically connected to the source PCB and to control the overall operations of the set device or the set apparatus.

The display panel used for an embodiment of the present disclosure may be any type of display panel, for example, a liquid crystal display panel, an organic light-emitting diode display panel, an electroluminescent display panel, etc., but embodiments are not limited to these types. For example, the display panel may be any panel capable of generating sound in accordance with a vibration by a sound-generating device. Moreover, a shape or size of a display panel applied to a display apparatus according to an embodiment is not limited.

An example liquid crystal display panel may include a plurality of gate lines, a plurality of data lines, and a plurality of pixels provided in respective intersections of the gate and data lines. Further, the liquid crystal display panel may include an array substrate including a thin film transistor corresponding to a switching device for controlling a light transmittance for each pixel, an upper substrate including a color filter and/or black matrix, and a liquid crystal layer formed between the array substrate and the upper substrate.

An example organic light-emitting display panel may include a plurality of gate lines, a plurality of data lines, and a plurality of pixels provided in respective intersections of the gate and data lines. In addition, the organic light-emitting display panel may include an array substrate including a thin film transistor corresponding to a device for selectively applying a voltage to each pixel, an organic light-emitting device layer on the array substrate, and an encapsulation substrate disposed on the array substrate to cover the organic light-emitting device layer. The encapsulation substrate may protect the thin film transistor and the organic light-emitting device layer from an external shock or impact, and may reduce or prevent moisture or oxygen from being permeated into the organic light-emitting device layer. Furthermore, the organic light-emitting device layer provided on the array substrate may be changed to an inorganic light-emitting layer, for example, nano-sized material layer or quantum dot material layer.

The display panel may further include a backing, such as a metal plate, attached to a rear surface of the display panel. However, embodiments are not limited to the metal plate, and other structures may be provided.

The display panel including the sound-generating device according to an embodiment of the present disclosure may be implemented at a user interface module in a vehicle, such as the central control panel area in an automobile. For example, such a display panel may be configured between two front seat occupants such that sounds due to vibrations of the display panel propagate towards the interior of the vehicle. As such, the audio experience within a vehicle can be improved as compared to having speakers only at the interior sides or edges of the vehicle.

Hereinafter, a display apparatus according to embodiments of the present disclosure will be described in detail with reference to the accompanying drawings.

FIG. 1A illustrates a display apparatus including a sound-generating device according to an embodiment of the present disclosure.

FIG. 1A illustrates a rear surface of the display apparatus. With reference to FIG. 1A, the display apparatus may include a display panel 100 for displaying an image, and a sound-generating device 200 for generating sound by vibrating the display panel 100. The sound-generating device 200 may be on the rear surface of the display panel 100. The sound-generating device 200 may be referred to as an "actuator," an "exciter," or a "transducer."

Figure 1B:
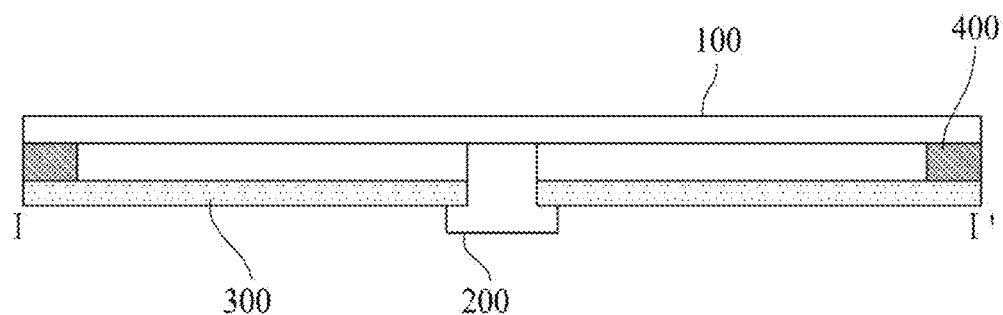
FIG. 1B is a cross-sectional view taken along line I-I' of FIG. 1A.

FIG. 1B is a cross-sectional view taken along line I-I' of FIG. 1A.

With reference to FIG. 1B, the display apparatus may include the sound-generating device 200 and a supporting member 300. The supporting member 300 may support at least one of rear and side (lateral) surfaces of the display panel 100. The sound-generating device 200 may be fixed to the supporting member 300.

As an example, the supporting member 300 may be a cover bottom. For example, the supporting member 300 may include a middle cabinet provided to surround a lateral surface or a side surface of the display panel 100, connected with the cover bottom, and provided to accommodate one periphery of the display panel 100 to support the display panel 100. For example, the middle cabinet may have a "ㅗ"-shaped cross section. The supporting member 300 may include the cover bottom, or may include the cover bottom and the middle cabinet, but embodiments are not limited to these example structures. The supporting member 300 may include any structure capable of supporting the rear surface or lateral surface of the display panel 100.

The supporting member 300 may be a plate-shaped member formed over a rear surface or entire surface of the display panel 100. The supporting member 300 may be referred to as a "cover bottom," a "plate bottom," a "back cover," a "base frame," a "metal frame," a "metal chassis," a "chassis base," or an "m-chassis." Thus, the supporting member 300 may be embodied in all types of frame or plate-shaped structure that may be used as a supporter for supporting the display panel 100, and may be disposed at the rear surface of the display apparatus.

In addition, an adhesion member 400 may be disposed in the periphery of the supporting member 300 and the display panel 100. The adhesion member 400 may be provided to adhere the display panel 100 and the supporting member 300 to each other, and the adhesion member 400 may be a double-sided tape, but embodiments are not limited thereto.

Figure 2A:
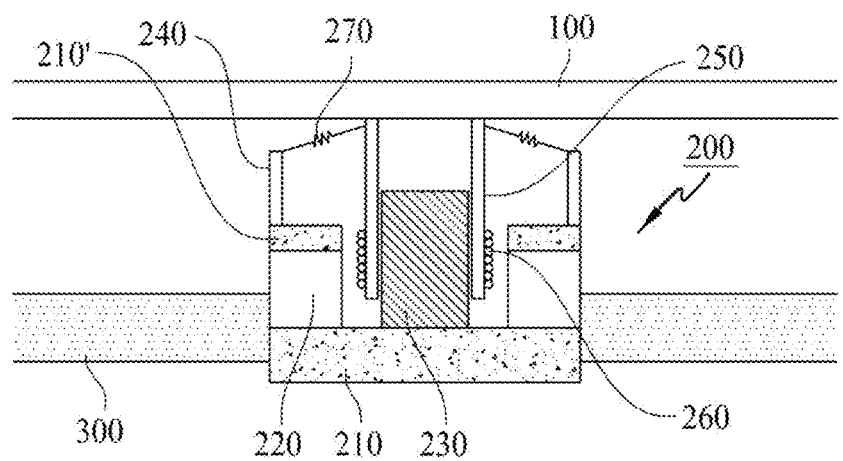
FIGS. 2A and 2B are cross-sectional views illustrating the sound-generating device according to an embodiment of the present disclosure.
Figure 2B:
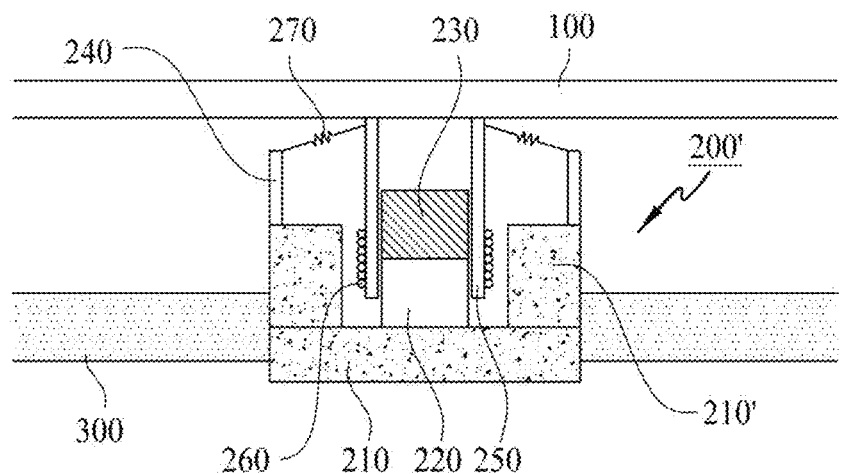

FIGS. 2A and 2B are cross-sectional views illustrating the sound-generating device according to an embodiment of the present disclosure.

The sound-generating device may be categorized into a first structure corresponding to an external magnetic type in which a magnet is disposed at an external side of a coil, and a second structure corresponding to an internal magnetic type in which a magnet is disposed at an internal side of a coil. The first structure may be expressed as a "dynamic type" or "external magnetic type," and the second structure may be expressed as a "micro type" or "internal magnetic type." FIG. 2A illustrates the first structure, and FIG. 2B illustrates the second structure.

FIG. 2A illustrates the first structure in which a magnet is disposed at an external side of a coil. With reference to FIG. 2A, the sound-generating device 200 may include plates 210 and 210', a magnet 220 on the plate 210, a center pole 230 on the plate 210, a bobbin 250 disposed around the center pole 230, and a coil 260 wound on an outer surface of the bobbin 250. For example, the magnet 220 may be on the first plate 210, and the second plate 210' may be on the magnet 220. The first plate 210 and the second plate 210' may support the magnet 220, and may fix the sound-generating device 200 to the supporting member 300. Accordingly, the first plate 210 may be fixed to a supporting hole of the supporting member 300, and the magnet 220 may be fixedly supported between the first plate 210 and the second plate 210'.

At least one of the first plate 210 and the second plate 210' may be formed of a magnetic material, such as iron (Fe). The first plate 210 and the second plate 210' are not limited to these terms. For example, they may be referred to another term, such as a "yoke."

The magnet 220 may be implemented, e.g., with a sintered magnet, with a material such as barium ferrite, and a material of the magnet 220 may include one or more of: ferric oxide ($Fe_2O_3$); barium carbonate (or witherite) ($BaCO_3$); neodymium (Nd); strontium ferrite ($Fe_{12}O_{19}Sr$), e.g., with an improved magnet component; and an alloy cast magnet including aluminum (Al), nickel (Ni), cobalt (Co), and/or the like. As another example, the neodymium magnet may be neodymium-iron-boron (Nd—Fe—B). However, embodiments are not limited to these examples.

A frame 240 may be on the second plate 210' along the periphery of the first plate 210. The center pole 230 may be on the center of the first plate 210. The center pole 230 and the first plate 210 may be formed as one body. The center pole 230 may be referred to as "pole pieces." In one example, pole pieces may be additionally disposed on the center pole 230.

The bobbin 250 may surround the center pole 230. The coil 260 may be wound on a lower outer area, for example, a lower outer surface of the bobbin 250, and a current or a voice signal for generating sound may be applied to the coil 260. The bobbin 250 may be a ring-shaped structure, e.g., of paper or aluminum sheet, and the coil 260 may be wound on some area of the lower portion of the bobbin 250. The bobbin 250 and the coil 260 may be referred to as a "voice coil." A damper 270 may be disposed between some area of an upper portion of the bobbin 250 and the frame 240. The damper 270 may be expressed by another term, such as an "edge."

FIG. 2B illustrates the second structure in which a magnet is disposed at an internal side of a coil. With reference to FIG. 2B, the sound-generating device 200' of the second structure may include a magnet 220 on a first plate 210, a center pole 230 on the magnet 220, a bobbin 250 disposed around the magnet 220 and the center pole 230, and a coil 260 wound on an outer surface of the bobbin 250.

For example, the first plate 210 may be fixed to a supporting hole of the supporting member 300. The magnet 220 may be on the first plate 210, and the center pole 230 may be on the magnet 220. The center pole 230 may be referred to as "pole pieces." In one example, pole pieces may be additionally provided on the center pole 230. The bobbin 250 may surround the magnet 220 and the center pole 230, and the coil 260 may be wound on the outer surface of the bobbin 250.

A second plate 210' may be on the outer periphery of the first plate 210, and a frame 240 may be outside the periphery of the second plate 210'. For example, a damper 270 may be disposed between the frame 240 and the bobbin 250.

In comparison to the first structure in which the magnet is disposed at the external side of the coil, the second structure has advantages of small leakage magnetic flux and decreased entire size of the sound-generating device. The sound-generating device used for the display apparatus according to an embodiment of the present disclosure is not limited to the structures of the FIGS. 2A and 2B. It is possible to use any sound-generating device capable of generating the sound by vibrating the display panel.

Figure 3A:
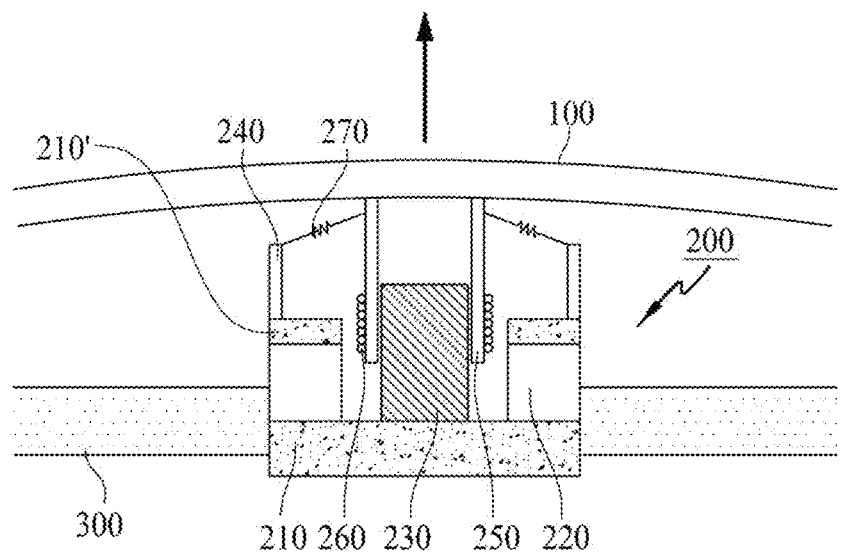
FIGS. 3A and 3B illustrate a sound-generating method of the sound-generating device with a first structure according to an embodiment of the present disclosure.
Figure 3B:
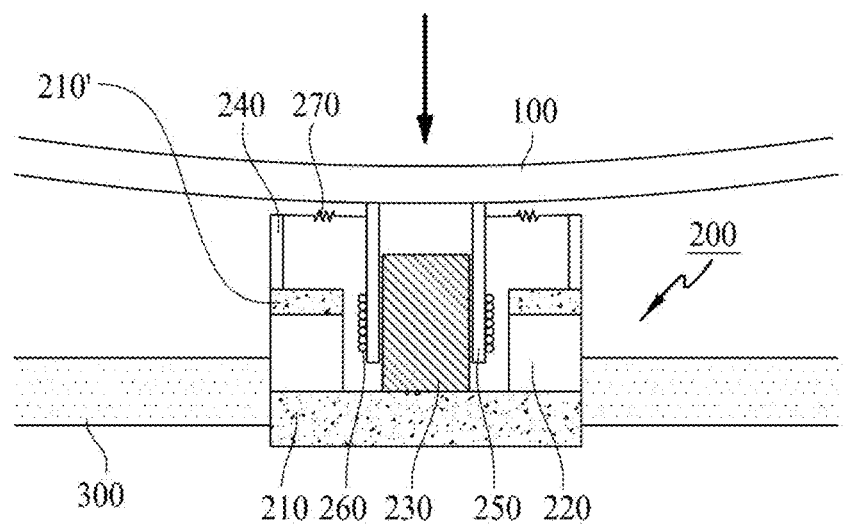

FIGS. 3A and 3B illustrate a sound-generating method of the sound-generating device with a first structure according to an embodiment of the present disclosure.

FIG. 3A shows a state in which a current is applied. The center pole 230 connected to a lower surface of the magnet 220 becomes the N pole, and the second plate 210' connected to an upper surface of the magnet 220 becomes the S pole. Thus, an external magnetic field may be generated around the coil 260.

In this state, if the current for generating sound is applied to the coil 260, an applied magnetic field is formed around the coil 260, whereby a force for upwardly moving the bobbin 250 may be generated by the applied magnetic field and the external magnetic field. For example, if the current is applied to the coil 260, the magnetic field may be generated around the coil 260, and the external magnetic field may be generated by the magnet 220, whereby the entire bobbin 250 may be guided and moved upwardly by the center pole 230 based on Fleming's Left-Hand Rule for Motors.

Accordingly, as one surface of the bobbin 250 is in contact with the rear surface of the display panel 100, the bobbin may vibrate the display panel 100 in an upward direction (indicated by an arrow) according to whether or not the current is applied to the coil 260, and sound wave (or sound) is generated by the vibration of the display panel 100. In this state, if the current is stopped or a current is applied in the opposite direction, as shown in FIG. 3B, a force of downwardly moving the bobbin 250 may be generated based on principles of FIG. 3A, whereby the display panel 100 may be vibrated in a downward direction (indicated by an arrow).

The damper 270 may be disposed between the frame 240 and some portion of the upper portion of the bobbin 250. The damper 270 may have a wrinkled structure having elasticity, whereby the damper 270 may control the up-and-down vibration of the bobbin 250 by contraction and relaxation movements in accordance with the up-and-down movement of the bobbin 250. That is, the damper 270 may be connected to the bobbin 250 and the frame 240, whereby the up-and-down vibration of the bobbin 250 may be controlled by a restoring force of the damper 270. For example, if the bobbin 250 vibrates to be higher or lower than a particular height, the bobbin 250 may be restored to its original position by the restoring force of the damper 270. According to the direction and level of the current applied to the coil 260, the display panel 100 may be vibrated in the up-and-down direction so that it is possible to generate the sound wave by the vibration.

Figure 4A:
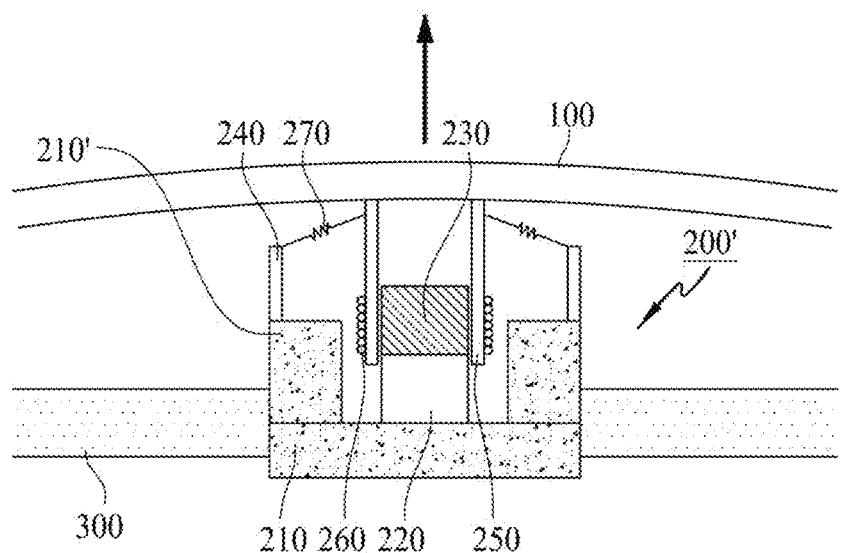
FIGS. 4A and 4B illustrate a sound-generating method of the sound-generating device with a second structure according to an embodiment of the present disclosure.
Figure 4B:
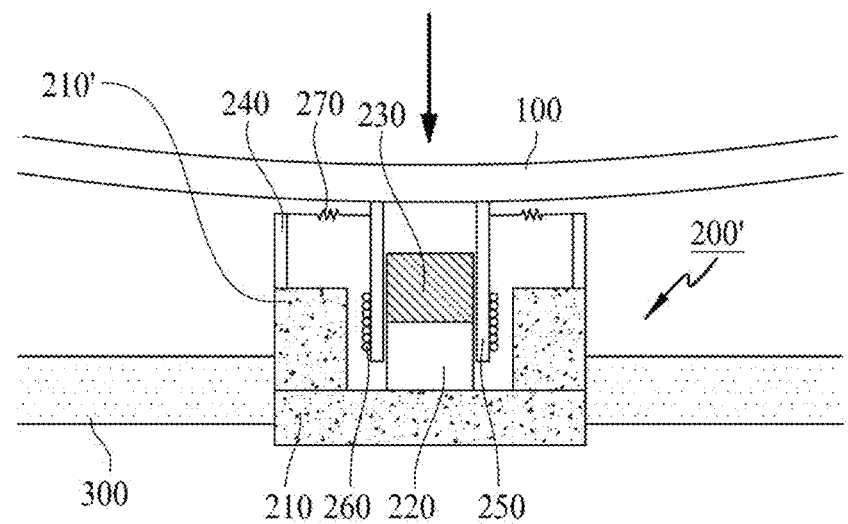

FIGS. 4A and 4B illustrate a sound-generating method of the sound-generating device with a second structure according to an embodiment of the present disclosure.

FIG. 4A shows a state in which a current is applied. The second plate 210' becomes the S pole, and the center pole 230 connected with an upper surface of the magnet 220 becomes the N pole, whereby an external magnetic field may be generated around the coil 260. The S-pole and the N-pole may be interchanged; if so, the sound generation device may identically operate by changing a winding direction of the coil 260. In this state, if the current for generating sound is applied to the coil 260, an applied magnetic field is formed around the coil 260, whereby a force for upwardly moving the bobbin 250 is generated by the applied magnetic field and the external magnetic field. For example, if the current is applied to the coil 260, the magnetic field is generated around the coil 260, and the external magnetic field is generated by the magnet 220, whereby the entire bobbin 250 is guided and moved upwardly by the center pole 230 based on Fleming's Left-Hand Rule for Motors.

Accordingly, as one surface of the bobbin 250 is in contact with the rear surface of the display panel 100, thus, the bobbin 250 may vibrate the display panel 100 in an upward direction (indicated by an arrow) according to whether or not the current is applied to the coil 260, and sound wave (or sound) may be generated by the vibration of the display panel 100. In this state, if the current is stopped or a current is applied in the opposite direction, as shown in FIG. 4B, a force of downwardly moving the bobbin 250 may be generated based on principles of FIG. 4A, whereby the display panel 100 may be vibrated in a downward direction (indicated by an arrow).

The damper 270 may be disposed between the frame 240 and some portion of the upper portion of the bobbin 250. The damper 270 may have a wrinkled structure having elasticity, whereby the damper 270 may control the up-and-down vibration of the bobbin 250 by contraction and relaxation movements in accordance with the up-and-down movement of the bobbin 250. That is, the damper 270 may be connected to the bobbin 250 and the frame 240, whereby the up-and-down vibration of the bobbin 250 may be controlled by a restoring force of the damper 270. For example, if the bobbin 250 vibrates to be higher or lower than a particular height, the bobbin 250 may be restored to its original position by the restoring force of the damper 270. Accordingly, the display panel 100 may be vibrated in the up-and-down direction in accordance with the direction and level of the current applied to the coil 260, to thereby generate the sound wave by the vibration.

Figure 5A:
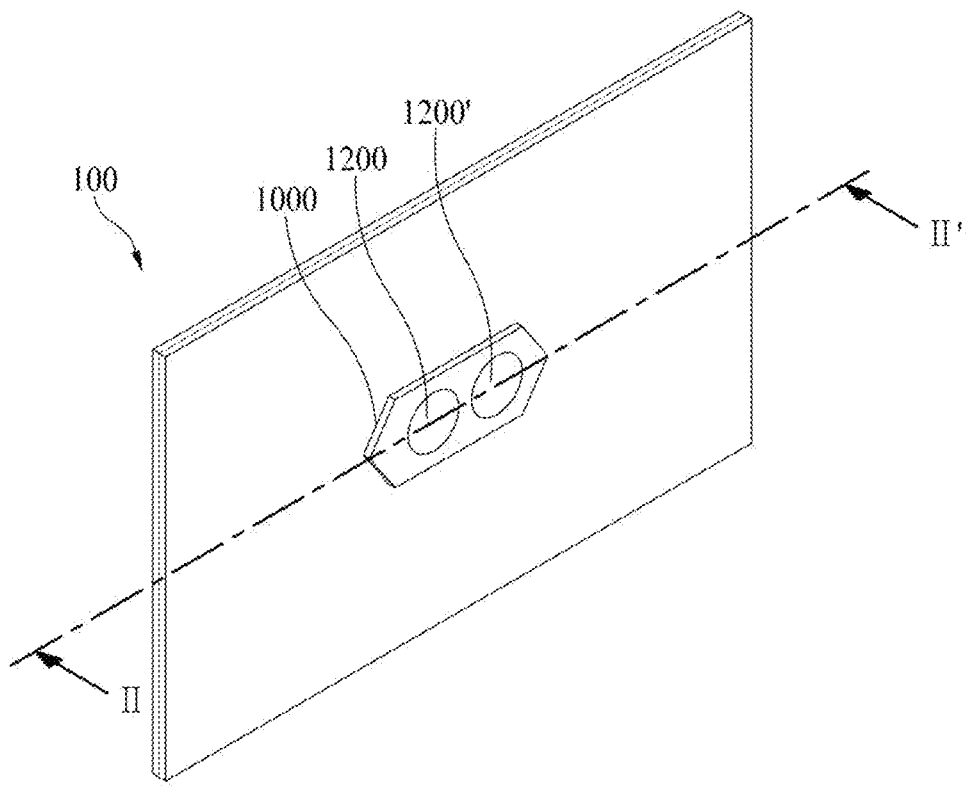
FIG. 5A illustrates a sound-generating device according to an embodiment of the present disclosure.
Figure 5B:
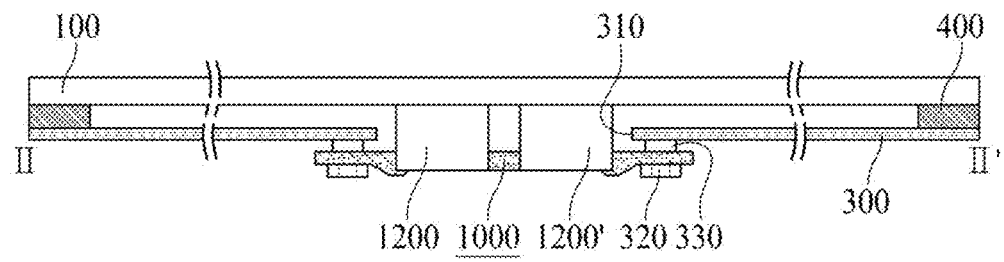
FIG. 5B is a cross-sectional view taken along line II-II' of FIG. 5A.

FIG. 5A illustrates a sound-generating device according to an embodiment of the present disclosure. FIG. 5B is a cross-sectional view taken along line II-II' of FIG. 5A.

With reference to FIG. 5A, a display apparatus may include a display panel 100, and first and second sound-generating devices 1200 and 1200' for generating sound by vibrating the display panel 100. The first sound-generating device 1200 and the second sound-generating device 1200' may be adjacent to each other. If the plurality of sound-generating devices are spaced apart from each other, it may be difficult to maintain uniformity of contact characteristics between the sound-generating device and the display panel, which may cause deterioration of sound quality by interference or delay phenomenon of the sound wave generated in the sound-generating devices. Thus, in comparison to a structure in which the plurality of sound-generating devices are spaced apart from each other, a structure in which the sound-generating devices are adjacent to each other may reduce an interference or delay phenomenon of the sound wave generated in the sound-generating devices, to thereby improve the sound output characteristics. This will be described in detail below with reference to FIG. 7.

The first sound-generating device 1200 and the second sound-generating device 1200' may be applied with the aforementioned first structure or second structure described with reference to FIGS. 2A and 2B. For example, the display apparatus may include a fixing device 1000 for fixing the first sound-generating device 1200 and the second sound-generating device 1200'. The fixing device 1000 may be a mold structure manufactured by a molding process, e.g., using a plastic material, but embodiments are not limited thereto. The fixing device 1000 will be described below with reference to FIG. 6.

With reference to FIG. 5B, the display apparatus may include the first sound-generating device 1200, the second sound-generating device 1200', and a supporting member 300. The supporting member 300 may support at least one of rear and side surfaces of the display panel 100. The supporting member 300 may be a plate-shaped member, e.g., of a metal or plastic material, over a rear surface or an entire surface of the display panel 100.

The sound-generating device 1200 and 1200' may be accommodated in a supporting hole 310 of the supporting member 300. If the sound-generating device 1200 and 1200' is inserted into and fixed to the supporting hole 310, it is possible to decrease a height of the sound-generating device 1200 and 1200' disposed between the rear surface of the display panel 100 and an inner surface of the supporting member 300, to thereby realize a small space or area for generating the sound.

For example, the display apparatus may include a nut 330 fixed to the supporting member 300. The fixing device 1000 may be fixed to the nut 330 by the use of screw 320 inserted into a hole of the fixing device 1000. For example, a screw through-hole may be formed inside the nut 330. Thus, after aligning the hole of the fixing device 1000 and the screw through-hole of the nut 330, the screw 320 may be tightened so that the fixing device 1000 may be fixed to the supporting member 300.

In one example, the nut 330 may be a self-clinching nut. An example of the self-clinching nut may be a PEM® nut, although embodiments are not limited thereto. If using the self-clinching nut, the vibration generated in the sound-generating device 1200 may be partially absorbed in the self-clinching nut so that it is possible to reduce the vibration transferred to the supporting member 300.

In the display apparatus according to an embodiment of the present disclosure, the supporting member 300 and the sound-generating device 1200 may be fixed to each other by the use of nut and screw included in the supporting member 300 so that it is possible to reduce a thickness of the display panel 100. Further, an adhesion member 400 may be disposed in the periphery of the supporting member 300 and the display panel 100, to thereby adhere the display panel 100 and the supporting member 300 to each other. The adhesion member 400 may be a double-sided tape or single-sided tape, but embodiments are not limited thereto.

Figure 6:
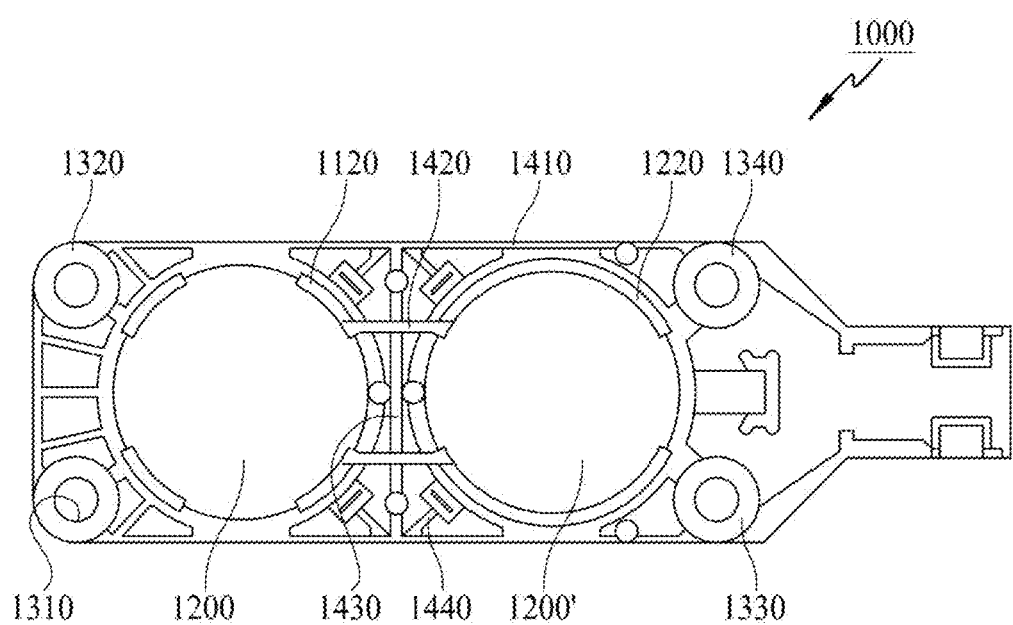
FIG. 6 illustrates a fixing device of the sound-generating device according to an embodiment of the present disclosure.

FIG. 6 illustrates a fixing device of the sound-generating device according to an embodiment of the present disclosure.

With reference to FIG. 6, the fixing device 1000 of the sound-generating device may be an integrated-type fixing device for supporting and fixing the first sound-generating device 1200 and the second sound-generating device 1200' to be adjacent to each other. Thus, the first sound-generating device 1200 and the second sound-generating device 1200' fixed using the fixing device 1000 may be a pair of sound-generating devices, which will be referred to as a "pair of sound-generating devices." The fixing device 1000 of the sound-generating device may include a supporting portion for supporting the sound-generating devices 1200 and 1200', a plurality of rib portions disposed in the periphery of the sound-generating devices 1200 and 1200', and a plurality of mounting holes for fixing the fixing device 1000 and the supporting member 300 to each other.

For example, the supporting portion may include a first supporting portion 1120 for supporting the first sound-generating device 1200, and a second supporting portion 1220 for supporting the second sound-generating device 1200'. The first supporting portion 1120 may support particular portions of lateral and rear surfaces of the first sound-generating device 1200. The first supporting portion 1120 may have a cylinder shape, but embodiments are not limited thereto. The second supporting portion 1220 may support particular portions of lateral and rear surfaces of the second sound-generating device 1200'. The second supporting portion 1220 may have a cylinder shape, but embodiments are not limited thereto.

For example, the first supporting portion 1120 and the second supporting portion 1220 may further include protrusions having two or four circular-arc shapes. Herein, one surface of each of the protrusions may be bent toward the inside of each sound-generating device 1200 and 1200' so that it is possible to support a particular portion of a rear surface of each sound-generating device 1200 and 1200', to thereby avoid or prevent the sound-generating device 1200 and 1200' from being separated from the fixing device 1000. For example, the plurality of rib portions may be in the periphery of the first supporting portion 1120 and the second supporting portion 1220, thereby maintaining a hardness of the fixing device 1000 and reducing or preventing a deformation of the fixing device 1000 of the sound-generating device, even during long-time use.

The plurality of rib portions may include a first rib portion 1410 extending in a horizontal direction from an outer surface of the first supporting portion 1120 and the second supporting portion 1220 in a horizontal direction, a second rib portion 1420 for connecting the first supporting portion 1120 and the second supporting portion 1220 with each other in the horizontal direction, and a third rib portion 1430 connected with the first rib portion 1410 in a vertical direction. As used herein, the term "horizontal direction" is a direction of a long side along which a pair of sound-generating devices is disposed, and the term "vertical direction" is a direction perpendicular to the horizontal direction. In addition, the horizontal direction may be referred to as a "landscape" direction of the display panel, and the vertical direction may be referred to as a "portrait" direction of the display panel.

The first rib portion 1410 may extend from the outer surface of the first supporting portion 1120 and the second supporting portion 1220 in the horizontal direction, to thereby form a horizontal-direction external structure of the fixing device 1000 of the sound-generating device. A central area of the first rib portion 1410, that is, the central area between the first supporting portion 1120 and the second supporting portion 1220, may be relatively higher or thicker than both side areas of the first rib portion 1410. Accordingly, even though a pair of sound-generating devices may be vibrated for a long time period, it is possible to reduce or prevent the fixing device 1000 of the sound-generating device from being deformed, and to reduce a change in the relative position between the display panel and a pair of sound-generating devices.

The second rib portion 1420 may be disposed inside the first rib portion 1410, and the second rib portion 1420 may be connected with the first supporting portion 1120 and the second supporting portion 1220, and may be formed as one body with the first supporting portion 1120 and the second supporting portion 1220. In the FIG. 6 example, two of the second rib portions 1420 are illustrated, but embodiments are not limited thereto. For example, one, three, or more of the second rib portion 1420 may be provided.

At least one third rib portion 1430 may be disposed between two of the second rib portions 1420 or two of the first rib portions 1410. The third rib portion 1430 may be extended in the transverse direction. The third rib portion 1430 may be integral to the first rib portion 1410 and the second rib portion 1420.

In the FIG. 6 example, one third rib portion 1430 is illustrated, and the third rib portion 1430 extends in the lengthwise direction between two of the first rib portions 1410, but embodiments are not limited thereto. For example, the third rib portion 1430 may extend in a shorter distance between two of the second rib portions 1420.

The rib portions may further include at least one fourth rib portion 1440 between the first supporting portion 1120 and the first rib portion 1410, or between the second supporting portion 1220 and the first rib portion 1410. The at least one fourth rib portion 1440 may be obliquely extended to avoid or prevent the fixing device 1000 of the sound-generating device from being bent, e.g., by heat generated during a long-time use.

Accordingly, the display apparatus according to an embodiment may include the fixing device for fixing the pair of sound generation devices and the plurality of rib portions near the sound generation devices, the rigidity of the sound generation devices may be maintained, and a sound characteristic change caused by a long-time operation may be reduced.

A distance between the first supporting portion 1120 and the second supporting portion 1220 may be larger than a minimum threshold value for forming the rib portion, and may be smaller than a maximum threshold value corresponding to a diameter of the first sound-generating device 1200 and/or the second sound-generating device 1200'. If the distance between the first supporting portion 1120 and the second supporting portion 1220 is greater than the minimum threshold value, the sound quality may be deteriorated. The distance between the first supporting portion 1120 and the second supporting portion 1220 may be smaller than the diameter of the first sound-generating device 1200 and the second sound-generating device 1200', to thereby reduce or prevent deterioration of the sound quality. For example, if the sound-generating device has size (e.g., diameter) 'D', the distance between the first supporting portion 1120 and the second supporting portion 1220 may be set to be a value larger than about 7 mm, corresponding to an example minimum threshold value, and may be smaller than the size 'D' of the sound-generating device. In one example, if the size 'D' of the sound-generating device is about 28 mm, then if the distance is about (0.85*D) (e.g., about 23.6 mm), there may be only a slight difference in the sound output characteristics.

A plurality of mounting holes 1310, 1320, 1330, and 1340 may be included for fixing the fixing device 1000 and the supporting member 300 to each other. The screw through-hole may be formed in the inner surface of the nut 330, as shown in the example of FIG. 5B. Thus, after aligning the mounting holes 1310, 1320, 1330, and 1340 of the fixing device 1000 and the screw through-hole of the nut 330, the screw 320 may be tightened so that the fixing device 1000 may be fixed to the supporting member 300.

If applying the fixing device to a pair of sound-generating devices according to an embodiment of the present disclosure, it is possible to maintain uniform sound pressure level in the entire frequency range, thereby realizing good sound output characteristics.

Figure 7:
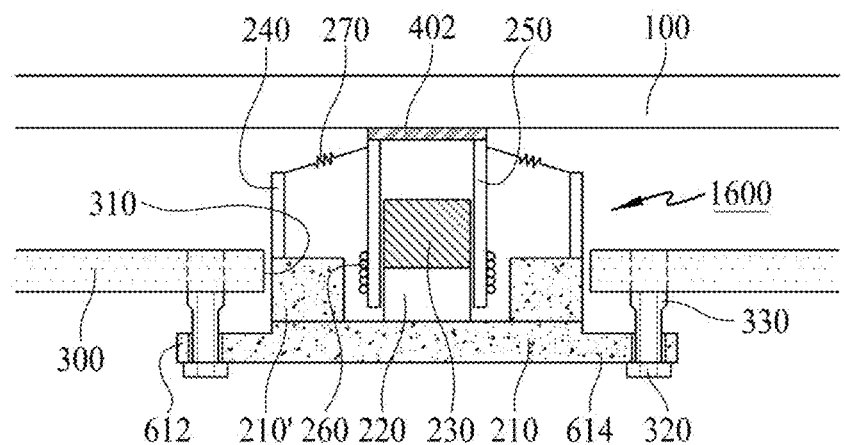
FIG. 7 illustrates a connection structure between the sound-generating device and a supporting member according to an embodiment of the present disclosure.

FIG. 7 illustrates a connection structure between the sound-generating device and a supporting member according to an embodiment of the present disclosure.

An embodiment of the present disclosure may be applied to both first and second structures of the sound-generating device. Hereinafter, an example of the second structure of the sound-generating device will be described in detail.

With reference to FIG. 7, the sound-generating device 1600 may include a diameter expanding portion 614. The diameter expanding portion 614 may be formed as one body with the first plate 210 of the sound-generating device 200. The first plate 210 of the sound-generating device 1600 may not be a cylinder shape. Herein, one portion of the first plate 210 may have a protrusion portion larger than a diameter of the remaining area of the first plate 210. The protrusion portion with a relatively-large diameter may be referred to as the diameter expanding portion 614. The diameter expanding portion 614 may have a ring shape. An extension portion 612 for fixation of the sound-generating device 1600 may be formed in a particular portion of the diameter expanding portion 614.

In the extension portion 612, there may be a screw 320 and a nut 330. By the use of nut 330 fixed to the supporting member 300, the sound-generating device 1600 may be connected with the supporting member 300 by the screw 320. For example, the nut 330 may be a self-clinching nut. One example of the self-clinching nut is a PEM® nut, but embodiments are not limited thereto. If using the self-clinching nut, the vibration generated in the sound-generating device 1200 may be partially absorbed in the self-clinching nut so that it is possible to reduce the vibration transferred to the supporting member 300.

The display panel 100 may be adhered to the bobbin 250 of the sound-generating device 1600 by the use of adhesion member 402. The adhesion member 402 may be a double-sided tape, single-sided tape, adhesive, or bond, but embodiments are not limited to these examples. As shown in the FIG. 7 example, the adhesion member 402 may be provided on a particular portion where the sound-generating device 1600 is adhered to the display panel 100, but embodiments are not limited to this structure. The adhesion member 402 may be provided on an entire rear surface of the display panel 100. For example, the adhesion member 402 may be provided on an entire surface between the display panel 100 and the sound-generating device 1600.

Figure 8:
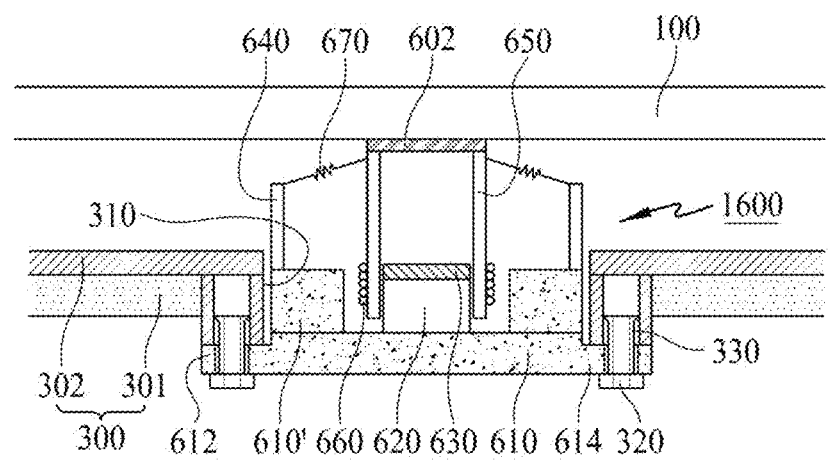
FIG. 8 illustrates a connection structure between the sound-generating device and a supporting member according to an embodiment of the present disclosure.

FIG. 8 illustrates a connection structure between the sound-generating device and a supporting member according to an embodiment of the present disclosure.

An embodiment of the present disclosure may be applied to both first and second structures of the sound-generating device. Hereinafter, an example of the second structure of the sound-generating device will be described in detail.

With reference to FIG. 8, the sound-generating device 1600 may include a magnet 620 on a first plate 610, a center pole 630 on the magnet 620, a bobbin 650 disposed around the magnet 620 and the center pole 630, and a coil 660 wound on an outer surface of the bobbin 650. For example, a second plate 610' may be on the periphery of the first plate 610, and a frame 640 may be on the periphery of the second plate 610'. Also, a damper 670 may be disposed between the frame 640 and the bobbin 650. The FIG. 8 example of the sound-generating device 1600 is substantially similar to that of the sound-generating device 200 in the FIG. 2 example, and a duplicate description for the sound-generating device 1600 will be omitted.

The sound-generating device 1600 may further include a diameter expanding portion 614. The diameter expanding portion 614 may be formed as one body with the first plate 610 of the sound-generating device 1600. The first plate 610 of the sound-generating device 1600 may be a cylinder shape. Herein, one portion of the first plate 610 may have a protrusion portion larger than a diameter of the remaining area of the first plate 610. The protrusion portion with a relatively-large diameter may be referred to as the diameter expanding portion 614. The diameter expanding portion 614 may have a ring shape, and an extension portion 612 for fixation of the sound-generating device 1600 may be formed in a particular portion of the diameter expanding portion 614.

In the extension portion 612, there may be a screw 320 and a nut 330. For example, the nut 330 may be a self-clinching nut. One example of the self-clinching nut is a PEM® nut. The sound-generating device 1600 may be fixed to a supporting member 300 by the use of nut 330 and screw 320. If using the self-clinching nut to connect the supporting member 300 and the sound-generating device 1600 with each other, the vibration generated in the sound-generating device 1600 may be partially absorbed in the self-clinching nut so that it is possible to reduce the vibration transferred to the supporting member 300. If the supporting member 300 and the sound-generating device 1600 are directly connected to each other without using the self-clinching nut, the vibration generated for an operation of the sound-generating device 1600 may be transferred to the supporting member 300 for a long period of time. In this case, if the supporting member 300 has a small thickness, the supporting member 300 might be bent or deformed. For example, if the supporting member 300 has a small thickness, the sound-generating device 1600 may be directly connected with the screw 320 of the supporting member 300 so that it may cause a problem related to an insufficient fixing strength between the supporting member 300 and the sound-generating device 1600.

Accordingly, if using the nut 330 to fix the sound-generating device 1600 to the supporting member 300, it may be necessary to increase a thickness of the supporting member 300 to avoid or prevent the supporting member 300 from being bent or deformed and to improve a fixing strength between the first supporting member 301 and the sound-generating device 1600. The increased thickness of the supporting member 300 may cause an increase in the overall thickness of the display apparatus. If the supporting member 300 is formed of glass or stainless steel to realize a good exterior design of the display apparatus, it may be impossible to insert the nut 330 into the supporting member 300.

To insert the nut 330 into the supporting member 300, the supporting member 300 may include a first supporting member 301 and a second supporting member 302. The second supporting member 302 may be additionally provided on the first supporting member 301. In comparison to the position of the first supporting member 301, the second supporting member 302 may be disposed closer to the display panel 100.

The second supporting member 302 may be formed of, e.g., a metal material, and the nut 330 may be capable of being inserted into the second supporting member 302. By the use of the nut 330 fixed to the first supporting member 301, the sound-generating device 1600 may be connected to the first supporting member 301 and the second supporting member 302 by the screw 320. The first supporting member 301 and the second supporting member 302 may be fixed and adhered to each other by the use of an adhesion member. The adhesion member may be a double-sided tape, single-sided tape, adhesive, or bond, but embodiments are not limited thereto. In one example, the second supporting member 302 may be formed of a metal material, for example, aluminum (Al), but embodiments are not limited thereto. The second supporting member 302 may be referred to as an "inner plate."

The first supporting member 301 may be glass or stainless steel, so that it is possible to realize a good exterior design of the display apparatus. Accordingly, as the second supporting member 302 may be additionally provided, the sound-generating device 1600 may be tightly adhered to a front surface of the display panel 100 by the thickness of the first supporting member 301, so that it is possible to decrease the thickness of the display apparatus. Accordingly, the additionally-provided second supporting member 302 may enable a decrease in the thickness of the sound-generating device 1600, thereby decreasing the thickness of the overall display apparatus. For example, the thickness of the sound-generating device may be decreased by the second supporting member 302 so that it is possible to overcome a problem related to the increased thickness or height of the a supporting plate for covering the sound-generating device 1600. Thus, the sound-generating device 1600 and signal lines may be disposed under the supporting plate so that it is possible to provide the display apparatus with the good exterior design.

An adhesion member 602 may adhere the display panel 100 and the sound-generating device 1600 to each other. The adhesion member 602 may be a double-sided tape, single-sided tape, adhesive, or bond, but embodiments are not limited thereto. As shown in the FIG. 8 example, the adhesion member 602 may be provided in a particular area where the sound-generating device 1600 is adhered to the display panel 100, but embodiments are not limited to this example structure. The adhesion member 602 may be provided on an entire rear surface of the display panel 100. For example, the adhesion member 602 may be provided on an entire surface between the display panel 100 and the sound-generating device 1600.

Figure 9A:
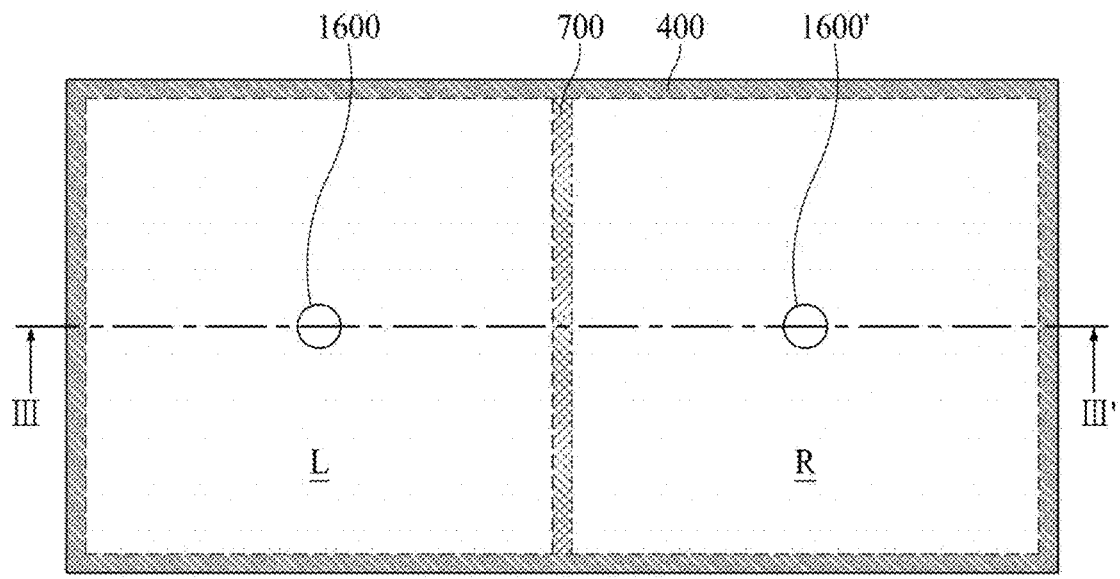
FIGS. 9A to 9C illustrate an embodiment of the sound-generating device and partition in the display apparatus according to an embodiment of the present disclosure.
Figure 9B:
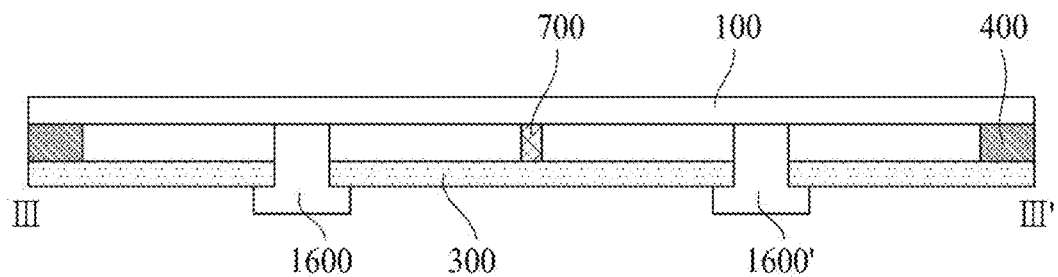
Figure 9C:
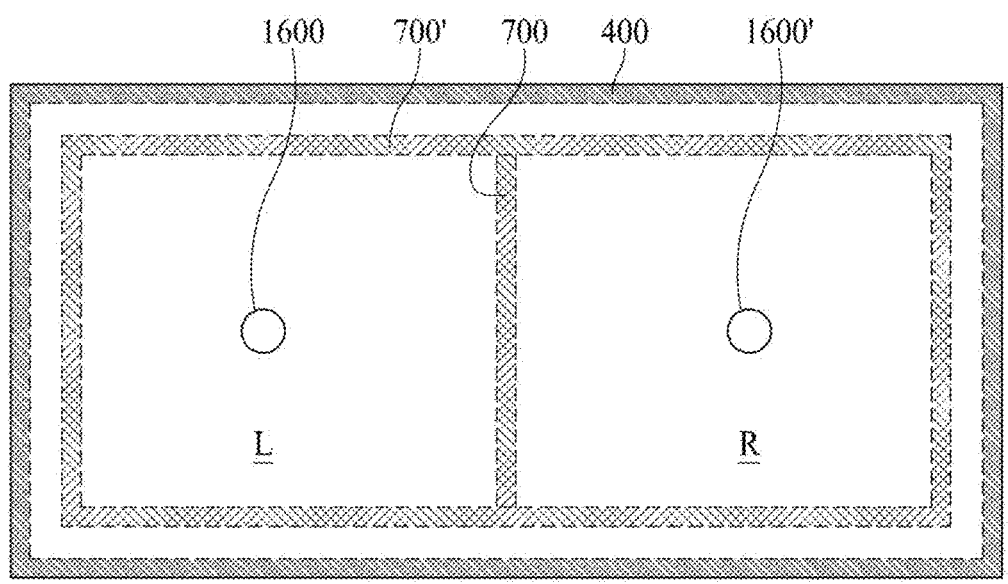

FIGS. 9A to 9C illustrate an embodiment of the sound-generating device and partition in the display apparatus according to an embodiment of the present disclosure.

With reference to FIG. 9A, a rear surface of the display panel 100 may include a first area (L) and a second area (R). The first area may correspond to a left area on the rear surface of the display panel 100, and the second area may correspond to a right area on the rear surface of the display panel 100. One of ordinary skill in the art would understand that the terms "left" and "right" are interchangeable throughout this disclosure, and are used only for convenience of description with reference to the illustrated drawings. Furthermore, the terms "first area," second area," and "third area" are respectively interchangeable with the terms "left area," "right area," and "central area." The first sound-generating device 1600 may be in the first area (L) on the rear surface of the display panel 100, and the second sound-generating device 1600' may be in the second area (R) on the rear surface of the display panel 100.

The display apparatus may further include a partition 700 between the first sound-generating device 1600 and the second sound-generating device 1600'. The partition 700 may be on the rear surface of the display panel 100. The partition 700 may be on an upper surface or rear surface of the supporting member, or the partition 700 may be between the display panel and the supporting member.

The partition 700 may correspond to an air gap or space for generating sound when the display panel 100 is vibrated by the sound-generating device 1600. The partition 700 may be the space or air gap for generating sound or transferring sound. The partition 700 may be an enclosure or baffle, but embodiments are not limited thereto. The partition 700 may be an entire area of four outer sides of the display panel 100. The partition 700 may be a sealed structure or unsealed structure.

The partition 700 may separate the sound generated in the first sound-generating device 1600 from the sound generated in the second sound-generating device 1600'. The partition 700 may attenuate or absorb the vibration of the display panel 100 in the center of the display panel 100 so that it is possible to reduce or prevent the left-side sound from being transferred to the area for the right-side sound. Accordingly, the partition 700 may separate the left-side sound and the right-side sound from each other, and may improve the sound output characteristics. The first sound-generating device 1600 and the second sound-generating device 1600' may output the middle-high-pitched sound band with different levels. Thus, the first sound-generating device 1600 and the second sound-generating device 1600' may enable the stereo sound output, whereby the display apparatus according to an embodiment of the present disclosure may have the sound output characteristics of a 2-channel type.

For example, the first sound-generating device 1600 and the second sound-generating device 1600' may output the middle-high-pitched sound band. For example, the term "middle-pitched sound band" may be sound of about 200 Hz to about 3 kHz, the term "high-pitched sound band" may be sound of about 3 kHz or more, and the term "low-pitched sound band" may be the sound of about 200 Hz or less, but embodiments are not limited thereto.

The partition 700 may be formed of polyurethane or polyolefin. The partition 700 may be a single-sided tape, double-sided tape, adhesive, or bond. The partition 700 may be formed of a material with elasticity capable of being compressed to some extent. However, embodiments are not limited to these materials.

Accordingly, the partition may be between the two sound-generating devices so that it is possible to improve the sound stereo characteristics by the separation between the left-side sound and the right-side sound, and to output the middle-high-pitched sound band by the two sound-generating devices.

FIG. 9B is a cross-sectional view taken along line III-III' of FIG. 9A. With reference to FIG. 9B, the display apparatus may include the sound-generating devices 1600 and 1600', the partition 700, and a supporting member 300. The supporting member 300 may support at least one of the rear and side (lateral) surfaces of the display panel 100. The sound-generating devices 1600 and 1600' may be fixed to the supporting member 300. The connection structure between the sound-generating devices 1600 and 1600' and the supporting member 300 may be substantially similar to the aforementioned connection structure shown in the FIG. 7 example.

An adhesion member 400 may be in the periphery of the display panel 100 and the supporting member 300, to thereby adhere the display panel 100 and the supporting member 300 to each other. The adhesion member 400 may be a double-sided tape, single-sided tape, adhesive, or bond, but embodiments are not limited thereto.

FIG. 9C illustrates an example of the sound-generating device and partition in the display apparatus according to an embodiment of the present disclosure. With reference to FIG. 9C, the partition 700 may be disposed between the first sound-generating device 1600 and the second sound-generating device 1600', whereby the sound generated in the first sound-generating device 1600 may be separated from the sound generated in the second sound-generating device 1600'. For example, a second partition 700' may be provided along four outer sides of the display panel 100. The second partition 700' may reduce or prevent the sound from leaking in each lateral surface of the display panel 100, so that the sound may be output only to the front direction of the display panel 100, to thereby improve the sound output characteristics.

The first partition 700 and the second partition 700' may be disposed on a rear surface of the display panel 100. For example, the first partition 700 and the second partition 700' may be disposed on a front surface or rear surface of the supporting member. In another example, the first partition 700 and the second partition 700' may be disposed between the display panel and the supporting member.

For example, if the adhesion member 400 is formed of a foam pad, it may also serve as the second partition 700'. In this case, it is possible to not provide the additional second partition 700'. Alternatively, if the second partition 700' functions as an adhesion member, it is possible to omit the adhesion member 400.

For example, the first partition 700 and the second partition 700' may be formed of a double-sided tape, single-sided tape, adhesive, or bond having a uniform thickness (or height) and width, but embodiments are not limited to these examples. The first partition 700 and the second partition 700' may be formed of a material with elasticity capable of being compressed to some extent. For example, the first partition 700 and the second partition 700' may be formed of polyurethane, polyolefin, or polyethylene, but embodiments are not limited to these materials. In addition, the first partition 700 and the second partition 700' may be referred to as a "foam pad."

Figure 10A:
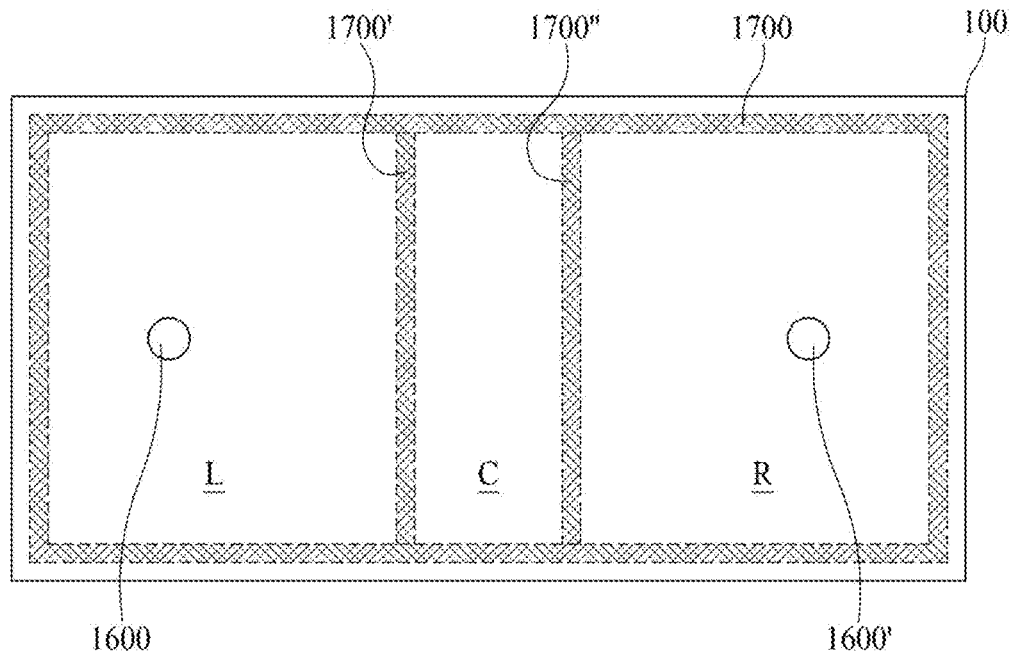
FIGS. 10A to 10C illustrate an embodiment of the sound-generating device and partition in the display apparatus according to an embodiment of the present disclosure.
Figure 10B:
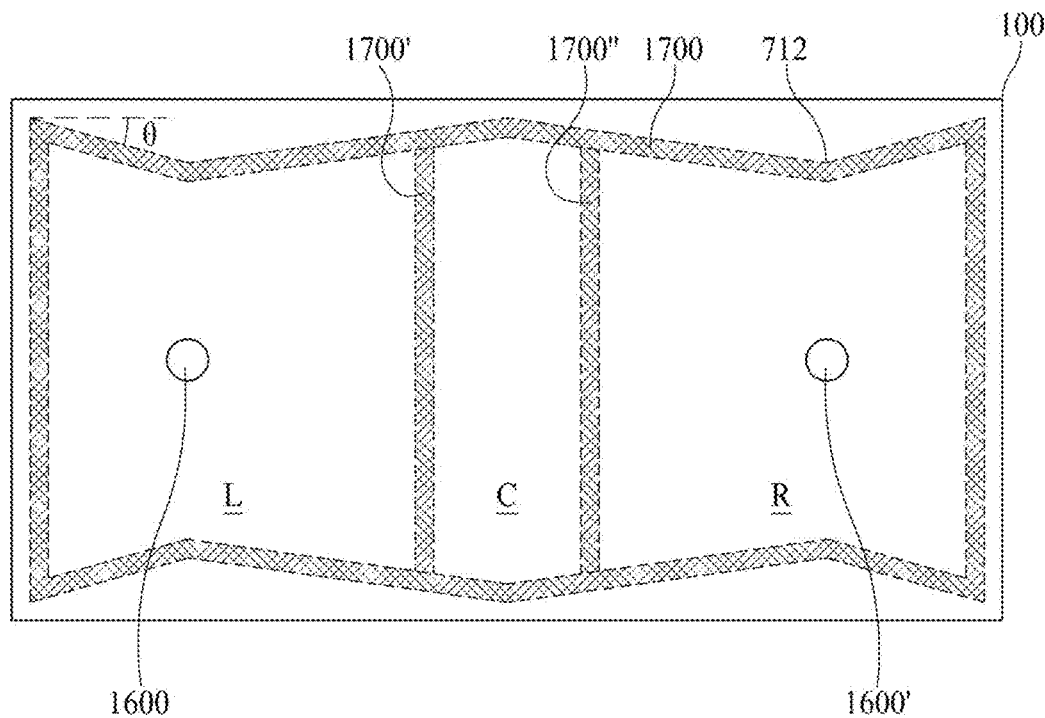
Figure 10C:
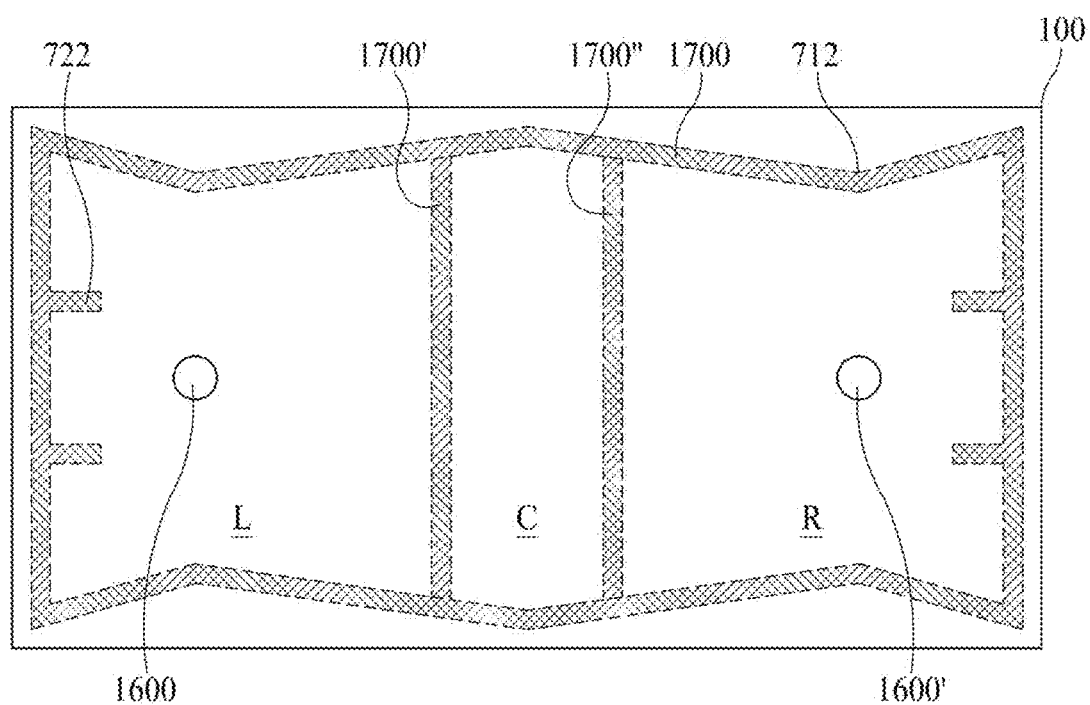

FIGS. 10A to 10C illustrate an embodiment of the sound-generating device and partition in the display apparatus according to an embodiment of the present disclosure.

With reference to FIGS. 10A to 10C, there may be a dual-structure partition or a double structure partition including two or more partitions. For a monaural ("mono") sound of outputting the same sound in the left and right areas, the left and right areas of the display panel 100 may have the same or similar vibration characteristics, whereby it may cause a problem related to the reduction of sound pressure by maximized resonant phenomenon and interference phenomenon in a particular frequency band. To decrease an influence of the sound characteristics caused by the difference of resonant frequency between the middle-high-pitched sound band generated in the first sound-generating device of the first area (L) corresponding to the left area and the middle-high-pitched sound band generated in the second sound-generating device of the second area (R) corresponding to the right area, it may have a structure including two or more partitions. FIG. 10 shows an example of the dual-structure partition or a double structure partition, but embodiments are not limited to this structure. For example, three or more partitions may be provided. If there are three or more partitions, even though the sound inference may become serious or severe in the left and right areas, it is possible to avoid or prevent the reduction of sound pressure, thereby preventing discontinuousness of the sound output characteristics.

For example, the first and second sound-generating devices may output the different levels of the middle-high-pitched sound band so that it is possible to output the stereo sound by the separation of the left and right areas. For example, the first sound-generating device of the first area (L) corresponding to the left area and the second sound-generating device of the second area (R) corresponding to the right area may be provided, and the sound-generating device may not be provided in the third area (C) corresponding to a central area. Therefore, it is possible to reduce deterioration of sound quality caused by the interference between the left area and the right area, and to improve the sound output characteristics of the middle-high-pitched sound band in the left and right areas of the display panel 100.

With reference to FIG. 10A, the first sound-generating device 1600 may be in the first area corresponding to the left area of the rear surface of the display panel 100, and the second sound-generating device 1600' may be in the second area corresponding to the right area of the rear surface of the display panel 100. At least two partitions including the first partition 1700' and the second partition 1700" may be between the first sound-generating device 1600 and the second sound-generating device 1600'. The first partition 1700' may include at least two sub-partitions between the first sound-generating device 1600 and the second sound-generating device 1600'.

For example, the third partition 1700 may surround the first area (L), the second area (R), and the third area (C). The third partition 1700 may be in the periphery of the rear surface of the display panel 100. The third partition 1700 may be in the periphery of the supporting member or the periphery of the front surface of the supporting member. The third partition 1700 may be between the display panel and the supporting member, and the third partition 1700 may be disposed between the rear surface of the display panel and the front surface of the supporting member.

For example, the first partition 1700', the second partition 1700", and the third partition 1700 may be on the rear surface of the display panel 100. The first partition 1700' and the second partition 1700" may be on the rear surface or front surface of the supporting member. The first partition 1700', the second partition 1700", and the third partition 1700 may be between the display panel and the supporting member. Accordingly, the two partitions may be provided in the central area of the display panel 100 so that it is possible to decrease an influence of the sound characteristics caused by the difference of resonant frequency in the middle-high sound between the left and right areas of the display panel 100.

For example, a sound wave generated by vibrating the display panel 100 through the use of sound-generating device may radially progress from the center of the sound-generating device, which is referred to as a "progressive wave." If the progressive wave is reflected on one side of the partition, and progresses to an opposite direction, it is referred to as a "reflected wave." If this reflected wave overlaps and interferes with the progressive wave, it does not progress, and it is in a standing state, which is referred to as a "standing wave." The standing wave causes the reduction of sound pressure, which may deteriorate the sound output characteristics. Thus, to avoid or prevent the reduction of sound pressure by the standing wave generated due to the interference between the progressive wave and the reflected wave, a bent portion may be formed in the partition. The standing wave causing the reduction of sound pressure may be generated at a point having the large progressive wave and the large reflected wave. Accordingly, the bent portion may be disposed at a point having the largest sound wave approaching from the sound-generating device, which will be described below with reference to FIGS. 10B and 10C.

FIGS. 10B and 10C are examples showing the partition of the dual structure including the two or more partitions, and the bent portion is further provided in at least one side of the partition. With reference to FIGS. 10B and 10C, the first sound-generating device 1600 may be in the first area corresponding to the left area of the rear surface of the display panel 100, and the second sound-generating device 1600' may be in the second area corresponding to the right area of the rear surface of the display panel 100. At least two partitions including the first partition 1700' and the second partition 1700" may be between the first sound-generating device 1600 and the second sound-generating device 1600', or the first partition 1700', formed of at least two sub-partitions, may be between the first sound-generating device 1600 and the second sound-generating device 1600'.

For example, the third partition 1700 may surround the first area (L), the second area (R), and the third area (C). The third partition 1700 may be in the periphery of the display panel 100. The bent portion 712 may be in at least one side of the third partition 1700.

The bent portion 712 may be in at least one side, where the largest sound wave may approach, among four sides of the third partition 1700. The bent portion 712 may face or extend toward the direction of the sound-generating devices 1600 and 1600'. The bent portion 712 may face or extend toward the center of the first sound-generating device 1600 and the center of the second sound-generating device 1600', so that it is possible to avoid or prevent the reduction of sound pressure level by the standing wave.

The rear surface of the display panel 100 may include the four sides, and the bent portion 712 may be formed in a first side corresponding to one or more sides among the four sides. Thus, the bent portion 712 may be formed in such a way that the two sides corresponding to the lower and upper sides of the four sides may have a particular inclined angle with respect to a horizontal direction (or lengthwise direction, landscape direction, or transverse direction) of the display panel 100. The bent portion 712 may be provided with two straight-line portions, and the bent portion 712 may be formed at a point where the two straight-line portions meet together. The bent portion 712 may be formed in a straight line shape, a curved line shape, or a round shape, but embodiments are not limited to these example shapes.

The inclined angle (θ) of the bent portion 712 may be changed based on a requirement for restriction of the standing wave, and the inclined angle (θ) of the bent portion 712 may be set within a range, e.g., from 10° to 30°. For example, in case of the sound output range for the low-pitched sound band or the large output of the sound-generating device, the inclined angle (θ) of the bent portion 712 may become large. In a case of the sound output range for the high-pitched sound band or the small output of the sound-generating device, the inclined angle (θ) of the bent portion 712 may become small. In one example, the inclined angle (θ) of the bent portion 712 may be the angle obtained by one side of the third partition 1700 and the horizontal direction (or length direction) of the display panel 100. As used herein, the horizontal direction or transverse direction corresponds to the direction of the long side of the display apparatus, and the vertical direction or longitudinal direction corresponds to the direction of the short side of the display apparatus.

The third partition 1700 may be in the periphery of the supporting member of the periphery of the front surface of the supporting member. The third partition 1700 may be between the display panel 100 and the supporting member. The third partition 1700 may be between the rear surface of the display panel 100 and the front surface of the supporting member.

The first partition 1700', the second partition 1700", and the third partition 1700 may be on the rear surface of the display panel 100. The first partition 1700' and the second partition 1700" may be on the rear surface or front surface of the supporting member. The first partition 1700', the second partition 1700", and the third partition 1700 may be between the display panel 100 and the supporting member.

The third partition 1700 having a bent or unbent shape may be between the first partition 1700' and the second partition 1700". The bent shape may face or extend toward the display panel 100. The bent shape of the third partition 1700 between the first partition 1700' and the second partition 1700" may be a straight line shape, a curved line shape, or a round shape, but embodiments are not limited to these example shapes.

The third partition 1700 may be formed in a zigzag shape or bow-tie shape. If the third partition 1700 has the zigzag shape or bow-tie shape, the third partition 1700 may be between the first partition 1700' and the second partition 1700", or may not be between the first partition 1700' and the second partition 1700".

With reference to FIG. 10C, there may be both a bent portion 712 and an outer member, (e.g., a protrusion portion 722). For example, the bent portion 712 may be in at least one side of the third partition 1700, and at least one protrusion portion 722 may be in the side perpendicular to the side with the bent portion 712. The protrusion portion 722 in the first area (L) of the display panel 100 may face or extend toward the first sound-generating device 1600, and the protrusion portion 722 in the second area (R) of the display panel 100 may face or extend toward the second sound-generating device 1600'.

The protrusion portion 722 may be capable of trapping the reflected wave, and of decreasing the reduction of sound pressure level by the standing wave. At least one protrusion portion 722 may be in at least one side of the third partition 1700, wherein the protrusion portions 722 may be symmetrically disposed with respect to the sound-generating device. FIG. 10C illustrates that at least one protrusion portion 722 may be formed in any one side of the first side and the second side, perpendicular to the first side among the four sides of the display panel 100.

For example, FIGS. 10A to 10C show an example of a sealed structure of the third partition 1700, but the third partition 1700 may have an unsealed structure. If the third partition 1700 has the unsealed structure, a cost for the third partition 1700 may be reduced in comparison to the sealed structure. There is no difference (or no substantial difference) in sound output characteristics between the third partition 1700 having the sealed structure and the third partition 1700 having the unsealed structure.

In FIGS. 10A to 10C, the display panel 100 has three areas, and the sound-generating device may not be disposed in the third area (C) corresponding to the central area of the display panel 100. The size of the third area (C) may be relatively smaller than the size of each of the first area (L) and the second area (R), so that it is possible to improve the sound output characteristics of the low-pitched sound band. For example, the third area (C) may enable a reduction of deterioration of sound quality caused by the interference of the first and second areas (L) and (R), and to improve the sound quality of the low-middle-high-pitched sound band.

FIGS. 10A to 10C show examples in which the sound-generating device may not be disposed in the center of the left area corresponding to the first area (L) or the center of the right area corresponding to the second area (R) in the display panel 100, but may be more toward the left area or the right area of the display panel 100, but embodiments are not limited thereto. The sound-generating device may be disposed in the center of the left area corresponding to the first area (L) or the center of the right area corresponding to the second area (R) in the display panel 100. Alternatively, the sound-generating devices may be asymmetrically disposed in the first area (L) and second area (R) of the display panel 100. If the sound-generating device is disposed more toward the left area corresponding to the first area or right area corresponding to the second area of the display panel 100, the stereo sound characteristics may be more improved in comparison to when the sound-generating device is disposed in the center of the left area corresponding to the first area or the center of the right area corresponding to the second area in the display panel 100.

The sound output characteristics of the sound-generating device with the bent portion will be described with reference to FIG. 11, and the sound output characteristics of the sound-generating device with the bent portion and the protrusion portion will be described with reference to FIG. 12.

Figure 11:
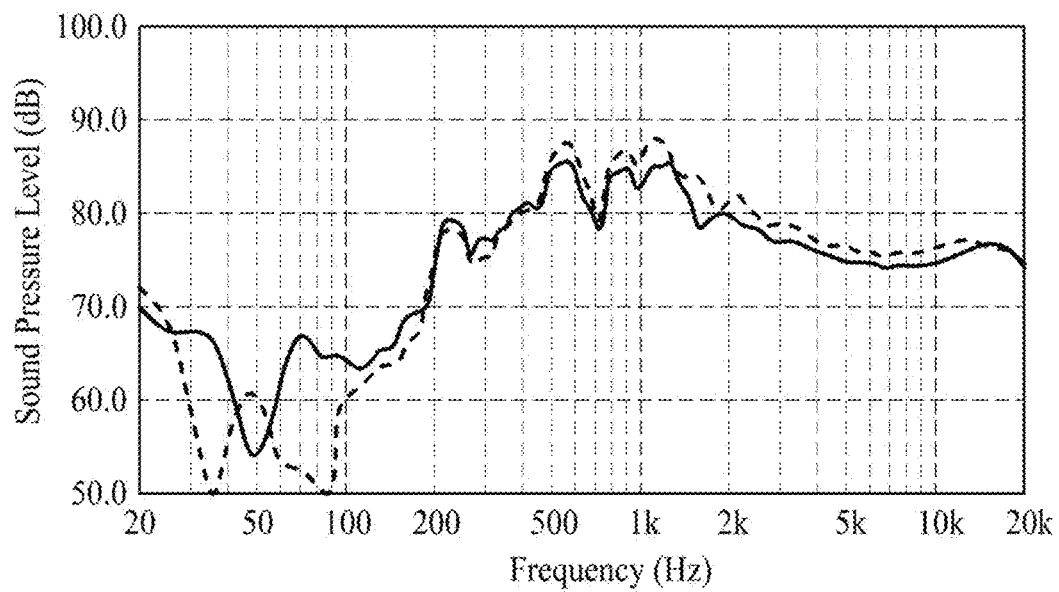
FIG. 11 illustrates sound output characteristics in accordance with an embodiment of the sound-generating device and partition in the display apparatus according to an embodiment of the present disclosure.

FIG. 11 illustrates sound output characteristics in accordance with an embodiment of the sound-generating device and partition in the display apparatus according to an embodiment of the present disclosure.

In FIG. 11, a dotted line indicates the sound output characteristics of the example illustrated in FIG. 10A, and a solid line indicates the sound output characteristics of the example illustrated in FIG. 10B. With reference to the experimental results shown in FIG. 11, in comparison to the example without the bent portion, the example with the bent portion has improved sound output characteristics in the low-pitched sound band of about 200 Hz or less.

Figure 12:
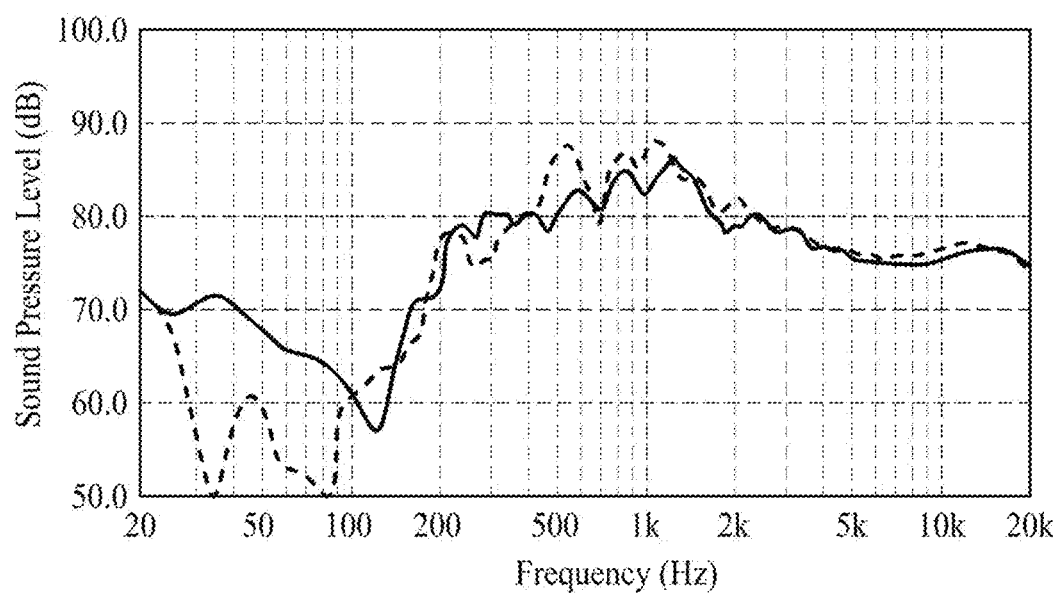
FIG. 12 illustrates sound output characteristics in accordance with an embodiment of the sound-generating device and partition in the display apparatus according to an embodiment of the present disclosure.

FIG. 12 illustrates sound output characteristics in accordance with an embodiment of the sound-generating device and partition in the display apparatus according to an embodiment of the present disclosure.

In FIG. 12, a dotted line indicates the sound output characteristics of the example illustrated in FIG. 10A, and a solid line indicates the sound output characteristics of the example illustrated in FIG. 10C. With reference to the experimental results shown in FIG. 12, in comparison to the example without the bent portion and the protrusion portion, the example with the bent portion and the protrusion portion has improved frequency characteristics in the entire sound band.

The sound output characteristics of FIGS. 11 and 12 may be measured by a sound analyzing apparatus. The sound analyzing apparatus may include a sound card for receiving sound from a control PC and for transmitting sound to the control PC, an amplifier for amplifying the sound (signal) generated from the sound card and for transmitting the amplified sound to the sound-generating devices 1600 and 1600', and a microphone for collecting the sound generated in the display panel through the sound-generating devices 1600 and 1600'. The sound collected in the microphone is provided to the control PC through the sound card, and then the control PC checks the provided sound, and analyzes the sound of the sound-generating devices 1600 and 1600'.

For example, when a pair of sound-generating devices is applied to the display panel, a horizontal vibration or a lateral vibration in the high sound band might occur due to a mutual interference between the two sound-generating devices included one pair. To overcome this problem related with the horizontal or lateral vibration, one sound-generating device may be applied to the display panel. If one sound-generating device is formed in a circular shape, a sound pressure level may be lowered. To overcome these problems, various experiments for applying non-circular sound-generating devices have been performed. In comparison to the circular sound-generating device, the non-circular sound-generating devices are more suitable to reduce the horizontal or lateral vibration caused by the up-and-down vibration of the bobbin.

Thus, the inventors have constructed the sound-generating device in an oval shape through the various experiments. An oval shape may include an elliptical shape, an egg-shape, a rectangular shape with rounded corners, or other non-circular curved shape having a width different from its height. The bobbin may be formed in an oval shape, and may also be formed of a polyimide film. The coil may be formed, e.g., of aluminum (Al) cladded with any one among copper (Cu), silver (Ag), and gold (Au). However, embodiments are not limited to these materials. Accordingly, it is possible to provide the display panel with the sound-generating device capable of decreasing the weight of the coil, improving the sound quality in the high-pitched sound band, and improving the heat-dissipation characteristics. The sound output characteristics will be described below with reference to FIG. 13.

Figure 13:
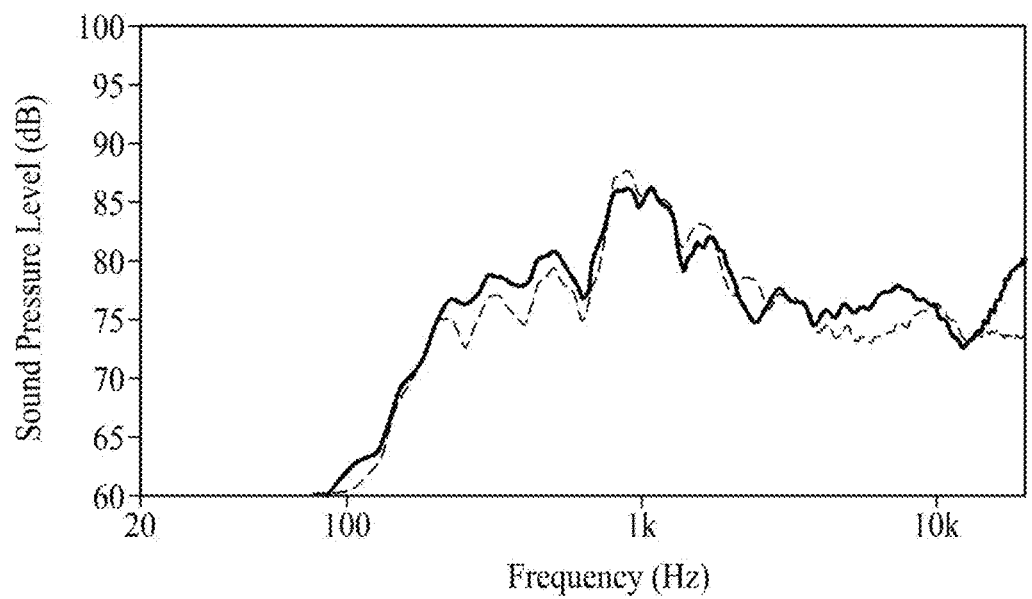
FIG. 13 illustrates sound output characteristics of the sound-generating device according to an embodiment of the present disclosure.

FIG. 13 illustrates sound output characteristics of the sound-generating device according to an embodiment of the present disclosure.

With reference to FIG. 13, a dotted line indicates the sound output characteristics in a pair of sound-generating devices, and a solid line indicates the sound output characteristics in the oval-shaped sound-generating device. Herein, a horizontal axis indicates a frequency (Hz), and a vertical axis indicates a sound pressure level (SPL, dB). FIG. 13 shows the results obtained by measuring the sound output in a pair of sound-generating device and the oval-shaped sound-generating device in the example of FIG. 10B.

As illustrated in FIG. 13, if providing the oval-shaped sound-generating device according to an embodiment of the present disclosure, it is possible to improve the sound output characteristics in the middle-pitched sound band of 200 Hz or more. For example, it is possible to improve the sound output characteristics in the sound band of about 200 Hz~500 Hz. For example, it is possible to improve the sound output characteristics in the high-pitched sound band of 3 kHz or more. For example, it is possible to improve the sound output characteristics of the sound-generating device in the sound band of about 5 kHz~8 kHz.

Figure 14:
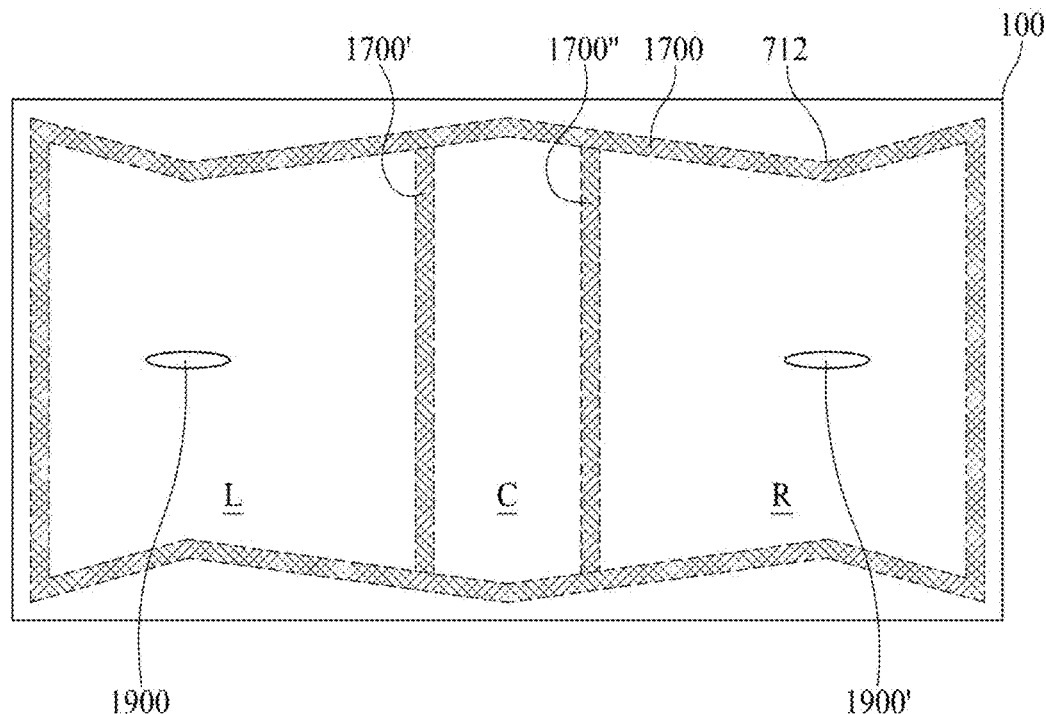
FIG. 14 illustrates sound output characteristics in accordance with an embodiment of the sound-generating device and partition in the display apparatus according to an embodiment of the present disclosure.

FIG. 14 illustrates sound output characteristics in accordance with an embodiment of the sound-generating device and partition in the display apparatus according to an embodiment of the present disclosure.

With reference to FIG. 14, the rear surface of the display panel 100 may include a first area (L), a second area (R), and a third area (C). The first area (L) may correspond to a left area of the rear surface of the display panel 100, the second area (R) may correspond to a right area of the rear surface of the display panel 100, and the third area (C) may correspond to a central area of the rear surface of the display panel 100. A first sound-generating device 1900 may be disposed in the first area (L) of the rear surface of the display panel 100, and a second sound-generating device 1900' may be disposed in the second area (R) of the rear surface of the display panel 100. The first sound-generating device 1900 and the second sound-generating device 1900' may have an oval shape.

The display apparatus may include at least two partitions, for example, a first partition 1700' and a second partition 1700", between the first sound-generating device 1900 and the second sound-generating device 1900'. For example, the first partition 1700' may be between the first area (L) and the third area (C), and the second partition 1700" may be between the second area (R) and the third area (C).

The first partition 1700', the second partition 1700", and a third partition 1700 may be on the rear surface of the display panel 100. The first partition 1700' and the second partition 1700" may be on the rear surface or the front surface of the supporting member, e.g., the supporting member 300. The first partition 1700', the second partition 1700", and the third partition 1700 may be between the display panel and the supporting member.

The third partition 1700 may surround the first area (L), the second area (R), and the third area (C). The third partition 1700 may be in the periphery of the rear surface of the display panel 100. The third partition 1700 may be in the periphery of the supporting member or in the periphery of the front surface of the supporting member. The third partition 1700 may be between the display panel and the supporting member. The third partition 1700 may be between the rear surface of the display panel and the front surface of the supporting member.

For example, a bent portion 712 may be formed in at least one side of the third partition 1700. For example, the third partition 1700 may include a first side and a second side perpendicular to the first side, and the bent portion 712 may be formed in the first side of the third partition 1700. The first side may be a horizontal direction (or transverse direction) of the display panel 100, and the second side may be a vertical direction (or longitudinal direction) of the display panel 100.

The bent portion 712 may be bent toward the first sound-generating device 1900 and the second sound-generating device 1900'. The bent portion 712 may avoid or prevent reduction of the sound pressure level caused by the standing wave generated in the vertical direction of the sound-generating device, and may transfer the vibration to the first and second sides, e.g., left and right sides.

The inventors have recognized that hollow sound may be generated in the third area corresponding to the central area (C) of the sound-generating device included the sound-generating device with the structure of FIG. 14. It is recognized that, although a sound directivity angle of the upper and lower may be wide, the sound directivity angle of left and right sides may be narrow, whereby the hollow sound may be generated in the third area. The sound directivity angle may be an angle at which the sound is received. These vibration characteristics may be measured by the use of laser Doppler device, which will be described below with reference to FIG. 15.

Figure 15:
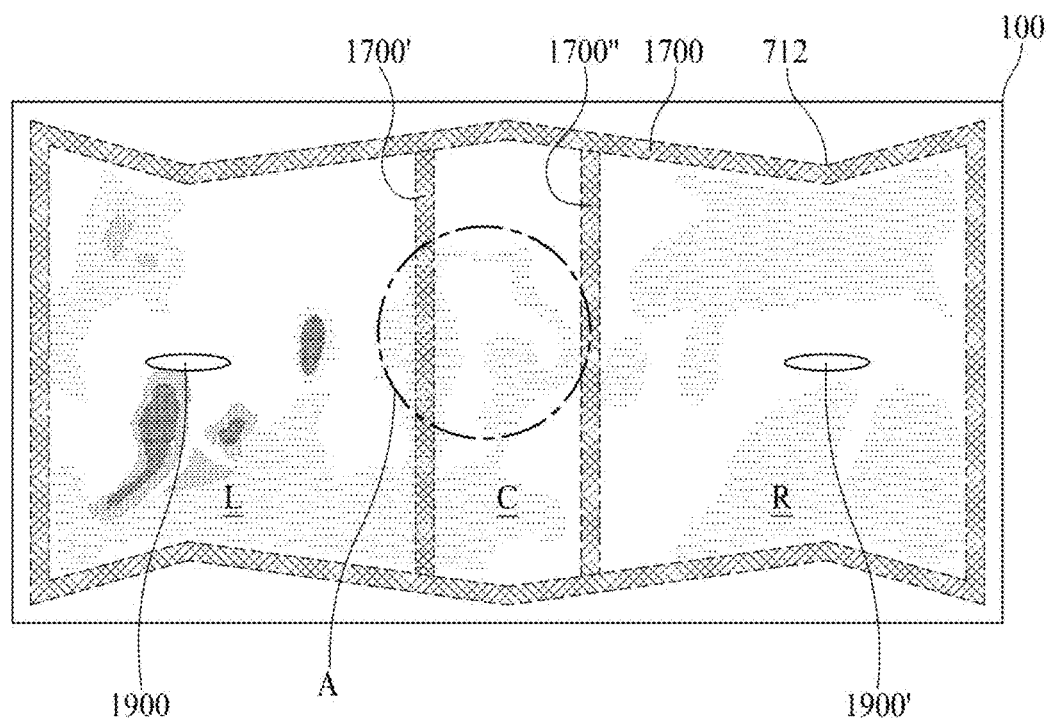
FIG. 15 illustrates vibration characteristics of the sound-generating device according to an embodiment of the present disclosure.

FIG. 15 illustrates vibration characteristics of the sound-generating device according to an embodiment of the present disclosure.

FIG. 15 shows the experimental measuring result of the vibration characteristics using by the use of laser Doppler device. After a sound vibration surface of the display panel 100 is irradiated with laser provided from the laser Doppler device, the laser Doppler device is capable of checking a vibration spread shape by the use of laser scattering shape, and this shape is displayed as an image. A microphone for a sound input, disposed above the center of the display panel, faces or extends toward the center of the display panel, and the vibration of the third area (C) is checked (or tested). To check the vibration of the third area (C), the microphone and the display panel are maintained as perpendicular to each other.

In FIG. 15, a dark or black-colored portion indicates an area with a large vibration, and a blurry or grey-colored portion indicates an area with a small vibration. The lighter the shading, the less the vibration. For example, if a large vibration is generated in the first sound-generating device 1900 and the second sound-generating device 1900', the generated vibration spreads so that the dark or black-colored portion makes a concentric circle, and spreads to the outside. For example, the slightly-blurry (light grey) portion and blurry portion (darker grey) may be changed to be dark or black-colored by vibrating more by the spread of vibration.

According to the measuring result of the vibration characteristics by the laser Doppler device, it can be seen that the vibration generated in the first and second sound-generating devices 1900 and 1900' of the first area (L) and second area (R) passes beyond the first and second partitions 1700' and 1700". In FIG. 15, 'A' indicates an area where vibration is passed. The inventors have recognized that the phenomenon that the vibration spreads toward to the third region (C) occurs severely in the high-pitched sound band. If a vibration width is small, it is difficult to reduce the sound interference between the left area and the right area. Accordingly, the inventors conducted various experiments to improve the sound pressure level in the high-pitched sound band. Through the various experiments, the inventors have invented a display apparatus having a new structure, which can improve the sound pressure level in the high-pitched sound band. Various example embodiments of the display apparatus having a new structure will be described with reference to FIGS. 16 to 26D.

Figure 16:
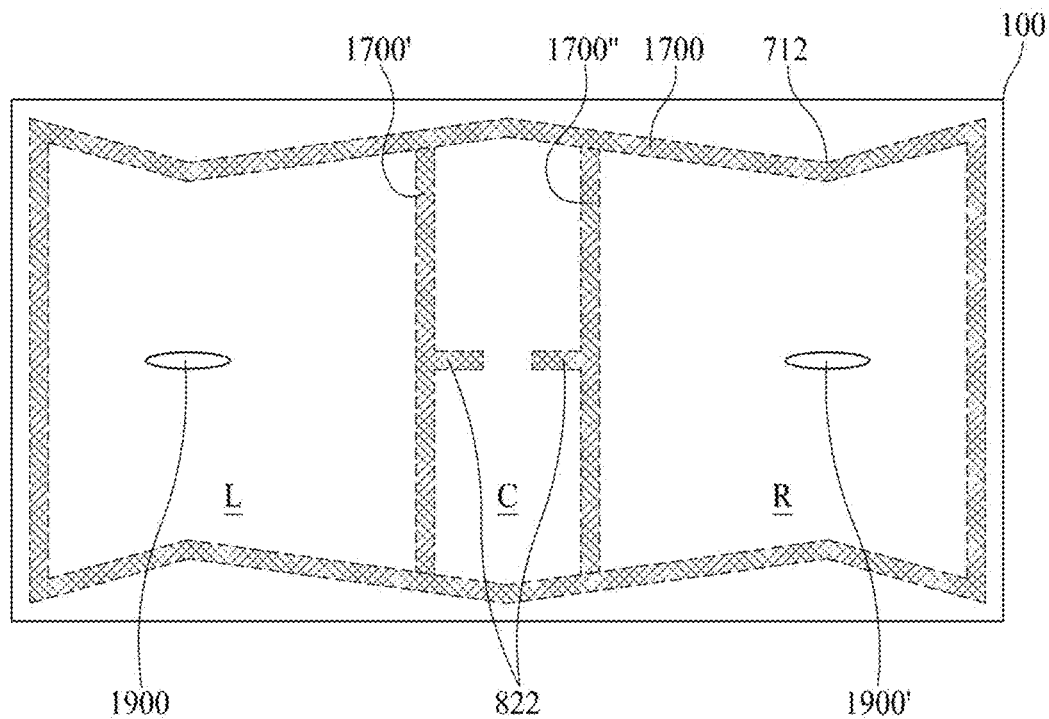
FIG. 16 illustrates an embodiment of the sound-generating device and partition in the display apparatus according to an embodiment of the present disclosure.
Figure 17:
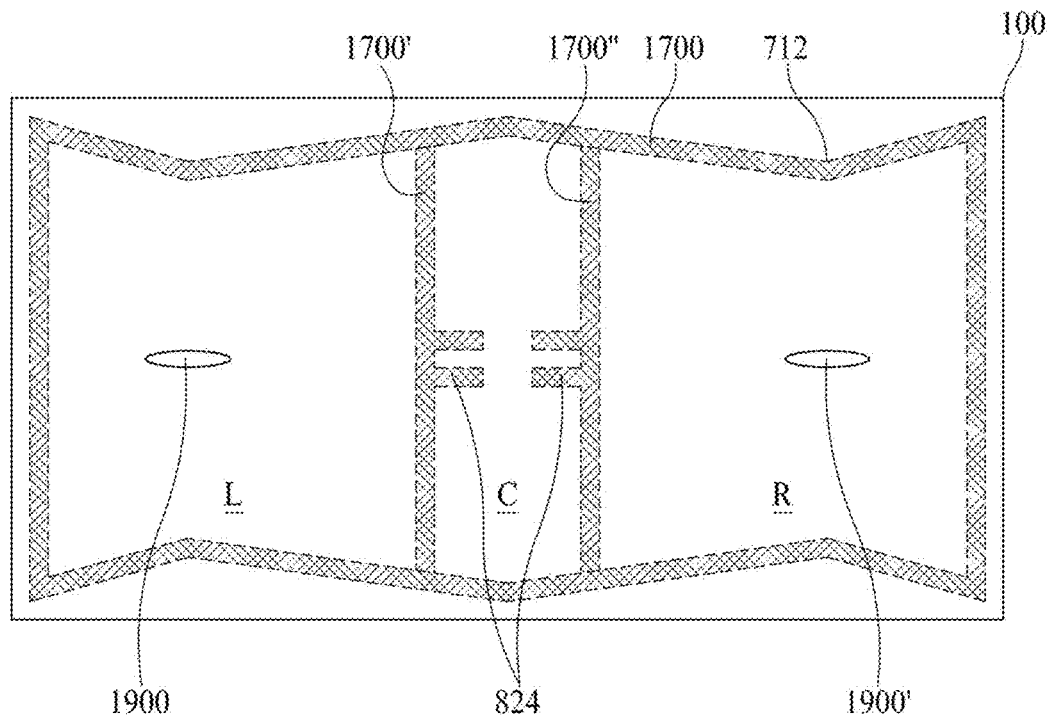
FIG. 17 illustrates an embodiment of the sound-generating device and partition in the display apparatus according to an embodiment of the present disclosure.

FIG. 16 illustrates an embodiment of the sound-generating device and partition in the display apparatus according to an embodiment of the present disclosure. FIG. 17 illustrates an embodiment of the sound-generating device and partition in the display apparatus according to an embodiment of the present disclosure.

With reference to FIG. 16, the rear surface of the display panel 100 may include a first area (L), a second area (R), and a third area (C). The first area (L) corresponds to a left area of the rear surface of the display panel 100, the second area (R) corresponds to a right area of the rear surface of the display panel 100, and the third area (C) corresponds to a central area of the rear surface of the display panel 100. A first sound-generating device 1900 may be disposed in the first area (L) of the rear surface of the display panel 100, and a second sound-generating device 1900' may be disposed in the second area (R) of the rear surface of the display panel 100. The first sound-generating device 1900 and the second sound-generating device 1900' may have an oval shape.

For example, the display apparatus may include at least two partitions, for example, a first partition 1700' and a second partition 1700", between the first sound-generating device 1900 and the second sound-generating device 1900'. For example, the first partition 1700' may be between the first area (L) and the third area (C), and the second partition 1700" may be between the second area (R) and the third area (C).

The first partition 1700', the second partition 1700", and a third partition 1700 may be on the rear surface of the display panel 100. The first partition 1700' and the second partition 1700" may be on the rear surface or front surface of the supporting member, e.g., the supporting member 300. The first partition 1700', the second partition 1700", and the third partition 1700 may be between the display panel and the supporting member.

For example, the third partition 1700 may surround the first area (L), the second area (R), and the third area (C). The third partition 1700 may be in the periphery of the rear surface of the display panel 100. The third partition 1700 may be in the periphery of the supporting member, or in the periphery of the front surface of the supporting member. The third partition 1700 may be between the display panel and the supporting member. The third partition 1700 may be between the rear surface of the display panel and the front surface of the supporting member.

For example, a bent portion 712 may be formed in at least one side of the third partition 1700. For example, the third partition 1700 may include a first side and a second side perpendicular to the first side, and the bent portion 712 may be formed in the first side of the third partition 1700. The bent portion 712 may be bent toward the first sound-generating device 1900 and the second sound-generating device 1900'. The bent portion 712 may avoid or prevent reduction of the sound pressure caused by the standing wave generated in the longitudinal direction of the sound-generating device, and may transfer the vibration to the first and second sides, e.g., left and right sides.

For example, to reduce or prevent the vibration generated in the first sound-generating device 1900 and/or the second sound-generating device 1900' from passing beyond the first partition 1700' and/or the second partition 1700", a member 822 may be in the third area (C). The display apparatus according to an embodiment of the present disclosure may include at least one member 822. The member 822 may face or extend toward the third area (C). The third partition 1700 may include a first side, and a second side perpendicular to the first side. The member 822 may be parallel to the first side of the third partition. For example, the first side may be a horizontal direction (or transverse direction) of the display panel, and the second side may be a vertical direction (or longitudinal direction) of the display panel 100.

The member 822 may be in each of the peripheral sides of the first partition 1700' and the second partition 1700". The members 822 may be symmetrically disposed in the peripheral sides of the first partition 1700' and the second partition 1700".

The member 822 may be formed of, e.g., a foam material with elasticity. For example, the member 822 may be formed of polyurethane, polyolefin, or polyethylene, but embodiments are not limited thereto. The member 822 may be formed of a double-sided tape, single-sided tape, adhesive, or bond, but embodiments are not limited thereto.

With reference to FIG. 16, the member 822 may be along the same axis as that of the first and second sound-generating devices 1900 and 1900', but embodiments are not limited to this structure. For example, the member 822 may be on the same plane as that of the first and second sound-generating devices 1900 and 1900'. If the sound-generating device and the member 822 are on the same axis, it may be favorable to the vibration control. According to experiments, the member 822 with a large size is favorable to the vibration control, in comparison to the member with a small size. In one example, respective length and width sizes of the member 822 may be 30 mm and 10 mm, but embodiments are not limited thereto.

With reference to FIG. 17, the display apparatus according to an embodiment of the present disclosure may include two or more members 824. The two members 824 may be in the central area (C) of the display panel 100. The two members 824 may be formed of the same material as that of the one member 822 described above in the FIG. 16 example. The two members 824 may be on the same axis as that of the first and second sound-generating devices 1900 and 1900', but embodiments are not limited to this structure. For example, the two members 824 may be on the same plane as that of the first and second sound-generating devices 1900 and 1900'. If the two members 824 and the sound-generating device are disposed in the same axis, it may be favorable to the vibration control.

For example, according to experiments, the two members 824 with a large size are favorable to the vibration control, in comparison to the member with a small size. In one example, respective length and width sizes of the two members 824 may be 30 mm and 10 mm, but embodiments are not limited thereto.

In FIG. 17, the two members 824 may be in the central area (C) of the display panel 100, but embodiments are not limited thereto. If the number of members is increased, it may be more favorable to the vibration control, to thereby improve the sound quality of the high-pitched sound band.

In the examples of FIGS. 16 and 17, the adhesion member for adhering the display panel and the supporting member to each other may be provided in the edge of the display panel and the edge of the supporting member, as explained above with reference to the FIG. 9 example.

Figure 18:
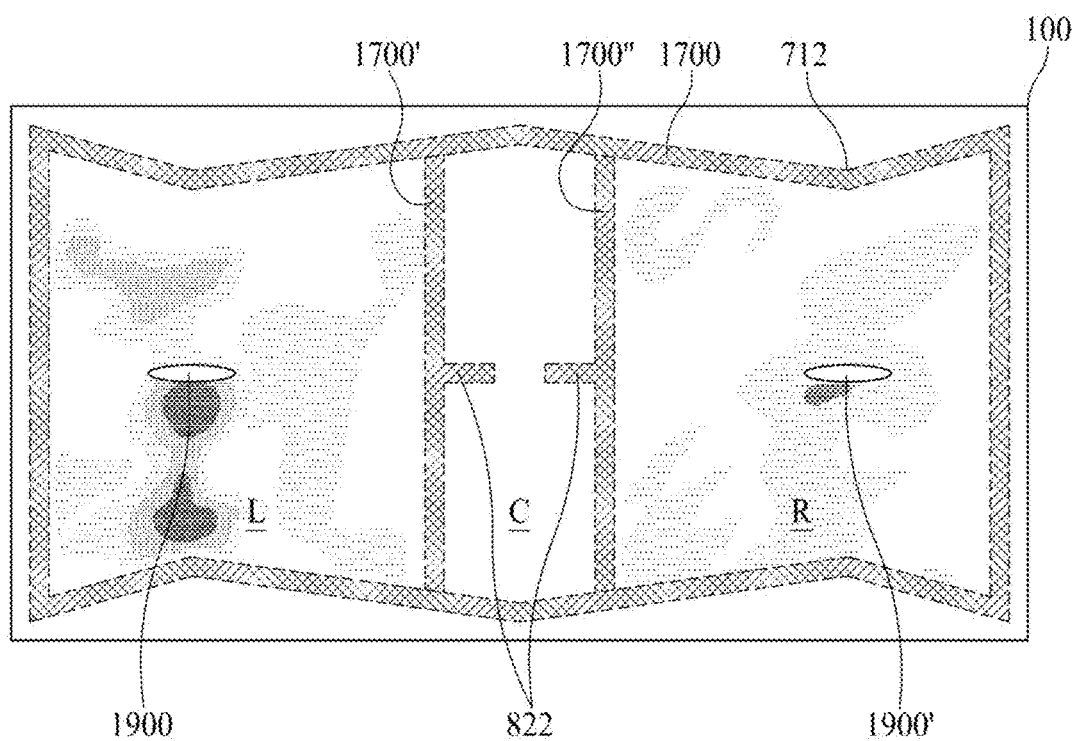
FIG. 18 illustrates vibration characteristics of the sound-generating device according to an embodiment of the present disclosure.

FIG. 18 illustrates vibration characteristics of the sound-generating device according to an embodiment of the present disclosure.

FIG. 18 shows the experimental measuring result of the vibration characteristics using by the use of laser Doppler device. After a sound vibration surface of the display panel 100 is irradiated with laser provided from the laser Doppler device, the laser Doppler device is capable of checking a vibration spread shape by the use of laser scattering shape, wherein this shape is displayed as an image. A microphone for a sound input, disposed above the center of the display panel, faces or extends toward the center of the display panel, and the vibration of the third area (C) is checked. To check the vibration of the third area (C), the microphone and the display panel are maintained to be perpendicular to each other. The sound output characteristics may be measured, which will be described with reference to FIG. 18.

FIG. 18 illustrates sound output characteristics of the sound-generating device according to an embodiment of the present disclosure.

In FIG. 18, a dotted line indicates the sound output characteristics of the sound-generating device shown in the FIG. 14 example, a thin solid line indicates the sound output characteristics of the sound-generating device with one member shown in the FIG. 16 example, and a thick solid line indicates the sound output characteristics of the sound-generating device with the two members shown in the FIG. 17 example. Herein, a horizontal axis indicates a frequency (Hz), and a vertical axis indicates a sound pressure level (SPL) in decibels (dB). Also, when vibration is measured, a microphone for a sound input, disposed above the center of the display panel, faces or extends toward the center of the display panel.

With reference to the experimental results shown in FIG. 18, in comparison to the example shown in FIG. 14 without the member, e.g., member 822 or 824, in the central area (C) of the display panel, when the member is provided in the central area of the display panel, it is possible to improve the sound pressure in the high-pitched sound band of about 10 kHz or more (shown in a circle), as shown by the thin solid line and the thick solid line in FIG. 18. Furthermore, in comparison to the case with one member (e.g., member 822 in the FIG. 16 example), the case with the two members (e.g., members 824 in the FIG. 17 example) is favorable to improvement of the sound pressure in the high-pitched sound band of about 10 kHz or more (shown in the circle). For example, in case of the high-pitched sound band of about 10 kHz or more, the sound pressure level is increased by 2 dB to 3 dB. Accordingly, when at least one member is provided in the central area of the display panel, the sound directivity angle may be improved, and the sound pressure of the high-pitched sound band may be improved.

FIG. 18 shows the vibration characteristics of the display apparatus of FIG. 16. For example, in FIG. 18, a dark or black-colored portion indicates an area with a large vibration, and a blurry or grey portion indicates an area with a small vibration.

According to the experimental measurement result of the vibration characteristics by the laser Doppler device, it can be seen that the vibration generated in the first and second sound-generating devices 1900 and 1900' of the first area (L) and second area (R) does not pass beyond the first and second partitions 1700' and 1700'', and the vibration is shown only within the first area (L) and the second area (R). As such, it can be seen that the vibration is not generated in the third area (C). Thus, the vibration generated in the first area (L) and the second area (R) is not transferred to the third area (C) so that it is possible to provide the display apparatus with the improved sound quality of the high-pitched sound band. Accordingly, when the member is provided, there may be no problem with the sound of the first area (L) being transferred to the second area (R), or the sound of the second area (R) being transferred to the first area (L). Therefore, there is a reduction in the sound interference between the first area (L) and the second area (R). As such, when the member is provided, it is possible to separate the channel of the left area corresponding to the first area (L) from the channel of the right area corresponding to the second area (R), to thereby provide the display apparatus with improved stereo performance. Furthermore, when at least one member is provided in the central area of the display panel, it is possible to reduce the sound interference between the sound generated by the sound-generating device in the left area of the display panel and the sound generated by the sound-generating device in the right area of the display panel, to thereby provide the display apparatus with more improved sound quality of the high-pitched sound band. The sound output characteristics may be measured, which will be described with reference to FIG. 19.

Figure 19:
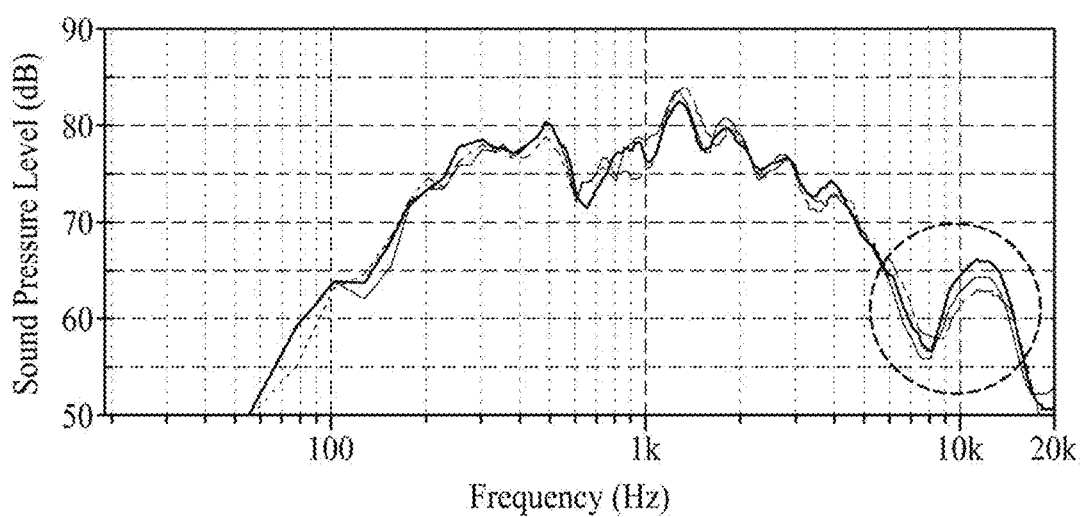
FIG. 19 illustrates sound output characteristics of the sound-generating device according to an embodiment of the present disclosure.

FIG. 19 illustrates sound output characteristics of the sound-generating device according to an embodiment of the present disclosure.

In FIG. 19, a dotted line indicates the sound output characteristics of the sound-generating device shown in the FIG. 14 example, a thin solid line indicates the sound output characteristics of the sound-generating device with one member shown in the FIG. 16 example, and a thick solid line indicates the sound output characteristics of the sound-generating device with the two members shown in the FIG. 17 example. Herein, a horizontal axis indicates a frequency (Hz), and a vertical axis indicates a sound pressure level (SPL) in decibels (dB). Also, when vibration is measured, a microphone for a sound input, disposed above the center of the display panel, faces or extends toward the center of the display panel.

With reference to the experimental results shown in FIG. 19, in comparison to the example shown in FIG. 14 without the member, e.g., member 822 or 824, in the central area (C) of the display panel, when the member is provided in the central area of the display panel, it is possible to improve the sound pressure in the high-pitched sound band of about 10 kHz or more (shown in a circle), as shown by the thin solid line and the thick solid line in FIG. 19. Furthermore, in comparison to the case with one member (e.g., member 822 in the FIG. 16 example), the case with the two members (e.g., members 824 in the FIG. 17 example) further improves the sound pressure in the high-pitched sound band of about 10 kHz or more (shown in the circle). For example, in the high-pitched sound band of about 10 kHz or more, the sound pressure level is increased by 2 dB to 3 dB. Accordingly, when at least one member is provided in the central area of the display panel, the sound directivity angle may be improved, and the sound pressure of the high-pitched sound band may be improved.

Therefore, when at least one member is provided in the central area of the display panel, it is possible to reduce the sound interference between the sound generated by the sound generating device disposed in the left area of the display panel and the sound generated by the sound generating device disposed in the right area of the display panel, to thereby provide the display apparatus with the more improved sound quality of the high-pitched sound band.

Accordingly, when at least one member is provided in the third area, there may be no issue with the sound of the first area (L) being transferred to the second area (R), and the sound of the second area (R) being transferred to the first area (L), and there may be a reduction in sound interference between the first area (L) and the second area (R). When at least one member (e.g., member 822 or 824) is provided in the third area, it is possible to separate the channel of the left area corresponding to the first area (L) from the channel of the right area corresponding to the second area (R), to thereby provide the display apparatus with the improved stereo performance. Accordingly, when at least one member is provided in the central area of the display panel, it is possible to reduce the sound interference between the sound generated by the sound-generating device in the left area of the display panel and the sound generated by the sound-generating device in the right area of the display panel, to separate the channel of the left area corresponding to the first area (L) from the channel of the right area corresponding to the second area (R), and to provide the display apparatus with the improved stereo performance.

Various embodiments of the sound-generating device and partition in the display apparatus according to an embodiment of the present disclosure will be described with reference to the examples of FIGS. 20A to 26D.

Figure 20A:
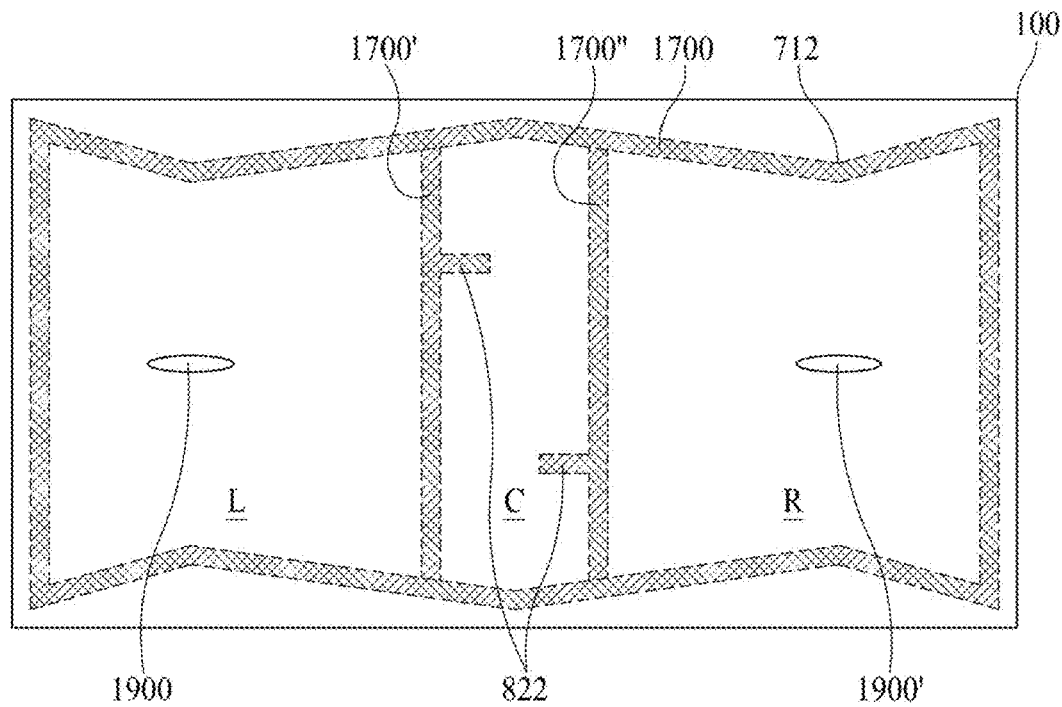
FIGS. 20A and 20B illustrate examples of the sound-generating device and partition in the display apparatus according to an embodiment of the present disclosure.
Figure 20B:
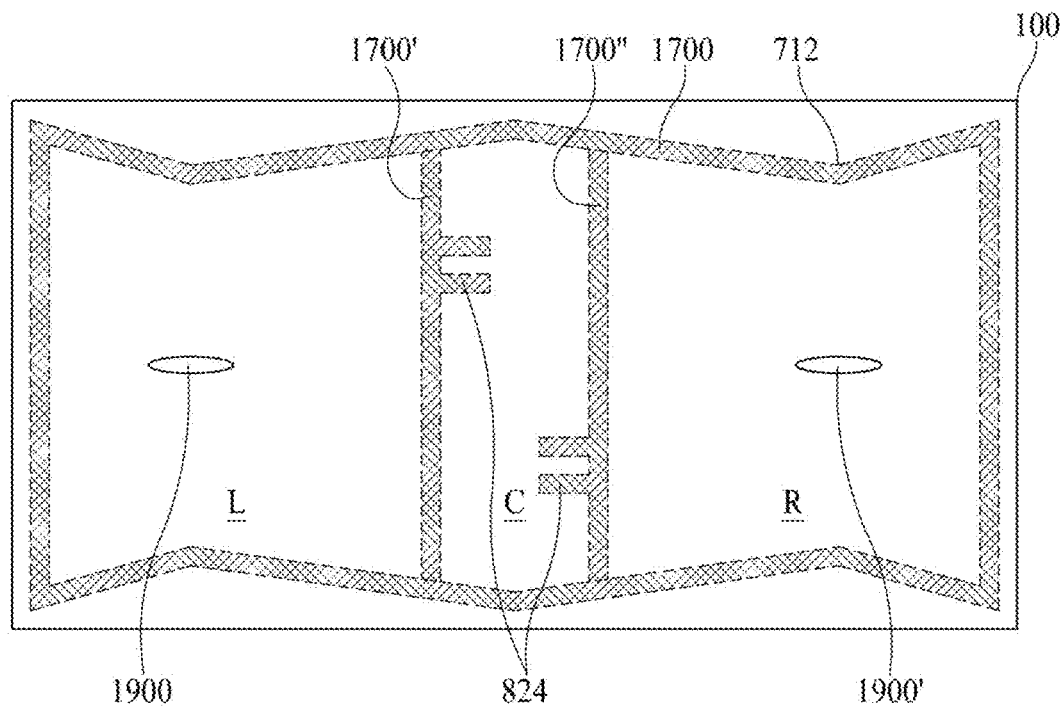

FIGS. 20A and 20B illustrate examples of the sound-generating device and partition in the display apparatus according to an embodiment of the present disclosure.

In FIGS. 20A and 20B, duplicate description for the sound-generating device and the partition as explained in the examples of FIGS. 16 and 17 will be omitted or briefly explained. In FIG. 20A, one member 822 may be in the central area of the display panel. In FIG. 20B, the two members 824 may be in the central area of the display panel.

With reference to FIGS. 20A and 20B, the members may be asymmetrically disposed in the third (or central) area (C) of the display panel. For example, the member may be disposed in a different axis from that of the sound-generating device, and the member 822 or 824 may be disposed on a different plane from that of the sound-generating device. The first sound-generating device 1900 in the first area (L) and the second sound-generating device 1900' in the second area (R) may generate the middle-high-pitched sound band.

With reference to FIG. 20A, the members 822 may not be at the same position, but may be at different positions in the central area (C) of the display panel 100 with respect to the first partition 1700' and the second partition 1700". For example, a first member 822 may be on the outer side of the first partition 1700', and a second member 822 may be below the first member 822 on the outer side of the second partition 1700".

With reference to FIG. 20B, the members 824 may be at different positions in the central area (C) of the display panel 100 with respect to the first partition 1700' and the second partition 1700". For example, a first member 824 may be on the outer side of the first partition 1700', and the second member 824 may be below the first of the members 824 on the outer side of the second partition 1700".

The first partition 1700', the second partition 1700", and the third partition 1700 may be on the rear surface of the display panel 100. The first partition 1700' and the second partition 1700" may be on the rear surface or front surface of the supporting member, e.g., the supporting member 300. The first partition 1700', the second partition 1700", and the third partition 1700 may be between the display panel and the supporting member. In FIGS. 20A and 20B, an adhesion member for adhering the display panel and the supporting member to each other may be provided in the periphery of the display panel and the supporting member, as explained above with reference to the FIG. 9 example.

FIGS. 21A to 21D illustrate examples of the sound-generating device and partition in the display apparatus according to an embodiment of the present disclosure.

In FIGS. 21A to 21D, duplicate description for the sound-generating device and the partition as explained in the examples of FIGS. 16 and 17 will be omitted or briefly explained. The first sound-generating device 1900 disposed in the first area (L) and the second sound-generating device 1900' disposed in the second area (R) may generate the middle-high-pitched sound band.

With reference to FIG. 21A to 21D, the protrusion portion 722, similar to the protrusion portion 722 of the FIG. 10C example, may be in at least one side of the third partition 1700. The protrusion portion 722 may be capable of trapping the reflected wave, and of decreasing the reduction of sound pressure level by the standing wave. The protrusion portion 722 may be at least one or more protrusion portion formed in at least one side of the third partition 1700. The protrusion portion 722 may be symmetrically disposed with respect to the sound-generating device. FIGS. 21A to 21D show that at least one protrusion portion 722 may be in any one side of the first side and the second side, perpendicular to the first side among the four sides of the display panel 100.

The protrusion portion 722 may be referred to as the "member." For example, at least one partition may include a first side and a second side is perpendicular to the first side, and the second side may include at least one member parallel to the first side. For example, at least one member may be in at least one among the left area of the display panel, the right area of the display panel, and the central area of the display panel. At least one member may be in the left area and the right area of the display panel, or may be in the left area, the right area and the central area of the display panel. The members in the left area and the right area of the display panel may be the protrusion portion (e.g., the protrusion portion 722), and the member in the central area of the display panel may be referred to as the member (e.g., the member 822), and the member (e.g., the protrusion portion 722 or the member 822) may be referred to as a "vibration control member."

Accordingly, the "member" may include the protrusion portion 722 and the member 822. The protrusion portion 722 may be capable of trapping the reflected wave, and of decreasing the reduction of sound pressure level by the standing wave. The member 822 may be capable of controlling the transmission of the wave or vibration of the partition to the first area and/or second area, to thereby provide the display apparatus with the improved sound quality of the middle-high-pitched sound band. Further, the protrusion portion 722 may be capable of trapping the reflected wave in the first area (L) and the second area (R), and preventing the vibration of the first area (L) and/or the vibration of the second area (R) from being transferred to the third area (C), to thereby provide the display apparatus with more improved sound quality of the middle-high-pitched sound band or the high-pitched sound band.

Figure 21A:
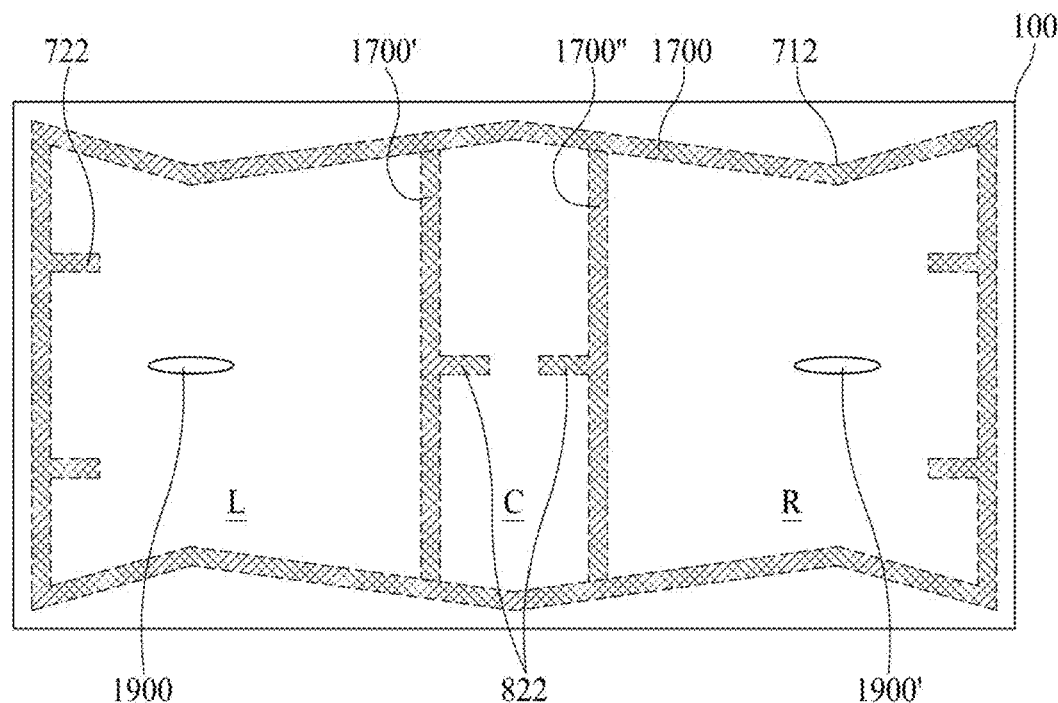
FIGS. 21A to 21D illustrate examples of the sound-generating device and partition in the display apparatus according to an embodiment of the present disclosure.
Figure 21B:
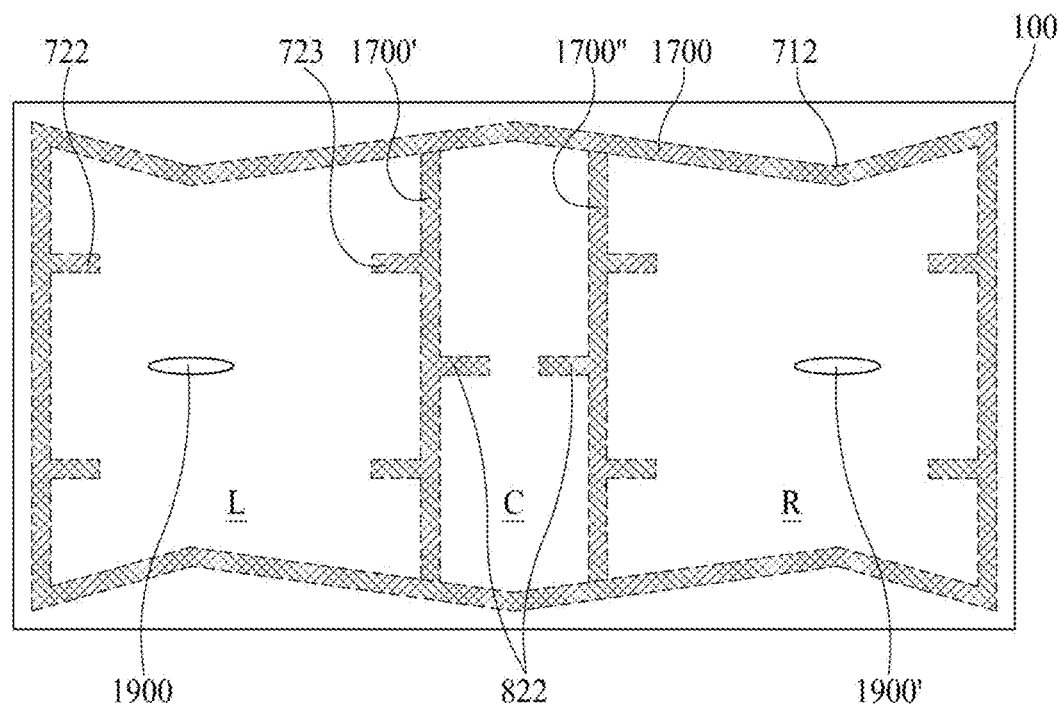

With reference to FIGS. 21A and 21B, the members 822 in the third area (C) of the display panel 100 may be in the respective outer sides of the first partition 1700' and the second partition 1700", and the members 822 may be symmetrically disposed with the sound-generating devices 1900 and 1900'. For example, the member 822 may be in the same axis as that of the sound-generating devices 1900 and 1900', and the member 822 may be on the same plane as that of the sound-generating devices 1900 and 1900'.

With reference to FIG. 21A, the protrusion portion 722 corresponding to the member may be on one side of the third partition 1700 in each of the left area (L) and the right area (R) of the display panel 100. For example, a respective one or more of the protrusion portion 722, corresponding to the member, may be on at least one side of the third partition 1700 disposed in each of the left area (L) and the right area (R) of the display panel 100, and may face or extend toward the sound-generating devices 1900 and 1900'. The member 822 may be between the protrusion portions 722 in a vertical direction.

With reference to FIG. 21B, the protrusion portion 722, corresponding to the member, may be on one side of the third partition 1700 in each of the left area (L) and the right area (R) of the display panel 100. For example, a respective inner member (e.g., a second protrusion portion 723), corresponding to the member, may be on one side of each of the first partition 1700' and the second partition 1700". For example, a respective one or more of each of the protrusion portion 722 and the second protrusion portion 723, corresponding to the member facing toward the sound-generating devices 1900 and 1900', may be on at least one side of the third partition 1700 disposed in each of the left area (L) and the right area (R) of the display panel 100.

The member 822 facing toward the central area (C) may be in the central area (C) of the display panel 100. For example, the second protrusion portion 723 may be on one side of the first partition 1700' and the second partition 1700", and the member 822 may be on another side of the first partition 1700' and the second partition 1700". The member 822 may be between the protrusion portions 722, and the member 822 may be between the second protrusion portions 723 in a vertical direction.

Figure 21C:
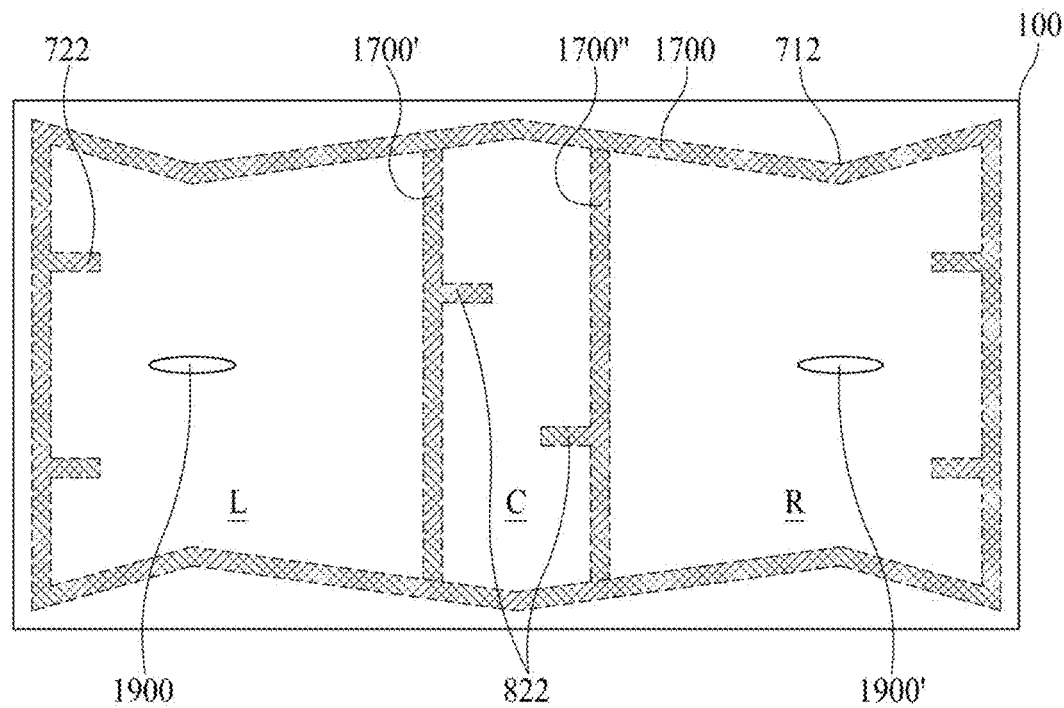
Figure 21D:
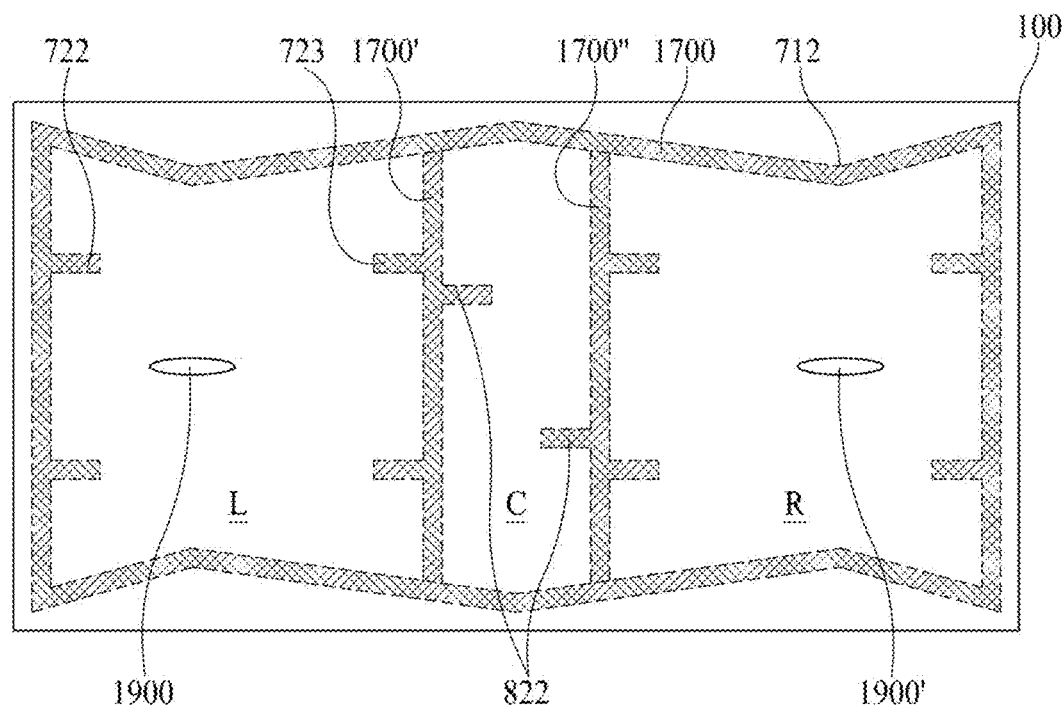

With reference to FIGS. 21C and 21D, the member 822 of the third area (C) of the display panel 100 may be respectively on the outer sides of the first partition 1700' and the second partition 1700", and the member 822 may be asymmetrically disposed with respect to the sound-generating devices 1900 and 1900'. For example, the member 822 may be on a different axis from that of the sound-generating devices 1900 and 1900', and the member 822 may be on a different plane from that of the sound-generating devices 1900 and 1900'.

With reference to FIG. 21C, a respective one or more of the protrusion portion 722, corresponding to the member, may be on one side of the third partition 1700 disposed in each of the first area (L) and the second area (R) of the display panel 100. For example, the protrusion portion 722, corresponding to the member facing toward the sound-generating devices 1900 and 1900', may be on at least one side of the third partition 1700 in each of the first area (L) and the second area (R) of the display panel 100. The member 822 may be between the protrusion portions 722 in a vertical direction.

With reference to FIG. 21D, the protrusion portion 722, corresponding to the member, may be on one side of the third partition 1700 disposed in each of the first area (L) and the second area (R) of the display panel 100. For example, a second protrusion portion 723 corresponding to the member may be disposed on one side of the first partition 1700' and the second partition 1700". For example, a respective one or more of each of the protrusion portion 722 and the second protrusion portion 723, corresponding to the member facing toward the sound-generating devices 1900 and 1900', may be on at least one side of the third partition 1700 disposed in each of the first area (L) and the second area (R) of the display panel 100.

The member 822 facing toward the third area (C) may be on the third area (C) of the display panel 100. For example, the second protrusion portion 723 may be in one side of the first partition 1700' and the second partition 1700", and the member 822 may be on another side of the first partition 1700' and the second partition 1700". The member 822 may be between the protrusion portions 722 in a vertical direction, and the member 822 may be between the second protrusion portions 723 in the vertical direction.

The second protrusion portion 723 may be referred to as the "member." For example, at least one partition may include a first side and a second side perpendicular to the first side, and the second side may include at least one member parallel to the first side. For example, at least one member may be in at least one among the left area of the display panel, the right area of the display panel, and the central area of the display panel. At least one member may be in the left area and the right area of the display panel, or may be in the left area, the right area, and the central area of the display panel. The member in the left area and the right area of the display panel may be referred to as the "protrusion portion," and the member in the central area of the display panel may be referred to as the "member."

Accordingly, the member may include the protrusion portion 722, the second protrusion portion 723, and the member 822. The protrusion portion 722 and the second protrusion portion 723 may be capable of trapping the reflected wave, and of decreasing the reduction of sound pressure level by the standing wave. The member 822 may be capable of controlling the transmission of the wave or vibration of the partition to the first area and/or second area, to thereby provide the display apparatus with the improved sound quality of the middle-high-pitched sound band. For example, the protrusion portion 722 and the second protrusion portion 723 may be capable of trapping the reflected wave in the first area (L) and the second area (R), and the member 822 may be capable of preventing the vibration of the first area (L) and/or the vibration of the second area (R) from being transmitted to the third area (C), to thereby provide the display apparatus with the more improved sound quality of the middle-high-pitched sound band or the high-pitched sound band. Further, the member may enable reduction or prevention of the sound of the first area corresponding to the left area from being transferred to the second area corresponding to the right area, and reduction or prevention of the sound of the second area corresponding to the right area from being transferred to the first area corresponding to the left area. Accordingly, it is possible to provide the display apparatus capable of reducing the sound interference between the first area corresponding to the left area and the second area corresponding to the right area, separating the channel of the left area from the channel of the right area, and improving the stereo performance.

For example, the first partition 1700', the second partition 1700", and the third partition 1700 may be on the rear surface of the display panel 100. The first partition 1700' and the second partition 1700" may be on the rear surface or front surface of the supporting member. The first partition 1700', the second partition 1700", and the third partition 1700 may be between the display panel and the supporting member. In the examples of FIGS. 21A to 21D, an adhesion member for adhering the display panel and the supporting member to each other may be provided in the periphery of the display panel and the supporting member, as explained above with reference to the FIG. 9 example.

FIGS. 22A to 22D illustrate examples of the sound-generating device and partition in the display apparatus according to an embodiment of the present disclosure.

In FIGS. 22A to 22D, duplicate description for the sound-generating device and the partition as explained in the examples of FIGS. 16 and 17 will be omitted or briefly explained. In FIGS. 22A to 22D, two members 824 may be in the central area (C) of the display panel 100, and may be substantially similar to the member 822 of FIGS. 21A to 21D. Accordingly, duplicate descriptions to those made above with reference to the examples of FIGS. 21A to 21D will be omitted or briefly explained. The first sound-generating device 1900 in the first area (L) and the second sound-generating device 1900' in the second area (R) may generate the middle-high-pitched sound band.

Figure 22A:
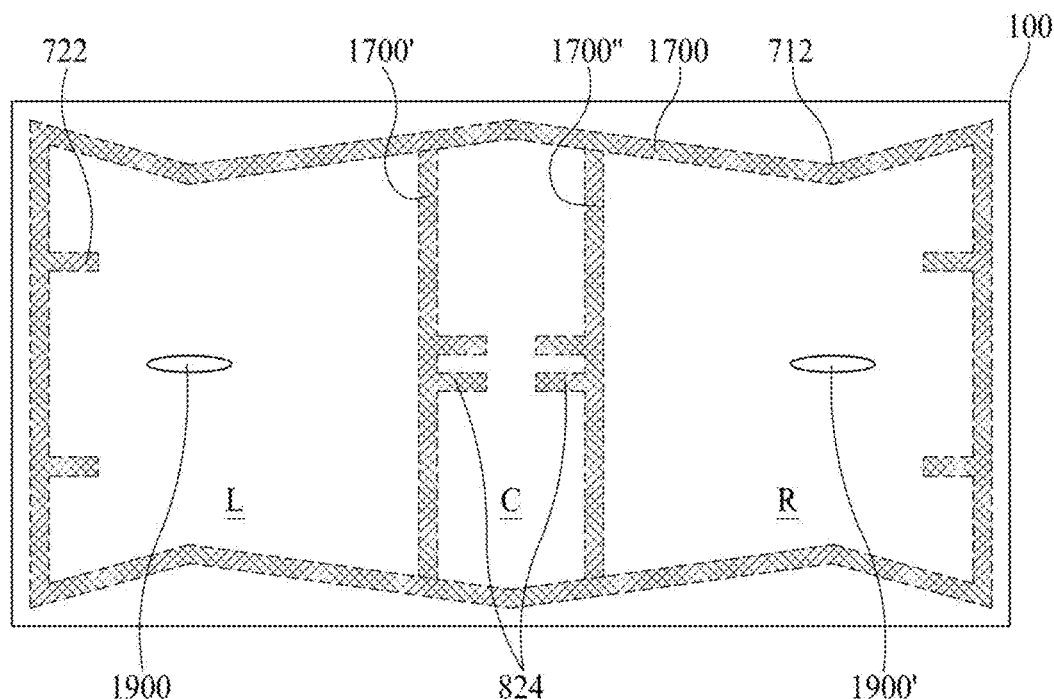
FIGS. 22A to 22D illustrate examples of the sound-generating device and partition in the display apparatus according to an embodiment of the present disclosure.
Figure 22B:
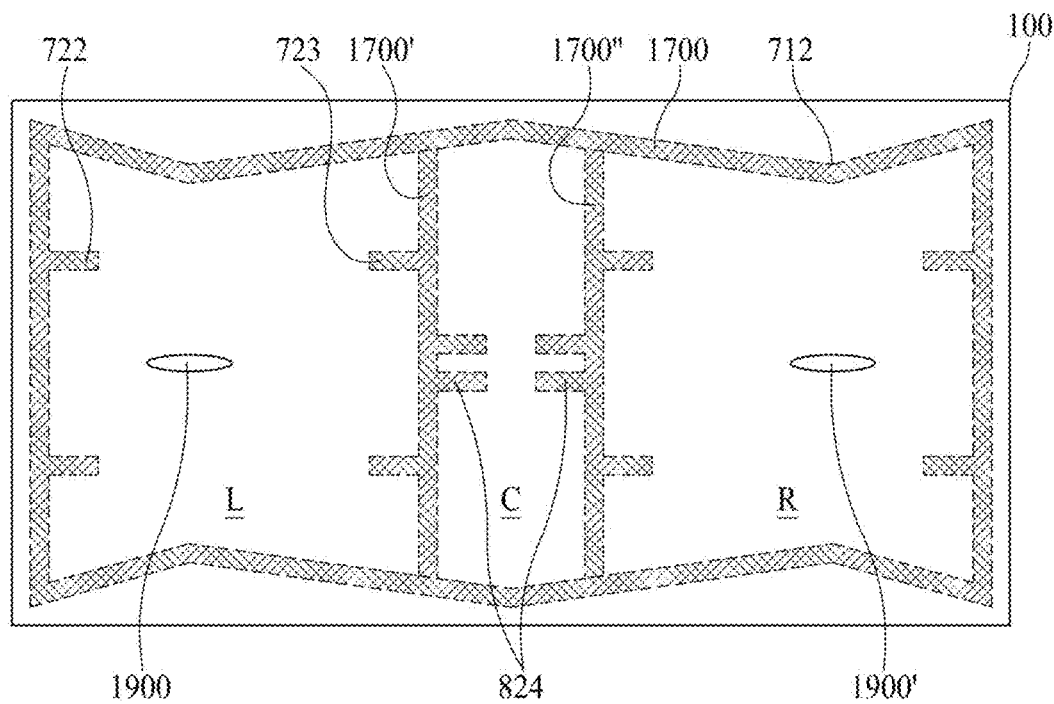

With reference to FIGS. 22A and 22B, at least a first and a second of the two members 824 of the central area (C) of the display panel 100 may be on the respective outer sides of the first partition 1700' and the second partition 1700", and the first and second of the two members 824 may be symmetrically disposed with respect to the sound-generating devices 1900 and 1900'. For example, the two members 824 may be on the same axis as that of the sound-generating devices 1900 and 1900', and the two members 824 may be on the same plane as that of the sound-generating devices 1900 and 1900'. The member 824 may also be referred to as the "vibration control member."

For example, with reference to FIG. 22A, the protrusion portion 722, corresponding to the member, may be on one side of the third partition 1700 in each of the left area (L) and the right area (R) of the display panel 100. For example, a respective one or more of the protrusion portion 722, corresponding to the member facing toward the sound-generating devices 1900 and 1900', may be on at least one side of the third partition 1700 disposed in each of the left area (L) and the right area (R) of the display panel 100. The two members 824 may be between the protrusion portions 722 in a vertical direction.

With reference to FIG. 22B, the protrusion portion 722 corresponding to the member may be on one side of the third partition 1700 disposed in each of the left area (L) and the right area (R) of the display panel 100. A respective one or more of the second protrusion portion 723, corresponding to the member, may be on one side of each of the first partition 1700' and the second partition 1700". For example, the protrusion portion 722 and the second protrusion portion 723 corresponding to the member facing toward the sound-generating devices 1900 and 1900' may be on at least one side of the partition 1700 disposed in each of the left area (L) and the right area (R) of the display panel 100.

The two members 824 may be in the central area (C) of the display panel 100, and may face or extend toward the central area (C). For example, a respective one or more of the second protrusion portion 723 may be on one side of the first partition 1700' and the second partition 1700", and the two members 824 may be on another side of the first partition 1700' and the second partition 1700". The two members 824 may be between the protrusion portions 722 in a vertical direction, and the two members 824 may be between the second protrusion portions 723 in a vertical direction.

Figure 22C:
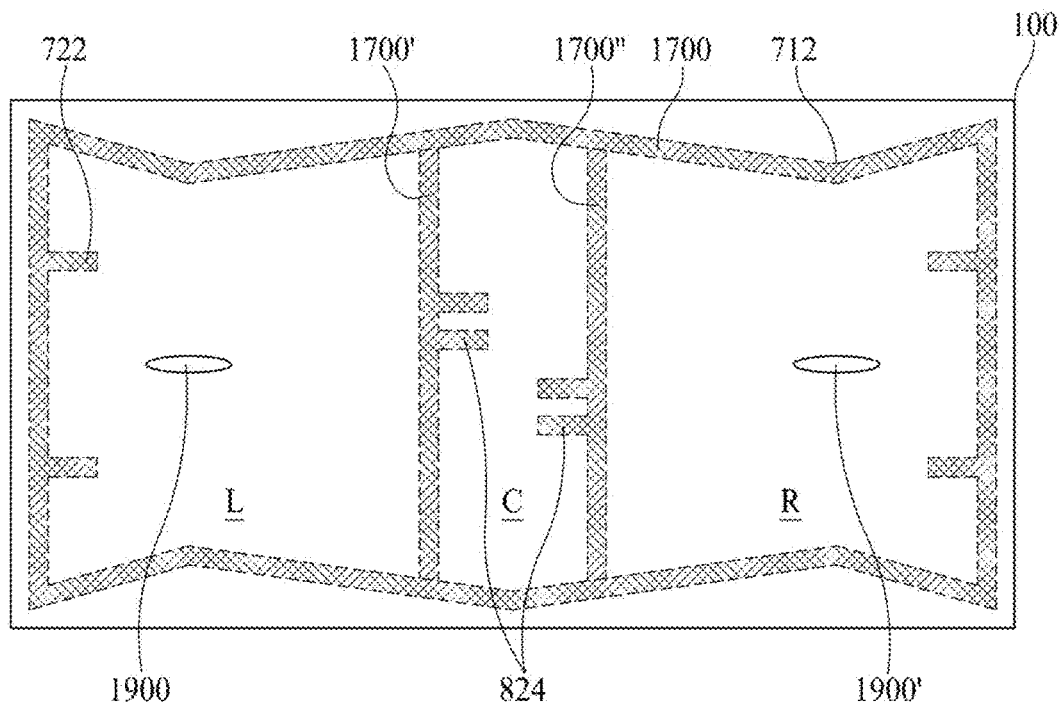
Figure 22D:
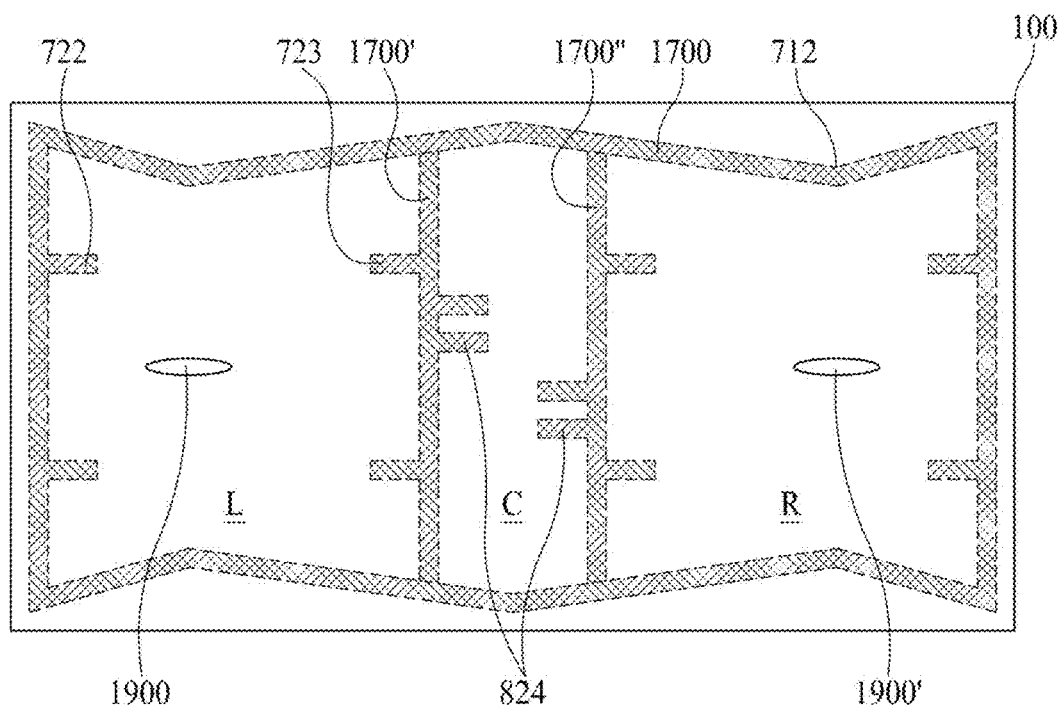

With reference to FIGS. 22C and 22D, at least a first and a second of the two members 824 in the central area (C) of the display panel 100 may be on respective outer sides of the first partition 1700' and the second partition 1700", and the first and second of the two members 824 may be asymmetrically disposed with respect to the sound-generating devices 1900 and 1900'. For example, the two members 824 may be on a different axis from that of the sound-generating devices 1900 and 1900', and the two members 824 may be on a different plane from that of the sound-generating devices 1900 and 1900'.

With reference to FIG. 22C, the protrusion portion 722, corresponding to the member, may be on one side of the third partition 1700 in each of the left area (L) and the right area (R) of the display panel 100. For example, a respective one or more of the protrusion portion 722, corresponding to the member facing toward the sound-generating devices 1900 and 1900', may be on at least one side of the partition 1700 disposed in each of the left area (L) and the right area (R) of the display panel 100. The two members 824 may be between the protrusion portions 722 in a vertical direction.

With reference to FIG. 22D, the protrusion portion 722, corresponding to the member, may be on one side of the third partition 1700 disposed in each of the left area (L) and the right area (R) of the display panel 100. For example, a respective one or more of the second protrusion portion 723, corresponding to the member, may be on one side of the first partition 1700' and the second partition 1700". For example, the protrusion portion 722 and the second protrusion portion 723, corresponding to the member facing toward the sound-generating devices 1900 and 1900', may be on at least one side of the partition 1700 disposed in each of the left area (L) and the right area (R) of the display panel 100.

For example, the two members 824 facing toward the central area (C) may be in the central area (C) of the display panel 100. For example, a respective one or more of the second protrusion portion 723 may be on one side of each of the first partition 1700' and the second partition 1700", and the two members 824 may be on another side of the first partition 1700' and the second partition 1700". The two members 824 may be between the protrusion portions 722 in a vertical direction, and the two members 824 may be between the second protrusion portions 723 in the vertical direction.

For example, the first partition 1700', the second partition 1700", and the third partition 1700 may be on the rear surface of the display panel 100. The first partition 1700' and the second partition 1700" may be on the rear surface or front surface of the supporting member. The first partition 1700', the second partition 1700", and the third partition 1700 may be between the display panel and the supporting member. In FIGS. 22A to 22D, an adhesion member for adhering the display panel and the supporting member to each other may be provided in the periphery of the display panel and the supporting member, as explained above with reference to the FIG. 9 example.

FIGS. 23A to 23H illustrate examples of the sound-generating device and partition in the display apparatus according to an embodiment of the present disclosure.

In FIGS. 23A to 23H, duplicate description for the sound-generating device and the partition as explained in the examples of FIGS. 16 and 17 will be omitted or briefly explained. In the examples illustrated FIGS. 23A to 23H, two members 824 are in the central area (C) of the display panel 100, but embodiments are not limited thereto. The member 822 in the central area (C) of the display panel 100 described in the examples of FIGS. 21A to 21D may be applied to the display apparatus of FIGS. 23A to 23H. Therefore, duplicate description to that of FIGS. 22A to 22D will be omitted or briefly explained. The first sound-generating device 1900 in the first area (L) and the second sound-generating device 1900' in the second area (R) may generate the middle-high-pitched sound band.

With reference to FIGS. 23A to 23D, at least a first and a second of the two members 824 of the central area (C) of the display panel 100 may be on the respective outer sides of the first partition 1700' and the second partition 1700", and the first and second of the two members 824 may be asymmetrically disposed with respect to the sound-generating devices 1900 and 1900'. For example, the two members 824 may be on a different axis from that of the sound-generating devices 1900 and 1900', and the two members 824 may be on a different plane from that of the sound-generating devices 1900 and 1900'. For example, a respective one or more of the protrusion portion 722 corresponding to the member may be on one side of the third partition 1700 in each of the left area (L) and the right area (R) of the display panel 100. For example, the protrusion portion 722, corresponding to the member facing toward the sound-generating devices 1900 and 1900', may be on at least one side of the partition disposed in each of the left area (L) and the right area (R) of the display panel 100.

Figure 23A:
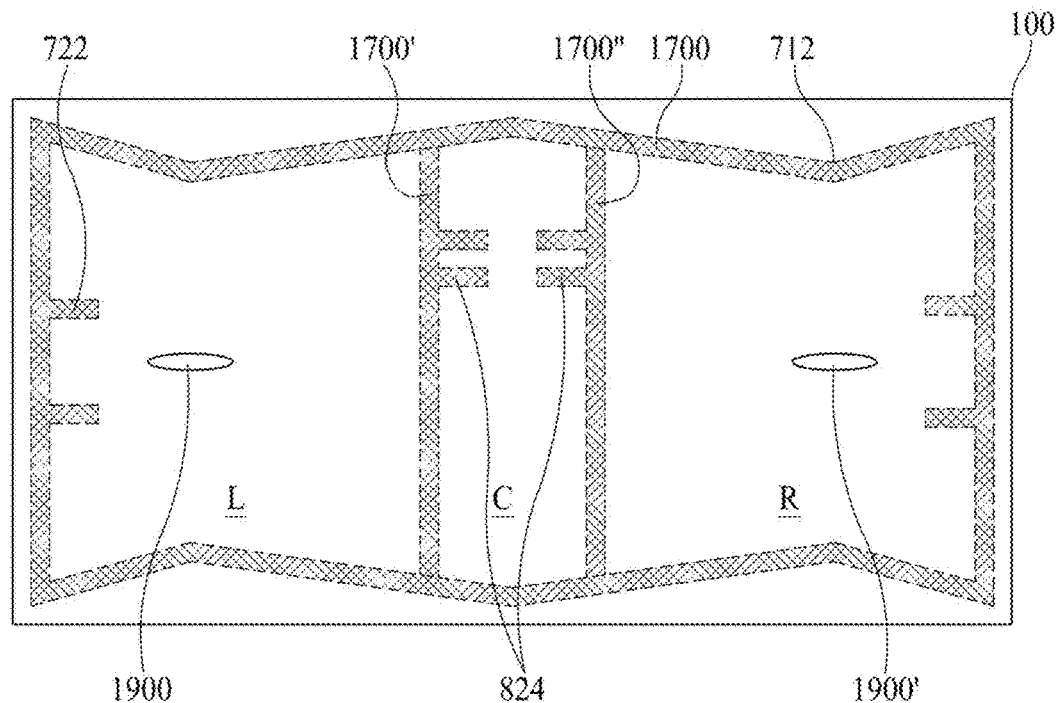
FIGS. 23A to 23H illustrate examples of the sound-generating device and partition in the display apparatus according to an embodiment of the present disclosure.

For example, with reference to FIG. 23A, the two members 824 may be disposed at an upper side of the sound-generating devices 1900 and 1900', e.g., above the sound-generating devices 1900 and 1900' in a vertical direction. The protrusion portion 722 may be at least one protrusion portion on at least one side of the third partition 1700. The protrusion portions 722 may be symmetrically disposed with respect to the sound-generating devices 1900 and 1900'. For example, a respective one or more of the protrusion portion 722, corresponding to the member facing toward the sound-generating devices 1900 and 1900', may be on at least one side of the third partition 1700 disposed in each of the left area and the right area of the display panel 100. The two members 824 and the protrusion portion 722 may be disposed on the same axis. For example, the two members 824 and the protrusion portion 722 may be disposed in the same line, but embodiments are not limited thereto.

Figure 23B:
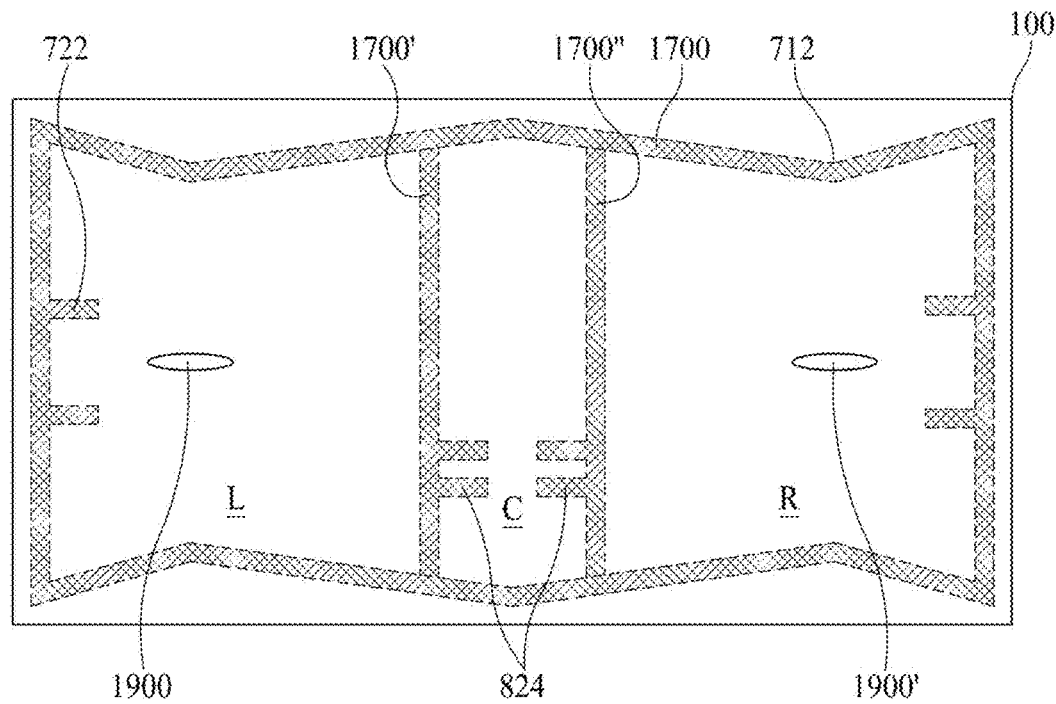

With reference to FIG. 23B, the two members 824 may be disposed at a lower side of the sound-generating devices 1900 and 1900', e.g., below the sound-generating devices 1900 and 1900' in a vertical direction. The protrusion portion 722 may be at least one protrusion portion on at least one side of the third partition 1700. The protrusion portions 722 may be symmetrically disposed with respect to the sound-generating devices 1900 and 1900'. For example, a respective one or more of the protrusion portion 722, corresponding to the member facing toward the sound-generating devices 1900 and 1900', may be disposed on at least one side of the third partition 1700 disposed in each of the left area and the right area of the display panel 100. The two members 824 and the protrusion portion 722 may be disposed on the same axis. For example, the two members 824 and the protrusion portion 722 may be disposed in the same line, but embodiments are not limited thereto.

Figure 23C:
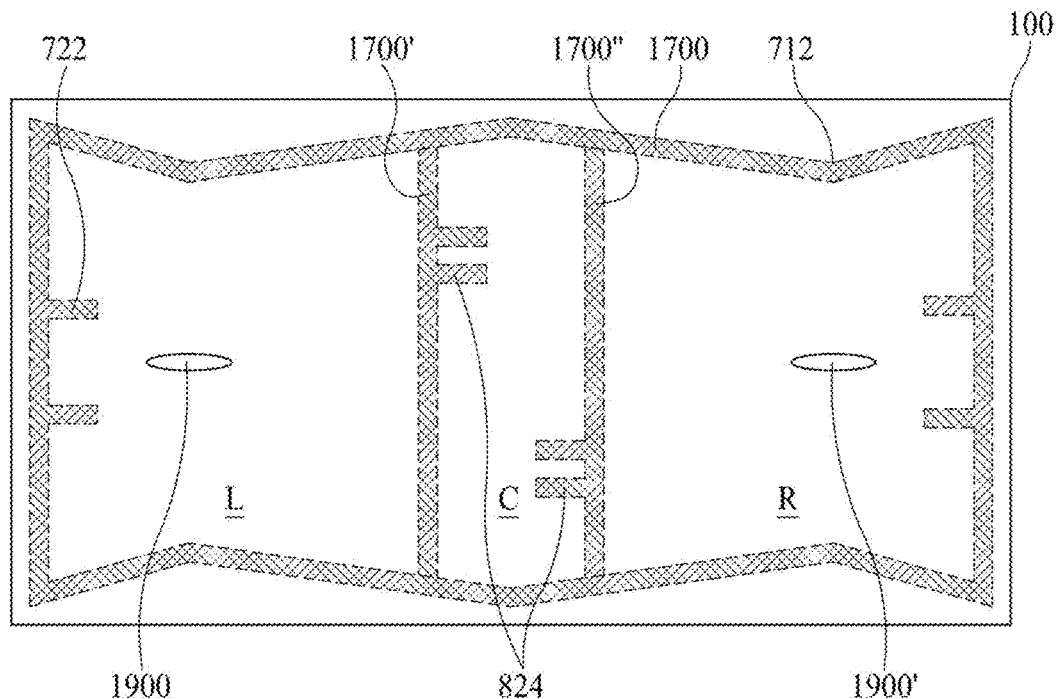
Figure 23D:
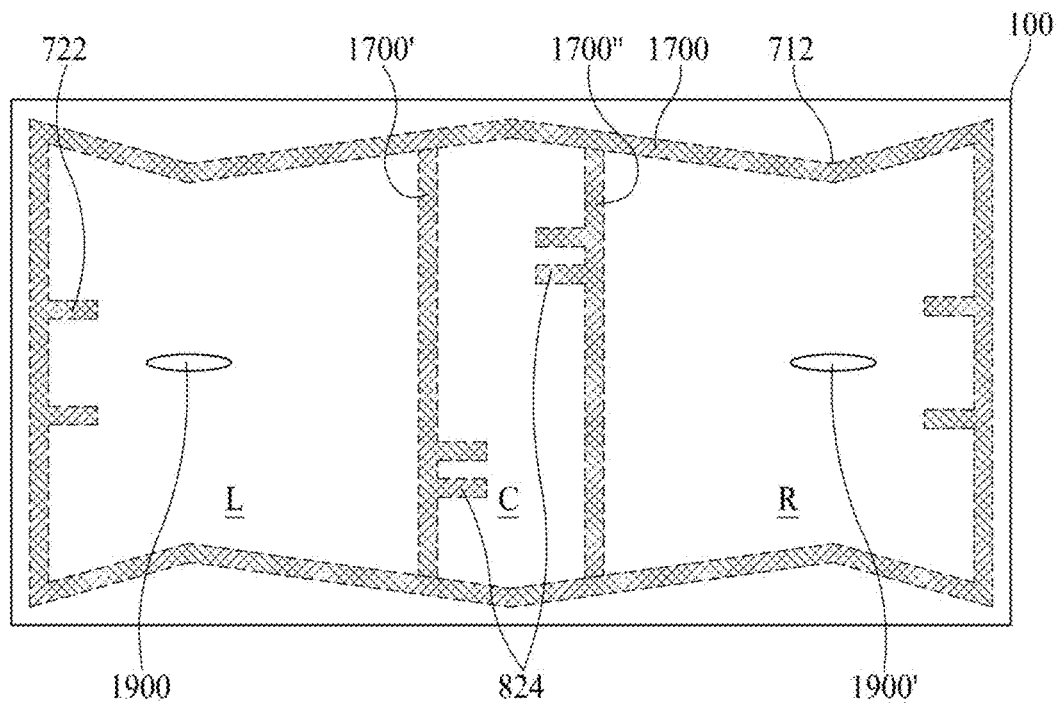
Figure 23E:
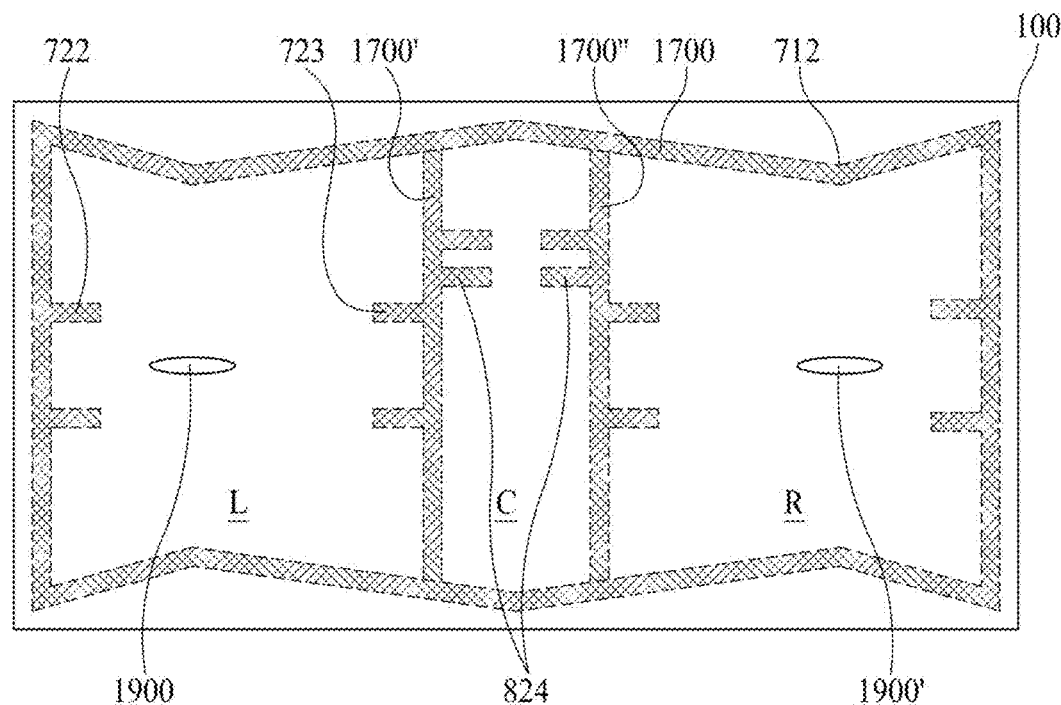
Figure 23F:
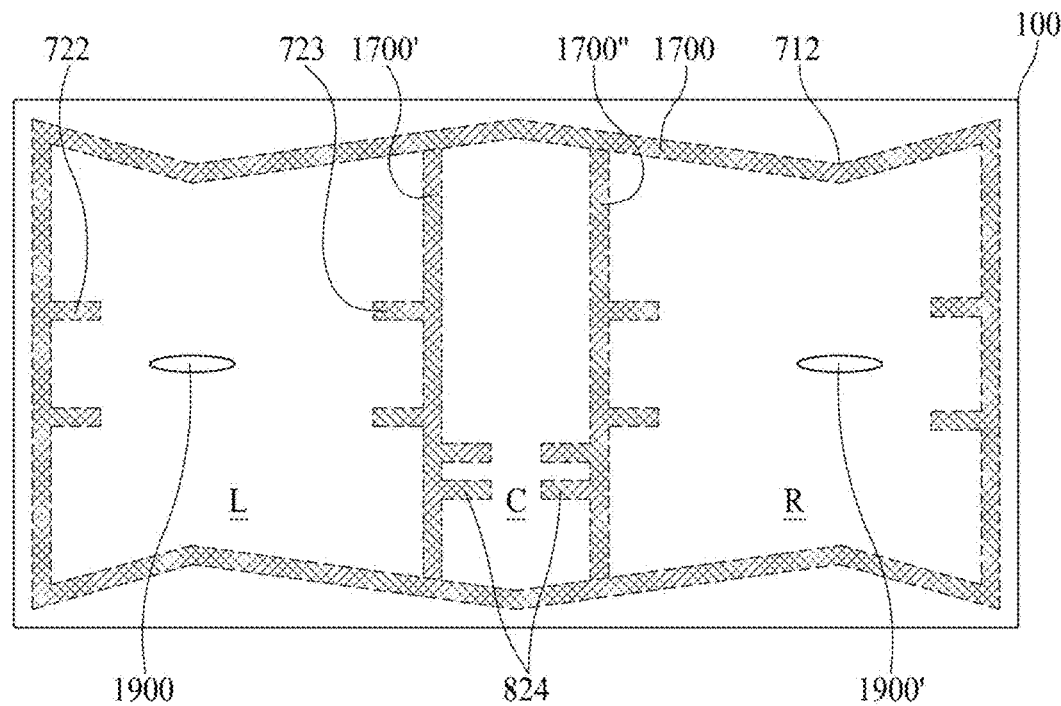
Figure 23G:
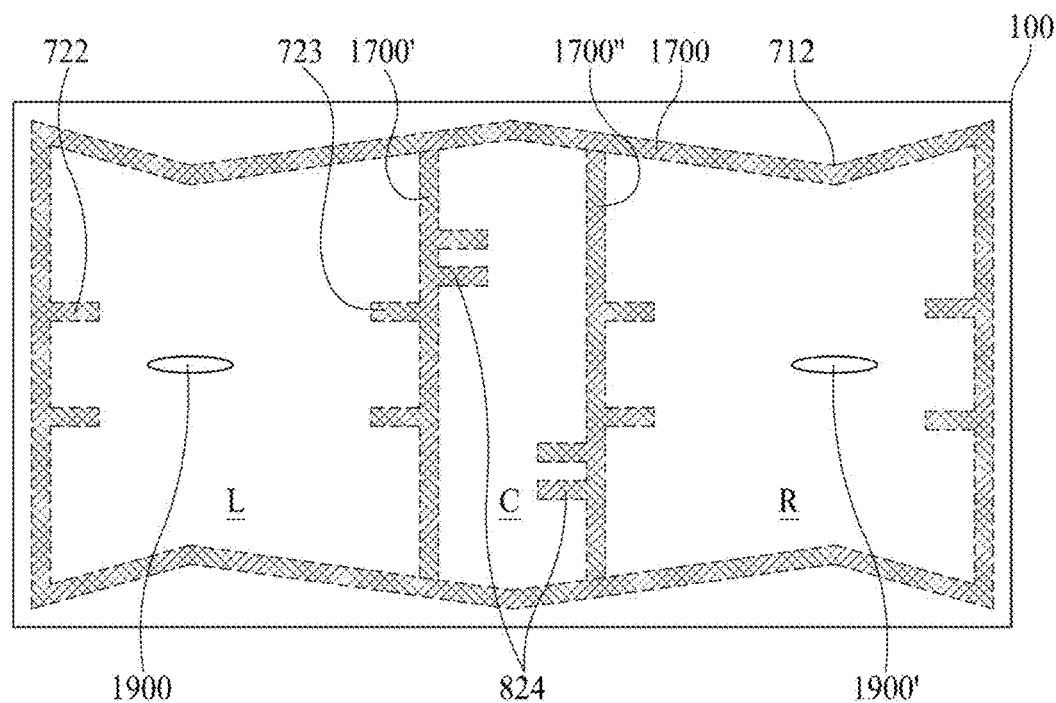
Figure 23H:
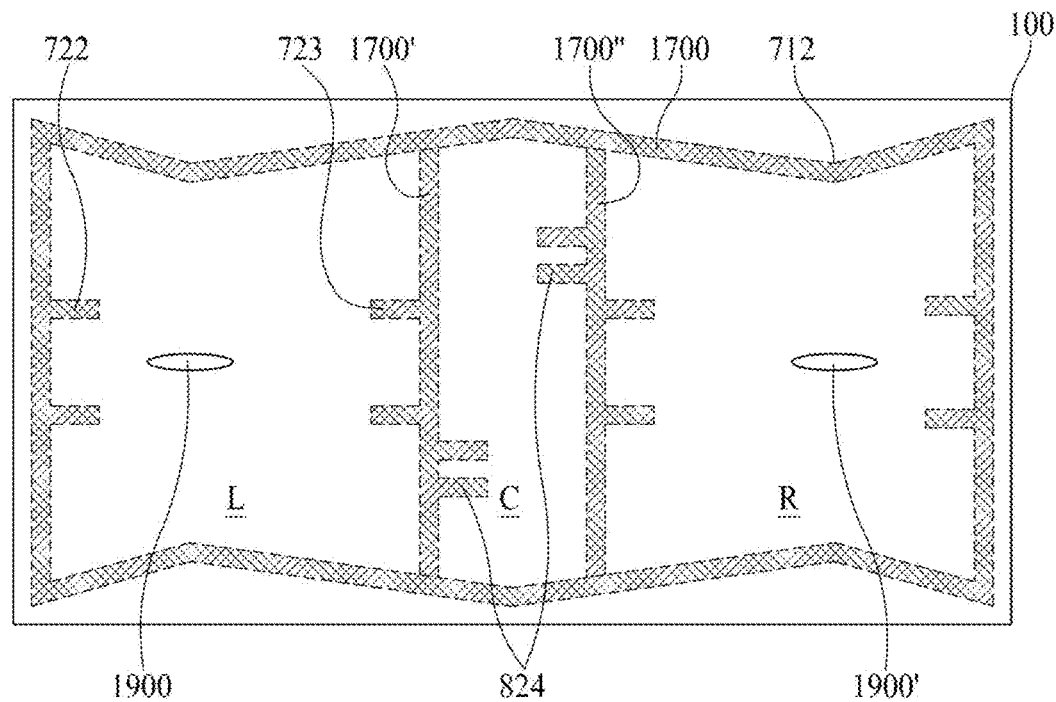

In FIGS. 23C and 23D, in the central area (C) of the display panel 100, a first and a second of the two members 824 may not be disposed at the same position in a vertical direction, but may be disposed at different vertical positions with respect to the first partition 1700' and the second partition 1700". For example, with reference to FIG. 23C, at least a first of the two members 824 may be disposed at an upper position of the outer side of the first partition 1700', and at least a second of the two members 824 may be disposed at a lower position of the outer side of the second partition 1700". For example, with reference to FIG. 23D, at least a first of the two members 824 may be disposed at a lower position of the outer side of the first partition 1700', and at least a second of the two members 824 may be disposed at an upper position of the outer side of the second partition 1700".

With reference to FIGS. 23E to 23H, at least one protrusion portion 722, corresponding to the member, may be respectively on one side of the third partition 1700 in each of the left area (L) and the right area (R) of the display panel 100. At least one second protrusion portion 723, corresponding to the member, may be respectively on one side of each of the first partition 1700' and the second partition 1700". For example, a respective one or more of the protrusion portion 722 and the second protrusion portion 723, corresponding to the member facing toward the sound-generating devices 1900 and 1900', may be on at least one side of the partition 1700 disposed in each of the left area (L) and the right area (R) of the display panel 100.

The two members 824, facing toward the central area (C), may be in the central area (C) of the display panel 100. For example, the second protrusion portion 723 may be on one side of the first partition 1700' and the second partition 1700", and the two members 824 may be respectively on another side of the first partition 1700' and the second partition 1700". The two members 824 may be asymmetrically disposed with respect to the sound-generating devices 1900 and 1900'. For example, the two members 824 and the sound-generating devices 1900 and 1900' may be on different axes from each other, and the two members 824 and the sound-generating devices 1900 and 1900' may be on different planes from each other.

In the examples of FIGS. 23E to 23H, because the two members 824 are substantially similar to those explained above with regard to the examples of FIGS. 23A to 23D, a duplicate description thereof will be omitted here. The first partition 1700', the second partition 1700", and the third partition 1700 may be on the rear surface of the display panel 100. The first partition 1700' and the second partition 1700" may be on the rear surface or front surface of the supporting member. The first partition 1700', the second partition 1700", and the third partition 1700 may be between the display panel and the supporting member. In FIGS. 23A to 23H, an adhesion member for adhering the display panel and the supporting member to each other may be provided in the periphery of the display panel and the supporting member, as explained above with reference to the FIG. 9 example.

FIGS. 24A to 24D illustrate examples of the sound-generating device and partition in the display apparatus according to an embodiment of the present disclosure.

FIGS. 24A to 24D show examples including a circle-shaped sound-generating device, and duplicate description to that given above with regard to the examples of FIGS. 22A to 22D will be omitted or briefly explained. Also, the description of the member 822 in the central area (C) of the display panel 100 described above with regard to the examples of FIGS. 21A to 21D may also be applied to the display apparatus of the examples of FIGS. 24A to 24D. For example, the description for the partition, protrusion portion, second protrusion portion and member shown in FIGS. 23A to 23H may also be applied to the display apparatus of the examples of FIGS. 24A to 24D.

The sound-generating device is substantially similar to that described above for the examples of FIGS. 1A to 4B, so a detailed description for the sound-generating device will be omitted. Also, a connection structure between the sound-generating devices 1600 and 1600' and the supporting member is substantially similar to that described above for the examples of FIGS. 7 and 8, so a detailed description thereof will be omitted. The first sound-generating device 1600 in the first area (L) and the second sound-generating device 1600' in the second area (R) may generate the middle-high-pitched sound band.

Figure 24A:
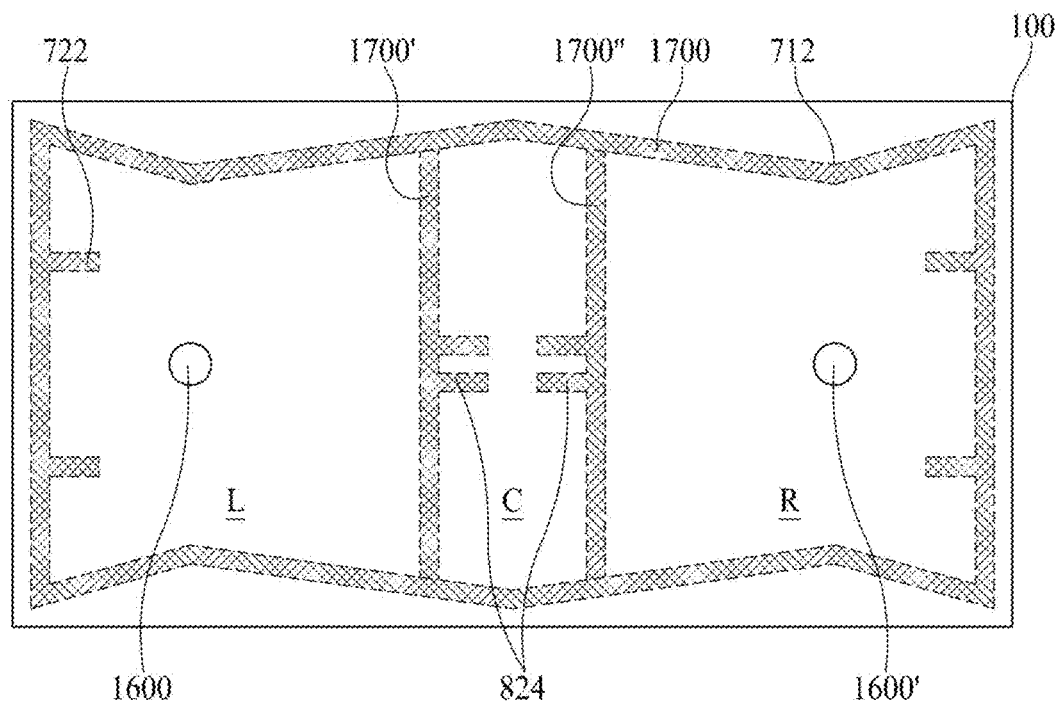
FIGS. 24A to 24D illustrate examples of the sound-generating device and partition in the display apparatus according to an embodiment of the present disclosure.
Figure 24B:
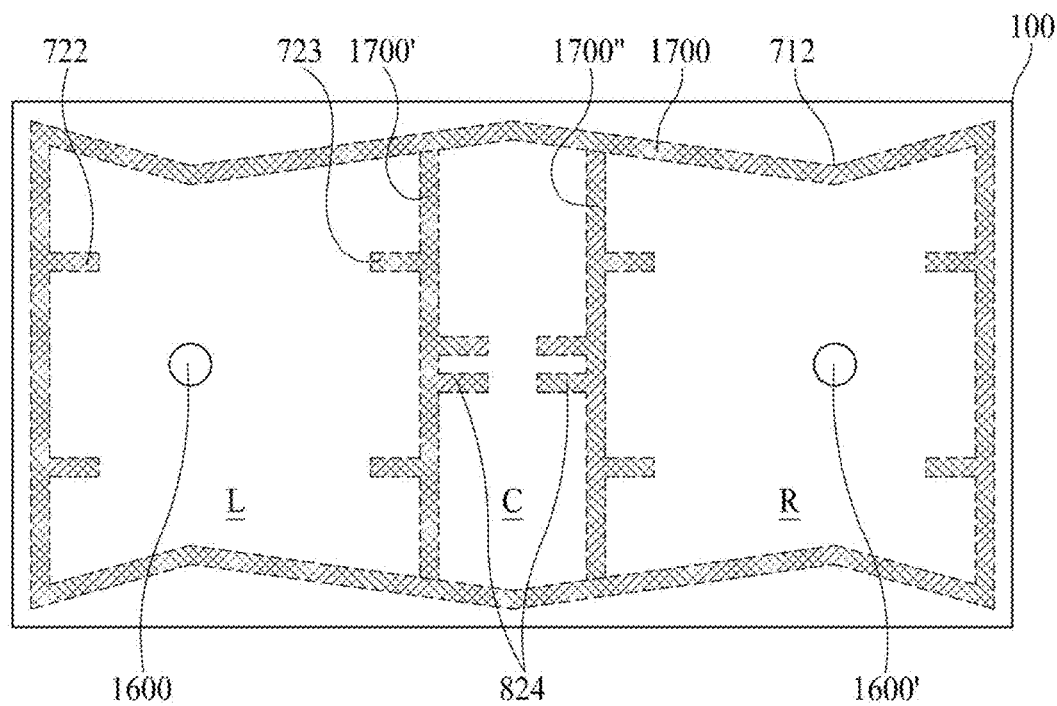

With reference to FIGS. 24A and 24B, at least a first and a second of the two members 824 of the central area (C) of the display panel 100 may be on respective outer sides of the first partition 1700' and the second partition 1700", and the two members 824 may be symmetrically disposed with respect to the sound-generating devices 1600 and 1600'. For example, the two members 824 may be on the same axis as that of the sound-generating devices 1600 and 1600', and the two members 824 may be on the same plane as that of the sound-generating devices 1600 and 1600'. The sound-generating devices 1600 and 1600' may have a circle shape, although embodiments are not limited thereto.

For example, with reference to FIG. 24A, a respective one or more of the protrusion portion 722, corresponding to the member, may be on one side of the third partition 1700 disposed in each of the left area (L) and the right area (R) of the display panel 100. For example, the protrusion portion 722, corresponding to the member facing toward the sound-generating devices 1600 and 1600', may be respectively on at least one side of the partition disposed in each of the left area (L) and the right area (R) of the display panel 100. The two members 824 may be between the protrusion portions 722 in a vertical direction.

With reference to FIG. 24B, a respective one or more of the protrusion portion 722, corresponding to the member, may be on one side of the third partition 1700 disposed in each of the left area (L) and the right area (R) of the display panel 100. A respective one or more of the second protrusion portion 723, corresponding to the member, may be on one side of the first partition 1700' and the second partition 1700". For example, a respective one or more of the protrusion portion 722 and the second protrusion portion 723, corresponding to the member facing toward the sound-generating devices 1600 and 1600', may be on at least one side of the partition 1700 disposed in each of the left area (L) and the right area (R) of the display panel 100.

The two members 824 facing toward the central area (C) may be in the central area (C) of the display panel 100. For example, a respective one or more of the second protrusion portion 723 may be on one side of the first partition 1700' and the second partition 1700", and the two members 824 may be on another side of the first partition 1700' and the second partition 1700". The two members 824 may be between the protrusion portions 722 in a vertical direction, and the two members 824 may be between the second protrusion portions 723 in the vertical direction.

Figure 24C:
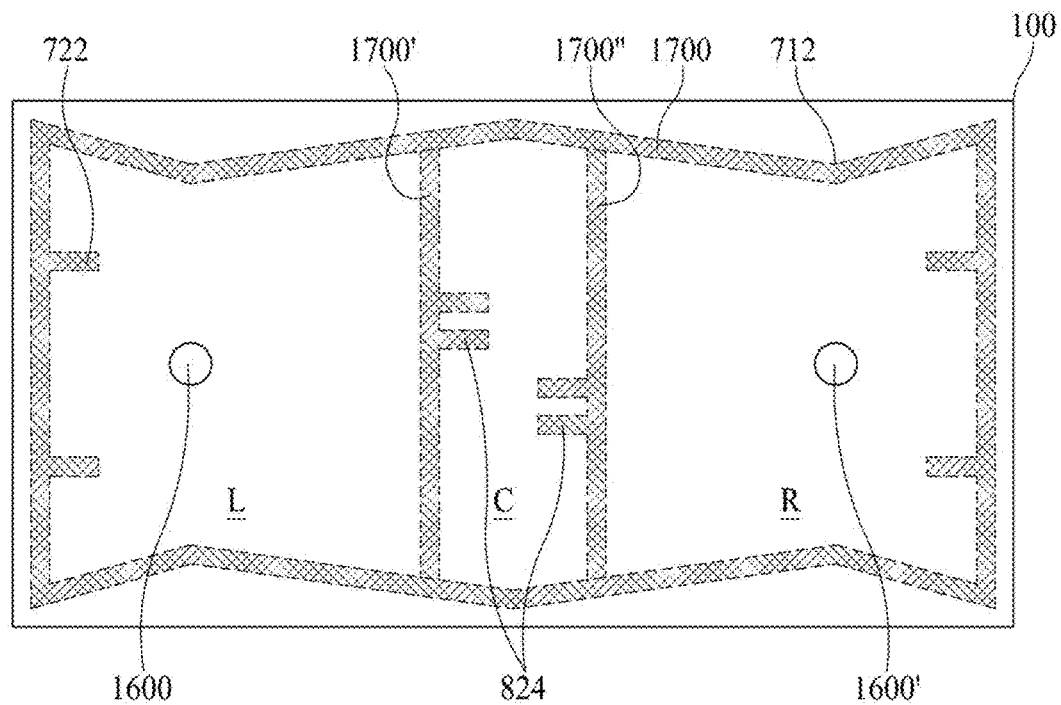
Figure 24D:
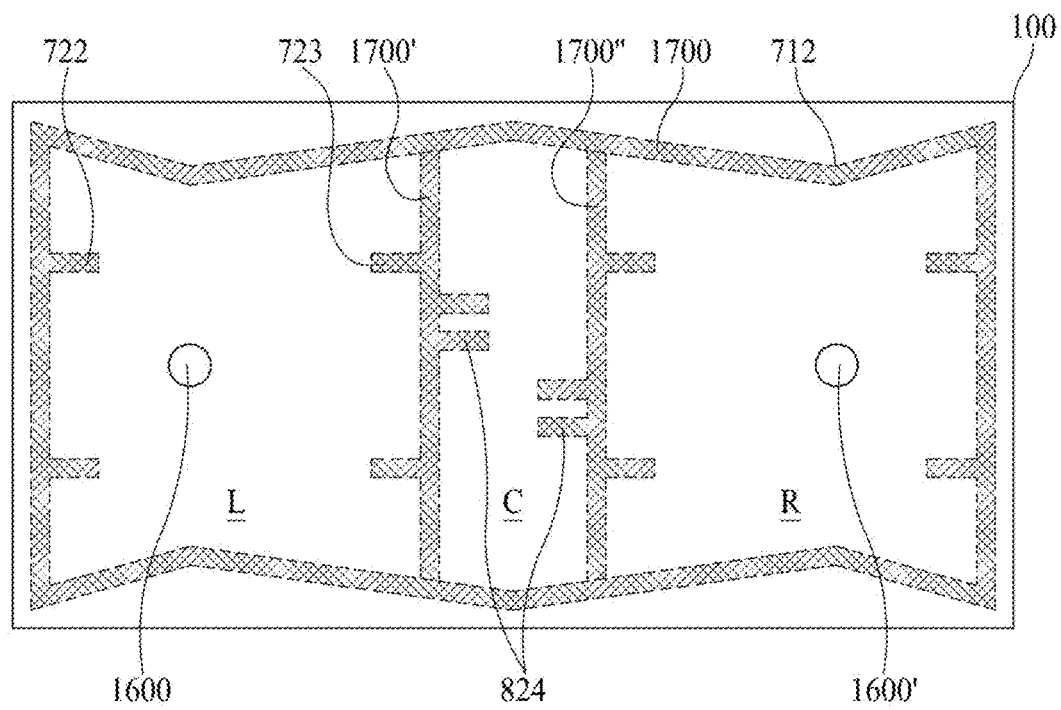

With reference to FIGS. 24C and 24D, at least a first and a second of the two members 824 of the central area (C) of the display panel 100 may be on the respective outer sides of the first partition 1700' and the second partition 1700". The at least first and second of the two members 824 may be asymmetrically disposed with respect to the sound-generating devices 1600 and 1600'. For example, the two members 824 may be on a different axis from that of the sound-generating devices 1600 and 1600', and the two members 824 may be on a different plane from that of the sound-generating devices 1600 and 1600'.

With reference to FIG. 24C, a respective one or more of the protrusion portion 722, corresponding to the member, may be on one side of the third partition 1700 in each of the left area (L) and the right area (R) of the display panel 100. For example, the protrusion portion 722, corresponding to the member facing toward the sound-generating devices 1600 and 1600', may be on at least one side of the partition disposed in each of the left area (L) and the right area (R) of the display panel 100. The two members 824 may be between the protrusion portions 722 in a vertical direction.

With reference to FIG. 24D, a respective one or more of the protrusion portion 722, corresponding to the member, may be on one side of the third partition 1700 disposed in each of the left area (L) and the right area (R) of the display panel 100. A second protrusion portion 723, corresponding to the member, may be on one side of the first partition 1700' and the second partition 1700". For example, a respective one or more of the protrusion portion 722 and the second protrusion portion 723, corresponding to the member facing toward the sound-generating devices 1600 and 1600', may be on at least one side of the partition disposed in each of the left area (L) and the right area (R) of the display panel 100.

The two members 824, facing toward the central area (C), may be in the central area (C) of the display panel 100. For example, the second protrusion portion 723 may be on one side of the first partition 1700' and the second partition 1700", and the two members 824 may be on another side of the first partition 1700' and the second partition 1700". The two members 824 may be between the protrusion portions 722 in a vertical direction, and the two members 824 may be between the second protrusion portions 723 in the vertical direction.

The first partition 1700', the second partition 1700", and the third partition 1700 may be on the rear surface of the display panel 100. The first partition 1700' and the second partition 1700" may be on the rear surface or front surface of the supporting member. The first partition 1700', the second partition 1700", and the third partition 1700 may be between the display panel and the supporting member. In FIGS. 24A to 24D, an adhesion member for adhering the display panel and the supporting member to each other may be provided in the periphery of the display panel and the supporting member, as explained above with regard to the FIG. 9 example.

FIGS. 25A to 25D illustrate examples of the sound-generating device and partition in the display apparatus according to an embodiment of the present disclosure.

FIGS. 25A to 25D show examples including a pair of sound-generating devices, and duplicate description to that given above with regard to the examples of FIGS. 22A to 22D will be omitted or briefly explained. Also, the description of the member 822 in the central area (C) of the display panel 100 described above with regard to the examples of FIGS. 21A to 21D may also be applied to the display apparatus of the examples of FIGS. 24A to 24D. For example, the description for the partition, protrusion portion, second protrusion portion and member shown in FIGS. 23A to 23H may also be applied to the display apparatus of the examples of FIGS. 24A to 24D.

The sound-generating device is substantially similar to that described above for the examples of FIGS. 5A to 6, so a detailed description for the sound-generating device will be omitted. Also, a connection structure between the sound-generating devices 1800 and 1800' and the supporting member is substantially similar to that described above for the examples of FIGS. 7 and 8, so a detailed description thereof will be omitted. The first sound-generating device 1800 in the first area (L) and the second sound-generating device 1800' in the second area (R) may generate the middle-high-pitched sound band.

Figure 25A:
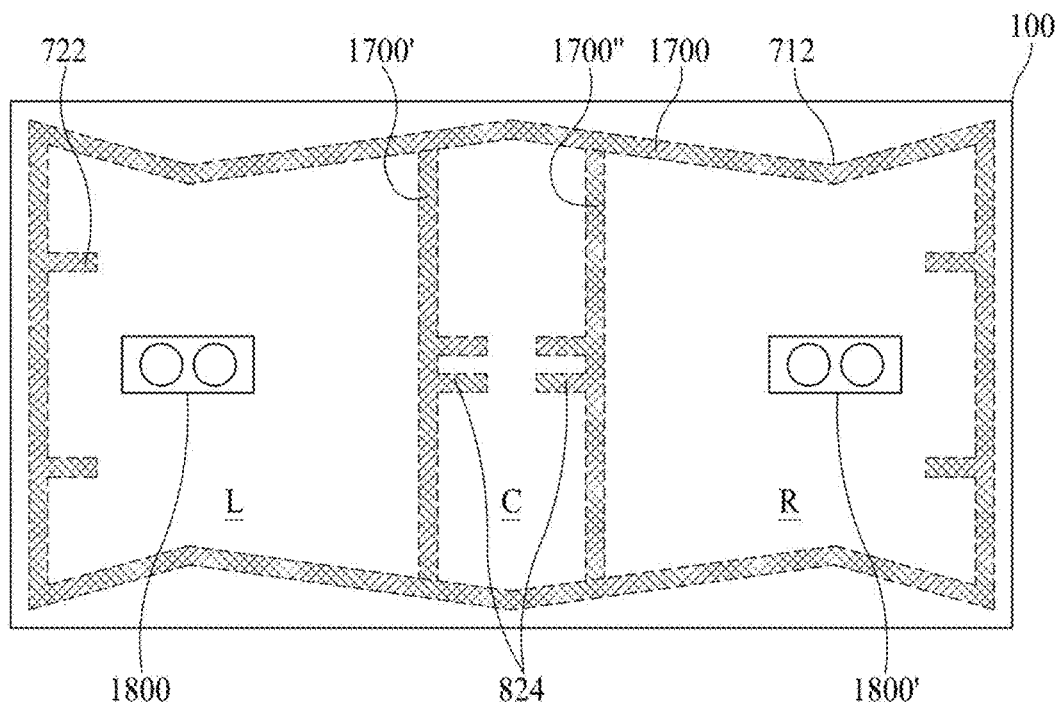
FIGS. 25A to 25D illustrate examples of the sound-generating device and partition in the display apparatus according to an embodiment of the present disclosure.
Figure 25B:
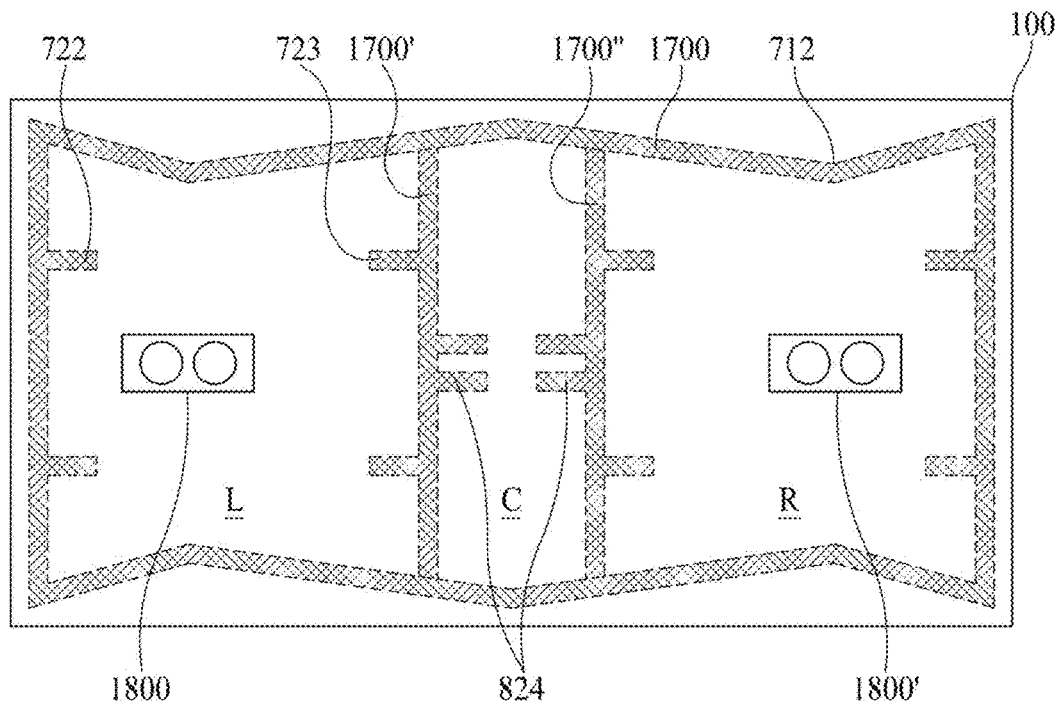

With reference to FIGS. 25A and 25B, at least a first and a second of the two members 824 of the central area (C) of the display panel 100 may be on the respective outer sides of the first partition 1700' and the second partition 1700", and the two members 824 may be symmetrically disposed with respect the sound-generating device 1800 and 1800'. For example, the two members 824 may be on the same axis as that of the sound-generating devices 1800 and 1800', and the two members 824 may be on the same plane as that of the sound-generating device 1800 and 1800'. The sound-generating device 1800 and 1800' may include a pair of sound-generating devices. The pair of the sound-generating devices may be configured as a sound-generating device having a circle shape or an oval shape, although embodiments are not limited thereto.

For example, with reference to FIG. 25A, a respective one or more of the protrusion portion 722, corresponding to the member, may be on one side of the third partition 1700 disposed in each of the left area (L) and the right area (R) of the display panel 100. For example, the protrusion portion 722, corresponding to the member facing toward the sound-generating device 1800 and 1800', may be respectively on at least one side of the partition disposed in each of the left area (L) and the right area (R) of the display panel 100. The two members 824 may be between the protrusion portions 722 in a vertical direction.

With reference to FIG. 25B, a respective one or more of the protrusion portion 722, corresponding to the member, may be on one side of the third partition 1700 disposed in each of the left area (L) and the right area (R) of the display panel 100. A respective one or more of the second protrusion portion 723, corresponding to the member, may be on one side of the first partition 1700' and the second partition 1700". For example, a respective one or more of the protrusion portion 722 and the second protrusion portion 723, corresponding to the member facing toward the sound-generating devices 1800 and 1800', may be on at least one side of the partition 1700 disposed in each of the left area (L) and the right area (R) of the display panel 100.

The two members 824 facing toward the central area (C) may be in the central area (C) of the display panel 100. For example, a respective one or more of the second protrusion portion 723 may be on one side of the first partition 1700' and the second partition 1700", and the two members 824 may be on another side of the first partition 1700' and the second partition 1700". The two members 824 may be between the protrusion portions 722 in a vertical direction, and the two members 824 may be between the second protrusion portions 723 in the vertical direction.

Figure 25C:
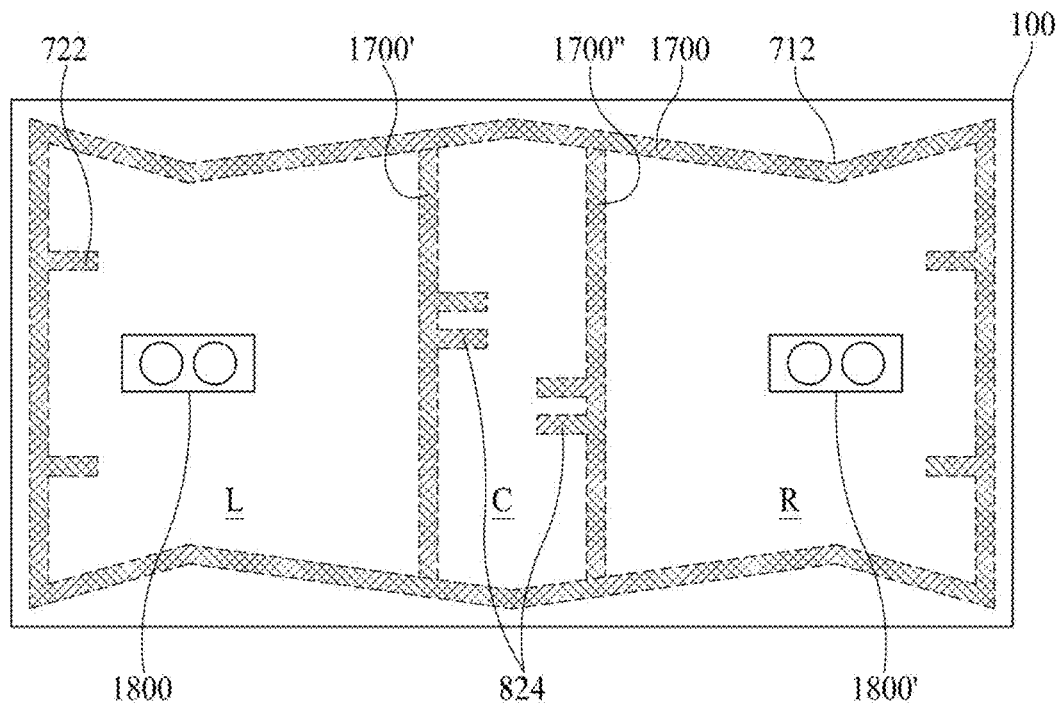
Figure 25D:
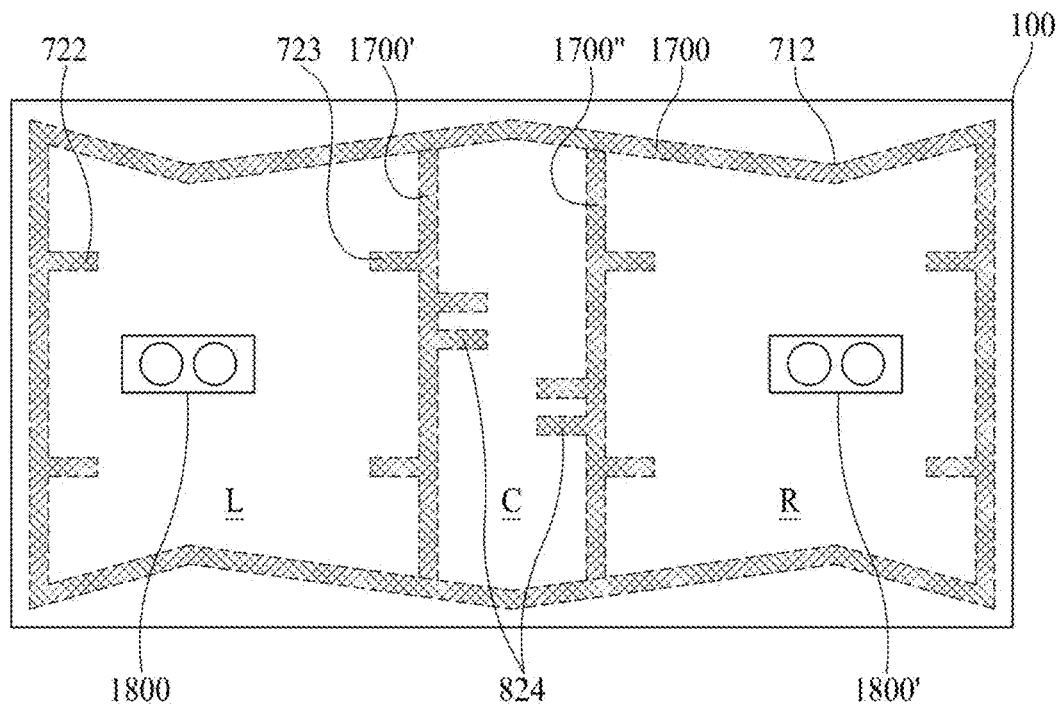

With reference to FIGS. 25C and 25D, at least a first and a second of the two members 824 of the central area (C) of the display panel 100 may be on the respective outer sides of the first partition 1700' and the second partition 1700". The at least first and second of the two members 824 may be asymmetrically disposed with respect to the sound-generating devices 1800 and 1800'. For example, the two members 824 may be on a different axis from that of the sound-generating devices 1800 and 1800', and the two members 824 may be on a different plane from that of the sound-generating devices 1800 and 1800'.

With reference to FIG. 25C, a respective one or more of the protrusion portion 722, corresponding to the member, may be on one side of the third partition 1700 in each of the left area (L) and the right area (R) of the display panel 100. For example, the protrusion portion 722, corresponding to the member facing toward the sound-generating devices 1800 and 1800', may be on at least one side of the partition disposed in each of the left area (L) and the right area (R) of the display panel 100. The two members 824 may be between the protrusion portions 722 in a vertical direction.

With reference to FIG. 25D, a respective one or more of the protrusion portion 722, corresponding to the member, may be on one side of the third partition 1700 disposed in each of the left area (L) and the right area (R) of the display panel 100. A second protrusion portion 723, corresponding to the member, may be on one side of the first partition 1700' and the second partition 1700". For example, a respective one or more of the protrusion portion 722 and the second protrusion portion 723, corresponding to the member facing toward the sound-generating devices 1800 and 1800', may be on at least one side of the partition disposed in each of the left area (L) and the right area (R) of the display panel 100.

The two members 824, facing toward the central area (C), may be in the central area (C) of the display panel 100. For example, the second protrusion portion 723 may be on one side of the first partition 1700' and the second partition 1700", and the two members 824 may be on another side of the first partition 1700' and the second partition 1700". The two members 824 may be between the protrusion portions 722 in a vertical direction, and the two members 824 may be between the second protrusion portions 723 in the vertical direction.

The first partition 1700', the second partition 1700", and the third partition 1700 may be on the rear surface of the display panel 100. The first partition 1700' and the second partition 1700" may be on the rear surface or front surface of the supporting member. The first partition 1700', the second partition 1700", and the third partition 1700 may be between the display panel and the supporting member. In FIGS. 25A to 25D, an adhesion member for adhering the display panel and the supporting member to each other may be provided in the periphery of the display panel and the supporting member, as explained above with regard to the FIG. 9 example.

FIGS. 26A to 26D illustrate examples of the sound-generating device and partition in the display apparatus according to an embodiment of the present disclosure.

FIGS. 26A to 26D show examples including two sound-generating devices as a set of two sub-sound-generating devices, and duplicate description to that given above with regard to the examples of FIGS. 22A to 22D will be omitted or briefly explained. Also, the description of the member 822 in the central area (C) of the display panel 100 described above with regard to the examples of FIGS. 21A to 21D may also be applied to the display apparatus of the examples of FIGS. 26A to 26D. For example, the description for the partition, protrusion portion, second protrusion portion and member shown in FIGS. 23A to 23H may also be applied to the display apparatus of the examples of FIGS. 26A to 26D.

The sound-generating device is substantially similar to that described above for the examples of FIGS. 1 to 4, so a detailed description for the sound-generating device will be omitted. Also, a connection structure between the sound-generating devices 1600 and 1600' and the supporting member is substantially similar to that described above for the examples of FIGS. 7 and 8, so a detailed description thereof will be omitted.

Figure 26A:
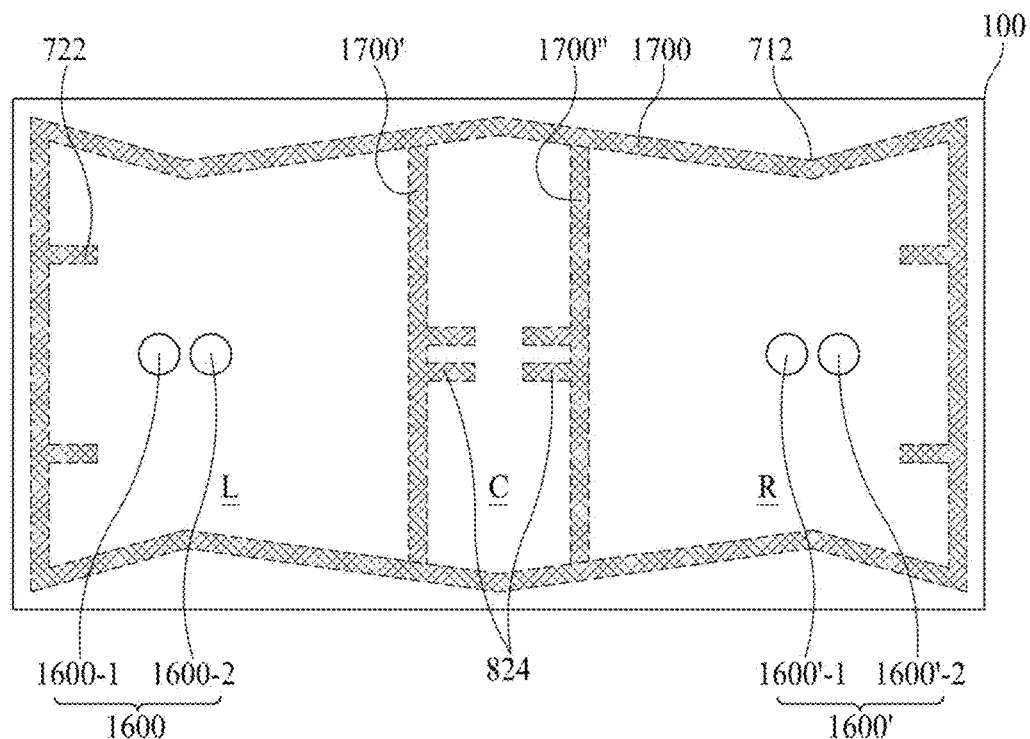
FIGS. 26A to 26D illustrate examples of the sound-generating device and partition in the display apparatus according to an embodiment of the present disclosure.
Figure 26B:
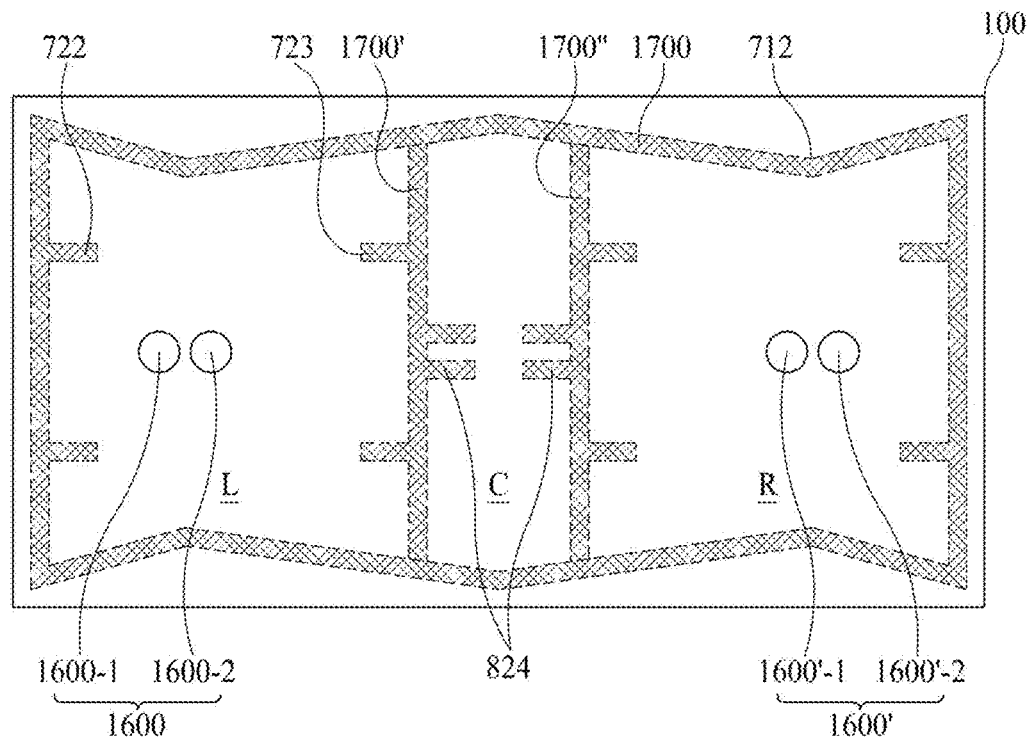

With reference to FIGS. 26A and 26B, at least a first and a second of the two members 824 of the central area (C) of the display panel 100 may be on respective outer sides of the first partition 1700' and the second partition 1700", and the two members 824 may be symmetrically disposed with respect to the sound-generating devices 1600 and 1600'. For example, the two members 824 may be on the same axis as that of the sound-generating devices 1600 and 1600', and the two members 824 may be on the same plane as that of the sound-generating devices 1600 and 1600'.

The sound-generating devices 1600 and 1600' may each include a set of two sub-sound-generating devices. For example, the first sound-generating device 1600 may include a set of two sub-sound-generating devices 1600-1 and 1600-2 disposed in the first area (L) corresponding to the left area of the display panel 100, and the second sound-generating device 1600' may include a set of two sub-sound-generating devices 1600'-1 and 1600'-2 disposed in the second area (R) corresponding to the right area of the display panel 100. The set of two sub-sound-generating devices (e.g., 1600-1/1600-2 and 1600'-1/1600'-2) may be adjacent to each other, and may be parallel to each other in the horizontal (or transverse) direction or vertical (or lengthwise) direction of the display panel. In comparison to a sound-generating device with the two sub-sound-generating devices spaced apart from each other, the sound-generating device with the two sub-sound-generating devices adjacent to each other is favorable to reducing or preventing deterioration of sound quality.

The two sound-generating devices 1600 and 1600' may be configured as a sound-generating device having a circle shape or an oval shape, although embodiments are not limited thereto. The first sound-generating device 1600 in the first area (L) and the second sound-generating device 1600' in the second area (R) may generate the middle-high-pitched sound band.

For example, with reference to FIG. 26A, a respective one or more of the protrusion portion 722, corresponding to the member, may be on one side of the third partition 1700 disposed in each of the left area (L) and the right area (R) of the display panel 100. For example, the protrusion portion 722, corresponding to the member facing toward the sound-generating devices 1600 and 1600', may be respectively on at least one side of the partition disposed in each of the left area (L) and the right area (R) of the display panel 100. The two members 824 may be between the protrusion portions 722 in a vertical direction.

With reference to FIG. 26B, a respective one or more of the protrusion portion 722, corresponding to the member, may be on one side of the third partition 1700 disposed in each of the left area (L) and the right area (R) of the display panel 100. A respective one or more of the second protrusion portion 723, corresponding to the member, may be on one side of the first partition 1700' and the second partition 1700". For example, a respective one or more of the protrusion portion 722 and the second protrusion portion 723, corresponding to the member facing toward the sound-generating devices 1600 and 1600', may be on at least one side of the partition 1700 disposed in each of the left area (L) and the right area (R) of the display panel 100.

The two members 824 facing toward the central area (C) may be in the central area (C) of the display panel 100. For example, a respective one or more of the second protrusion portion 723 may be on one side of the first partition 1700' and the second partition 1700", and the two members 824 may be on another side of the first partition 1700' and the second partition 1700". The two members 824 may be between the protrusion portions 722 in a vertical direction, and the two members 824 may be between the second protrusion portions 723 in the vertical direction.

Figure 26C:
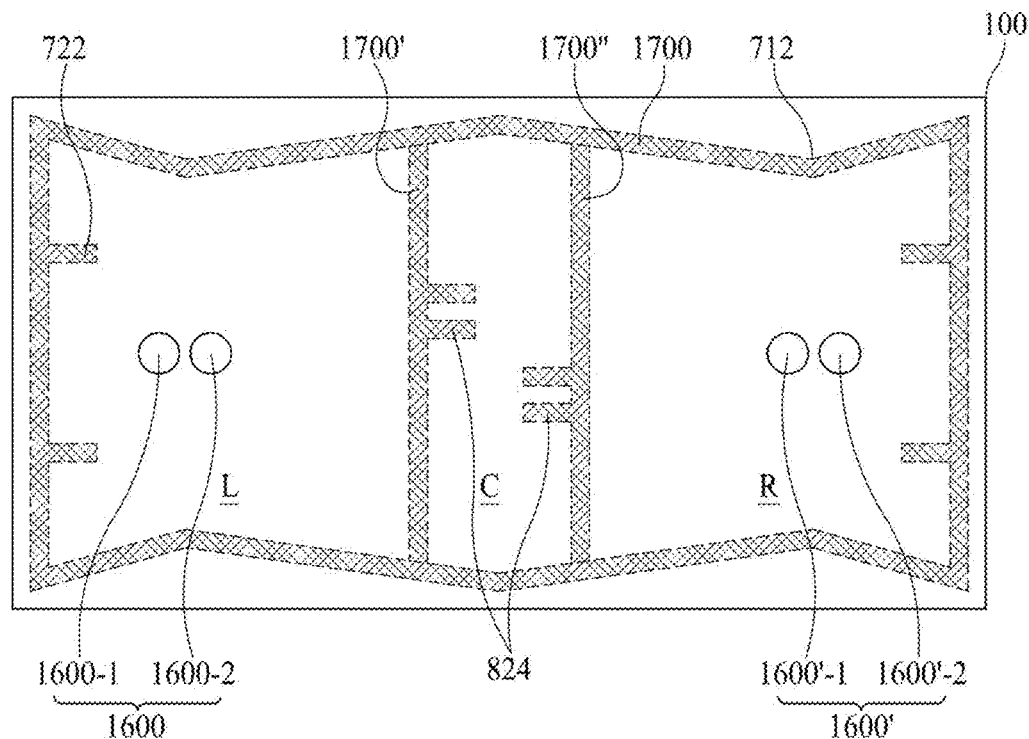
Figure 26D:
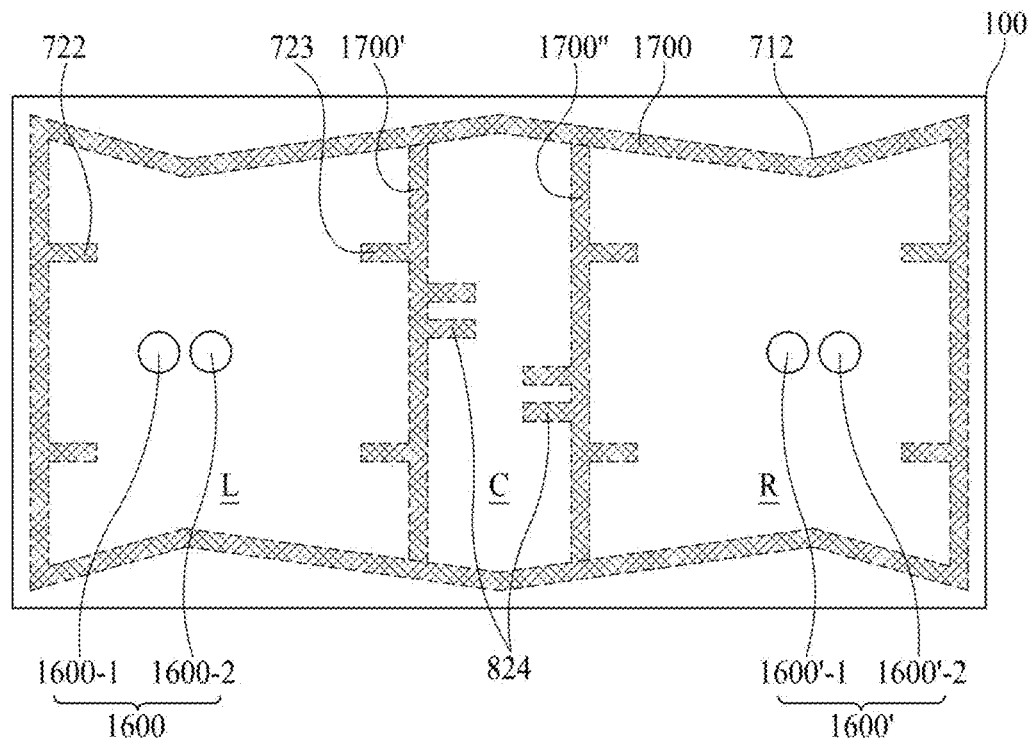

With reference to FIGS. 26C and 26D, at least a first and a second of the two members 824 of the central area (C) of the display panel 100 may be on the respective outer sides of the first partition 1700' and the second partition 1700". The at least first and second of the two members 824 may be asymmetrically disposed with respect to the sound-generating devices 1600 and 1600'. For example, the two members 824 may be on a different axis from that of the sound-generating devices 1600 and 1600', and the two members 824 may be on a different plane from that of the sound-generating devices 1600 and 1600'.

With reference to FIG. 26C, a respective one or more of the protrusion portion 722, corresponding to the member, may be on one side of the third partition 1700 in each of the left area (L) and the right area (R) of the display panel 100. For example, the protrusion portion 722, corresponding to the member facing toward the sound-generating devices 1600 and 1600', may be on at least one side of the partition in each of the left area (L) and the right area (R) of the display panel 100. The two members 824 may be between the protrusion portions 722 in a vertical direction.

With reference to FIG. 26D, a respective one or more of the protrusion portion 722, corresponding to the member, may be on one side of the third partition 1700 disposed in each of the left area (L) and the right area (R) of the display panel 100. A second protrusion portion 723, corresponding to the member, may be on one side of the first partition 1700' and the second partition 1700". For example, a respective one or more of the protrusion portion 722 and the second protrusion portion 723, corresponding to the member facing toward the sound-generating devices 1600 and 1600', may be on at least one side of the partition disposed in each of the left area (L) and the right area (R) of the display panel 100.

The two members 824, facing toward the central area (C), may be in the central area (C) of the display panel 100. For example, the second protrusion portion 723 may be on one side of the first partition 1700' and the second partition 1700", and the two members 824 may be on another side of the first partition 1700' and the second partition 1700". The two members 824 may be between the protrusion portions 722 in a vertical direction, and the two members 824 may be between the second protrusion portions 723 in the vertical direction.

The first partition 1700', the second partition 1700", and the third partition 1700 may be on the rear surface of the display panel 100. The first partition 1700' and the second partition 1700" may be on the rear surface or front surface of the supporting member. The first partition 1700', the second partition 1700", and the third partition 1700 may be between the display panel and the supporting member. In FIGS. 26A to 26D, an adhesion member for adhering the display panel and the supporting member to each other may be provided in the periphery of the display panel and the supporting member, as explained above with regard to the FIG. 9 example.

A display apparatus according to an embodiment of the present disclosure will be described below.

According to an embodiment of the present disclosure, a display apparatus may include: a display panel configured to display an image, the display panel including first, second, and third areas, a sound-generating device in at least one among the first, second, and third areas on a rear surface of the display panel, and at least one partition for dividing the first, second, and third areas from each other, the at least one partition including a first side and a second side at an angle to the first side, the second side including at least one member perpendicular to the second side. The first area may be a left area of the display panel, the second area may be a right area of the display panel, the third area may be a central area of the display panel, and the member may be in the third area.

For example, in the display apparatus according to an embodiment of the present disclosure, a size of each of the first and second areas may be larger than a size of the third area. For example, in the display apparatus according to an embodiment of the present disclosure, the at least one partition may include: a first partition between the first area and the third area, a second partition between the second area and the third area, and a third partition surrounding the first, second, and third areas.

For example, in the display apparatus according to an embodiment of the present disclosure, the at least one member may be on at least one side of a respective one of the first and second partitions. For example, in the display apparatus according to an embodiment of the present disclosure, the at least one member may be on at least one side of a respective one of the first and second partitions, and the third partition may include a bent portion in at least one side of the third partition.

For example, in the display apparatus according to an embodiment of the present disclosure, the at least one member may be on at least one side of a respective one of the first and second partitions, and the third partition may include an outer member on at least one side of the third partition. For example, in the display apparatus according to an embodiment of the present disclosure, the third partition may include another outer member, and the member may be between the outer member and the another outer member. For example, in the display apparatus according to an embodiment of the present disclosure, the at least one member may extend toward the third area, and the outer member may extend toward the sound-generating device.

For example, in the display apparatus according to an embodiment of the present disclosure, the sound-generating device may include one or more of: a circle shape, an oval shape, and a pair of sound-generating devices. For example, in the display apparatus according to an embodiment of the present disclosure, the sound-generating device may be configured to generate a middle-high-pitched sound band.

According to an embodiment of the present disclosure, a display apparatus may include: a display panel configured to emit light, the display panel including left, right, and central areas, a first sound-generating device in at least one of the left, right, and central areas on a rear surface of the display panel, a first partition between the left area and the central area, and a second partition between the right area and the central area. At least one side of each of the first partition and the second partition may include a respective first member in the central area.

For example, the display apparatus according to an embodiment of the present disclosure may further include a second sound-generating device, and the first and second sound-generating devices may be respectively in the left and right areas. For example, in the display apparatus according to an embodiment of the present disclosure, the respective first members of the first and second partitions may be symmetrically disposed with respect to each of the first and second sound-generating devices.

For example, in the display apparatus according to an embodiment of the present disclosure, the respective first members of the first and second partitions may be disposed along a same axis as an axis along which the first and second sound-generating devices may be disposed. For example, in the display apparatus according to an embodiment of the present disclosure, the respective first members of the first and second partitions may be disposed along an axis different from an axis along which the first and second sound-generating devices may be disposed.

For example, the display apparatus according to an embodiment of the present disclosure may further include a third partition surrounding the left, right, and central areas. For example, in the display apparatus according to an embodiment of the present disclosure, the third partition may include a bent portion that may be bent toward the first sound-generating device. For example, in the display apparatus according to an embodiment of the present disclosure, the third partition may include an outer member extending toward the first sound-generating device.

For example, in the display apparatus according to an embodiment of the present disclosure, the respective first members of the first and second partitions may be symmetrically disposed with respect to the outer member. For example, in the display apparatus according to an embodiment of the present disclosure, the outer member is disposed along a same axis on which the respective first members of the first and second partitions are disposed. For example, in the display apparatus according to an embodiment of the present disclosure, the outer member is disposed along an axis different from an axis on which the respective first members of the first and second partitions are disposed. For example, in the display apparatus according to an embodiment of the present disclosure, the first sound-generating device is disposed along the same axis on which the respective first members of the first and second partitions are disposed.

For example, the display apparatus according to an embodiment of the present disclosure may further include another outer member, and the respective first members of the first and second partitions may be disposed along an axis extending between the outer member and the another outer member. For example, the display apparatus according to an embodiment of the present disclosure may further include an inner member on one side of at least one of the first and second partitions, the inner member extending toward the first sound-generating device, and the outer member may be on one side of the third partition.

For example, in the display apparatus according to an embodiment of the present disclosure, a size of each of the left and right areas may be larger than a size of the central area. For example, in the display apparatus according to an embodiment of the present disclosure, the first sound-generating device may be configured to generate a middle-high-pitched sound band. For example, in the display apparatus according to an embodiment of the present disclosure, the at least one side of each of the first partition and the second partition further may include another respective first member in the central area.

As described above, the display apparatus according to the embodiments of the present disclosure may include the sound generation device that may vibrate the display panel to generate a sound, and the sound may be output so that a traveling direction of the sound of the display apparatus becomes a direction toward the front surface of the display panel. Accordingly, an immersion experience of a viewer watching an image displayed by the display apparatus may be enhanced.

The display apparatus according to the embodiments of the present disclosure may include the sound generating device capable of generating sound by vibrating the display panel. Thus, there may be no need for the speaker, enabling improvement in the degree of freedom on design of the set apparatus and spatial disposition of the speaker. In the display apparatus according to the embodiments of the present disclosure, the supporting member and the sound generating device may be fixed by a screw and nut in the supporting member, to thereby reduce the thickness of the display panel.

The display apparatus according to the embodiments of the present disclosure may include the fixing device for fixing the two sound generating devices. Thus, it may be possible to generate a uniform sound pressure level in the entire frequency range.

The display apparatus according to the embodiments of the present disclosure may include the fixing device for fixing the two sound generating devices, and the plurality of rib portions disposed in the periphery of the sound generating device. Thus, it may be possible to maintain hardness of the sound generating device, and to minimize the change of sound output characteristics, even during long-time operation.

In the display apparatus according to the embodiments of the present disclosure, the supporting member may include glass or stainless steel. Thus, it may be possible to realize good exterior design of the display apparatus.

The display apparatus according to the embodiments of the present disclosure may include the first supporting member and the second supporting member so that the sound generating device may be tightly adhered to the entire surface of the display panel by the thickness of the first supporting member, to thereby decrease the thickness of the display apparatus.

The display apparatus according to the embodiments of the present disclosure may include at least one member in at least one area of the display panel. Thus, it may be possible to provide the display apparatus with the improved sound quality of the middle-high-pitched sound band.

The display apparatus according to the embodiments of the present disclosure may include at least one member in the central area of the display panel. Thus, it may be possible to reduce the interference between the sound generated by the sound generating device of the left area of the display panel and the sound generated by the sound generating device of the right area of the display panel, and to provide the display apparatus with the improved sound quality of the high-pitched sound band.

The display apparatus according to the embodiments of the present disclosure may include at least one member in the central area of the display panel. Thus, it may be possible to reduce the interference between the sound generated by the sound generating device of the left area of the display panel and the sound generated by the sound generating device of the right area of the display panel, and to provide the display apparatus with the improved stereo efficiency by the channel separation between the left area and the right area of the display panel.

The display apparatus according to the embodiments of the present disclosure may include at least one member in the central area of the display panel. Thus, it may be possible to provide the display apparatus with the improved sound pressure level in the high-pitched sound band by the improved directivity angle.

The display apparatus according to the embodiments of the present disclosure may include at least one partition disposed between the sound generating devices, which may enable the separation of sound by the partition. Thus, it may be possible to realize the stereo sound, and to improve the sound output characteristics.

The display apparatus according to the embodiments of the present disclosure may include the partition with the bent portion or the protrusion portion. Thus, it may be possible to prevent deterioration of sound quality caused by the standing wave or reflected wave in the display panel, and to improve the sound output characteristics.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A display apparatus, comprising:
   a display panel configured to display an image, the display panel including first, second, and third areas;
   a sound-generating device in at least one among the first, second, and third areas on a rear surface of the display panel; and
   at least one partition for dividing the first, second, and third areas from each other, the at least one partition including a first side and a second side at an angle to the first side, the second side including at least one member perpendicular to the second side,
   wherein:
   the first area is a left area of the display panel;
   the second area is a right area of the display panel;
   the third area is a central area of the display panel; and
   the member is in the third area.

2. The display apparatus of claim 1, wherein a size of each of the first and second areas is larger than a size of the third area.

3. The display apparatus of claim 1, wherein the at least one partition includes:
   a first partition between the first area and the third area;
   a second partition between the second area and the third area; and
   a third partition surrounding the first, second, and third areas.

4. The display apparatus of claim 3, wherein the at least one member is on at least one side of a respective one of the first and second partitions.

5. The display apparatus of claim 3, wherein:
   the at least one member is on at least one side of a respective one of the first and second partitions; and
   the third partition includes a bent portion in at least one side of the third partition.

6. The display apparatus of claim 3, wherein:
   the at least one member is on at least one side of a respective one of the first and second partitions; and
   the third partition includes an outer member on at least one side of the third partition.

7. The display apparatus of claim 6, wherein:
   the third partition includes another outer member,
   wherein the member is between the outer member and the another outer member.

8. The display apparatus of claim 6, wherein:
   the at least one member extends toward the third area; and
   the outer member extends toward the sound-generating device.

9. The display apparatus of claim 1, wherein the sound-generating device includes one or more of: a circle shape, an oval shape, and a pair of sound-generating devices.

10. The display apparatus of claim 1, wherein the sound-generating device is configured to generate a middle-high-pitched sound band.

11. A display apparatus, comprising:
    a display panel configured to emit light, the display panel including left, right, and central areas;
    a first sound-generating device in at least one of the left, right, and central areas on a rear surface of the display panel;
    a first partition between the left area and the central area; and
    a second partition between the right area and the central area,
    wherein at least one side of each of the first partition and the second partition includes a respective first member in the central area.

12. The display apparatus of claim 11, further comprising:
    a second sound-generating device,
    wherein the first and second sound-generating devices are respectively in the left and right areas.

13. The display apparatus of claim 12, wherein the respective first members of the first and second partitions are symmetrically disposed with respect to each of the first and second sound-generating devices.

14. The display apparatus of claim 13, wherein the respective first members of the first and second partitions are disposed along a same axis as an axis along which the first and second sound-generating devices are disposed.

15. The display apparatus of claim 12, wherein the respective first members of the first and second partitions are disposed along an axis different from an axis along which the first and second sound-generating devices are disposed.

16. The display apparatus of claim 11, further comprising a third partition surrounding the left, right, and central areas.

17. The display apparatus of claim 16, wherein the third partition includes a bent portion that is bent toward the first sound-generating device.

18. The display apparatus of claim 17, wherein the third partition includes an outer member extending toward the first sound-generating device.

19. The display apparatus of claim 18, wherein the respective first members of the first and second partitions are symmetrically disposed with respect to the outer member.

20. The display apparatus of claim 19, wherein the outer member is disposed along a same axis on which the respective first members of the first and second partitions are disposed.

21. The display apparatus of claim 18, wherein the outer member is disposed along an axis different from an axis on which the respective first members of the first and second partitions are disposed.

22. The display apparatus of claim 21, wherein the first sound-generating device is disposed along the same axis on which the respective first members of the first and second partitions are disposed.

23. The display apparatus of claim 18, further comprising:

another outer member, wherein the respective first members of the first and second partitions are disposed along an axis extending between the outer member and the another outer member.

24. The display apparatus of claim 18, further comprising:

an inner member on one side of at least one of the first and second partitions, the inner member extending toward the first sound-generating device, wherein the outer member is on one side of the third partition.

25. The display apparatus of claim 11, wherein a size of each of the left and right areas is larger than a size of the central area.

26. The display apparatus of claim 11, wherein the first sound-generating device is configured to generate a middle-high-pitched sound band.

27. The display apparatus of claim 11, wherein the at least one side of each of the first partition and the second partition further comprises another respective first member in the central area.

* * * * *